United States Patent
Inoue et al.

(10) Patent No.: US 9,543,329 B2
(45) Date of Patent: Jan. 10, 2017

(54) THIN FILM TRANSISTOR SUBSTRATE AND METHOD FOR MANUFACTURING THE SAME

(71) Applicant: Mitsubishi Electric Corporation, Tokyo (JP)

(72) Inventors: Kazunori Inoue, Kumamoto (JP); Koji Oda, Kumamoto (JP); Naoki Tsumura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 14/755,984

(22) Filed: Jun. 30, 2015

(65) Prior Publication Data
US 2016/0005770 A1    Jan. 7, 2016

(30) Foreign Application Priority Data
Jul. 7, 2014   (JP) ................... 2014-139677

(51) Int. Cl.
  H01L 21/02    (2006.01)
  H01L 27/12    (2006.01)
  (Continued)

(52) U.S. Cl.
  CPC ......... H01L 27/1225 (2013.01); G02F 1/1368 (2013.01); G02F 1/13439 (2013.01);
  (Continued)

(58) Field of Classification Search
  CPC ...... H01L 29/786; H01L 21/01; H01L 21/441; H01L 21/4763; H01L 21/47635; H01L 21/02614; H01L 21/02565; H01L 27/1225; H01L 27/124; H01L 27/127; H01L 29/24; H01L 29/66969; H01L 27/12; H01L 29/66
  See application file for complete search history.

(56) References Cited

U.S. PATENT DOCUMENTS 6,016,174 A    1/2000 Endo et al.
6,449,026 B1   9/2002 Min et al.
(Continued)

FOREIGN PATENT DOCUMENTS

JP    H10-268353 A    10/1998
JP    2001-056474 A    2/2001
(Continued)

OTHER PUBLICATIONS

Kenji Nomura et al, "Room-Temperature fabrication of transparent flexible thin-film transistors using amorphous oxide semiconductors", Nature, Nov. 25, 2004, p. 488-492, vol. 432.

*Primary Examiner* — Fazli Erdem
(74) *Attorney, Agent, or Firm* — Studebaker & Brackett PC

(57) ABSTRACT

A thin film transistor substrate includes: a gate insulating film that covers a gate electrode and a common electrode; a transparent oxide film selectively disposed on the gate insulating film; a source electrode and a drain electrode that are spaced from each other on the transparent oxide film; and a light transmissive pixel electrode electrically connected to the drain electrode. The transparent oxide film includes a conductive region and a semiconductor region. The conductive region is disposed in a lower portion of the source electrode and the drain electrode and disposed in a portion that continues from the lower portion of the drain electrode, extends to part of an upper portion of the common electrode, and forms the pixel electrode. The semiconductor region is disposed in a portion corresponding to a lower layer in a region between the source electrode and the drain electrode.

8 Claims, 60 Drawing Sheets

(51) Int. Cl.
- *H01L 29/24* (2006.01)
- *H01L 29/786* (2006.01)
- *H01L 29/66* (2006.01)
- *H01L 21/441* (2006.01)
- *G02F 1/1368* (2006.01)
- *G02F 1/1343* (2006.01)
- *G02F 1/1362* (2006.01)

(52) U.S. Cl.
CPC .......... *H01L 21/441* (2013.01); *H01L 27/124* (2013.01); *H01L 27/127* (2013.01); *H01L 29/24* (2013.01); *H01L 29/66969* (2013.01); *H01L 29/7869* (2013.01); *G02F 2001/134372* (2013.01); *G02F 2001/136231* (2013.01); *H01L 21/02554* (2013.01); *H01L 21/02565* (2013.01); *H01L 21/02631* (2013.01)

(56) References Cited

U.S. PATENT DOCUMENTS

| | | | |
|---|---|---|---|
| 6,838,696 B2 | 1/2005 | Kobayashi et al. | |
| 7,061,014 B2 | 6/2006 | Hosono et al. | |
| 7,084,017 B2 | 8/2006 | Nakamura et al. | |
| 7,394,097 B2 | 7/2008 | Kobayashi et al. | |
| 7,645,648 B2 | 1/2010 | Kobayashi et al. | |
| 7,755,088 B2 | 7/2010 | Kobayashi et al. | |
| 7,804,091 B2 | 9/2010 | Takechi et al. | |
| 8,481,373 B2 | 7/2013 | Okabe et al. | |
| 8,772,768 B2* | 7/2014 | Yamazaki | H01L 29/7869 257/43 |
| 8,841,163 B2* | 9/2014 | Yamazaki | H01L 21/28176 257/43 |
| 8,883,556 B2* | 11/2014 | Yamazaki | H01L 27/10873 257/43 |
| 2007/0090365 A1 | 4/2007 | Hayashi et al. | |
| 2011/0057918 A1* | 3/2011 | Kimura | G09G 3/3648 345/211 |
| 2011/0136301 A1* | 6/2011 | Yamazaki | H01L 21/28176 438/156 |
| 2011/0212570 A1* | 9/2011 | Yamazaki | H01L 29/7869 438/104 |
| 2013/0063675 A1* | 3/2013 | Misaki | H01L 29/7869 349/46 |
| 2013/0320332 A1* | 12/2013 | Hondo | H01L 29/78693 257/43 |
| 2013/0320339 A1* | 12/2013 | Kawashima | H01L 29/66765 257/43 |
| 2014/0103342 A1* | 4/2014 | Takanishi | H01L 27/1225 257/43 |
| 2015/0069388 A1 | 3/2015 | Kawachi | |
| 2015/0295092 A1* | 10/2015 | Misaki | G02F 1/1368 257/43 |

FOREIGN PATENT DOCUMENTS

| | | |
|---|---|---|
| JP | 2001-339072 A | 12/2001 |
| JP | 2004-103957 A | 4/2004 |
| JP | 2005-077822 A | 3/2005 |
| JP | 2007-115902 A | 5/2007 |
| JP | 2008-040343 A | 2/2008 |
| JP | 2008-072011 A | 3/2008 |
| JP | 2011-029373 A | 2/2011 |
| JP | 2013-254121 A | 12/2013 |
| WO | 2011/010415 A1 | 1/2011 |

* cited by examiner

THIN FILM TRANSISTOR SUBSTRATE AND METHOD FOR MANUFACTURING THE SAME

BACKGROUND OF THE INVENTION

Field of the Invention

The present invention relates to a thin film transistor substrate used in a display or the like and to a method for manufacturing the same.

Description of the Background Art

Active matrix substrates (hereinafter referred to as "TFT substrates") including thin film transistors (hereinafter referred to as "TFTs") as switching elements are widely known to be used in electro-optic devices, such as displays including liquid crystals (hereinafter referred to as "liquid crystal displays; LCDs").

The LCDs including the TFT substrates (TFT-LCDs) need improved display characteristics (such as a wide viewing angle, high definition, and high quality) and also need low costs as a result of simplifying manufacturing steps for an efficient manufacturing.

The TFT-LCD typically has a liquid crystal cell as a basic structure in which a TFT substrate (element substrate) and a counter substrate (CF substrate) sandwich a liquid crystal layer, and the LCD is formed of the liquid crystal layer including a polarizer bonded thereto. The TFT substrate includes a plurality of pixels arranged in matrix, each of the pixels including a pixel electrode and a TFT connected to the pixel electrode. The counter substrate includes a counter electrode disposed opposite to the pixel electrode and a color filter (CF). For example, a full transmissive LCD includes a backlight (BL) on a back surface side of the liquid crystal cell.

In this manner, the liquid crystal cell including the pixel electrode and the counter electrode disposed to sandwich the liquid crystal layer is a liquid crystal cell of a vertical electric field driving mode typified by a twisted nematic (TN) mode, the pixel electrode and the counter electrode generating an electric field for driving the liquid crystals. The TFT substrate of the TN mode is typically manufactured in four or five photolithography processes, as disclosed in Japanese Patent Application Laid-Open No. 10-268353 (1998) and Japanese Patent Application Laid-Open No. 2001-339072, for example.

Meanwhile, in terms of the wide viewing angle of the TFT-LCD, an in-plane switching (IPS) mode ("IPS" is a trademark) has been developed, the IPS mode being one of lateral electric field driving modes in which both of the pixel electrode and the counter electrode (common electrode) are disposed on the same layer on the TFT substrate. The IPS mode can obtain the viewing angle wider than that in the vertical electric field driving mode, but hardly obtains bright display characteristics due to an aperture ratio and a transmittance of an image display portion lower than those in the vertical electric field driving mode. This problem arises in a situation where an electric field for driving liquid crystals fails to effectively operate on the liquid crystals in a region directly above the pixel electrode having a comb teeth shape.

A fringe field switching (FFS) mode has been developed as a lateral electric field driving mode capable of improving this problem, as disclosed in Japanese Patent Application Laid-Open No. 2001-56474, for example.

Moreover, in terms of the high definition and the high quality of the TFT-LCD, technologies have been developed to use a semiconductor made of an oxide material having a mobility higher than that of conventional silicon (Si) as a semiconductor for an active layer of the TFT formed in the TFT substrate, as disclosed in Japanese Patent Application Laid-Open No. 2004-103957, Japanese Patent Application Laid-Open No. 2005-77822, and Kenji Nomura et al (2004), "Room-temperature Fabrication of Transparent Flexible Thin-film Transistors Using Amorphous Oxide Semiconductors", *Nature*, 432: 488-492.

The oxide semiconductor includes zinc oxide (ZnO) system, InGaZnO system in which gallium oxide ($Ga_2O_3$) and indium oxide ($In_2O_3$) are added to zinc oxide (ZnO), or the like. Such oxide semiconductor has a film having light-transmissive properties higher than those of a Si semiconductor film, and Japanese Patent Application Laid-Open No. 2007-115902, for example, discloses that an oxide semiconductor film having a transmittance of 70% or more to visible light with wavelengths of 400 to 800 nm is used. Furthermore, Japanese Patent Application Laid-Open No. 2013-254121 discloses a liquid crystal display that makes use of the light-transmissive properties of the oxide semiconductor and uses part of one oxide semiconductor pattern as a channel semiconductor of a TFT and the other part thereof as a transparent pixel electrode by increasing an electrical conductivity by irradiation with an energy ray.

The typical oxide semiconductor film mentioned above can be etched with a weak acid solution, such as oxalic acid and carboxylic acid, and has an advantage of an easy patterning process. However, it is easily dissolved by an acid solution normally used for an etching process of typical metal films (Cr, Ti, Mo, Ta, Al, Cu, and alloys thereof) that are used for a source electrode and a drain electrode of the TFT.

Thus, the oxide semiconductor film needs not to be lost upon etching (patterning) of the metal films that are to be the source electrode and the drain electrode in a process of manufacturing them, depending on a structure of the TFT substrate.

For example, Japanese Patent Application Laid-Open No. 2008-72011 discloses a technology of adding new elements to an oxide semiconductor to improve resistance to a chemical solution and a technology of optimizing film thicknesses of the metal films that are to be the source electrode and the drain electrode and a film thickness of the oxide semiconductor. However, it is desirable to manufacture the TFT substrate using the typical oxide semiconductor film without using the technology of improving the resistance to the chemical solution.

There is an increased demand for the LCD of the FFS mode because of its sufficient viewing angle characteristics and its transmittance of a panel. However, the TFT substrate used in the LCD of the FFS mode needs to include both of the pixel electrode and the counter electrode (common electrode) formed on the TFT substrate, thereby increasing the number of wiring layers of the TFT substrate. This increases the number of photolithography processes needed for forming the TFT substrate, thereby increasing manufacturing costs.

For example, the TFT substrate in the typical LCD of the FFS mode disclosed in FIGS. 1 and 3 in Japanese Patent Application Laid-Open No. 2001-56474 is manufactured in six photolithography processes. On the other hand, the TFT substrate of the conventional TN mode can be typically manufactured in four or five photolithography processes, as disclosed in Japanese Patent Application Laid-Open No. 10-268353 (1998) and Japanese Patent Application Laid-Open No. 2001-339072. Thus, reducing the number of photolithography processes is a major challenge in manufacturing the TFT substrate of the FFS mode. If it is made possible to reduce more photolithography processes also in the TFT substrate of the conventional TN mode and to manufacture the TFT substrate in, for example, three photolithography processes, the manufacturing costs can be reduced, which is certainly more desirable.

As described above, the typical oxide semiconductor film is easily dissolved by the acid solution used for etching the metal films (Cr, Ti, Mo, Ta, Al, Cu, and alloys thereof) that are used for the source electrode and the drain electrode of the TFT. Therefore, for a structure that exposes a lower layer of a semiconductor film upon the etching process of the source electrode and the drain electrode, such as the structure of the TFT shown in Japanese Patent Application Laid-Open No. 2001-56474 (FIGS. 1 and 3), a special oxide semiconductor having the resistance to the chemical solution needs to be used, resulting in difficulty in using the typical oxide semiconductor.

Furthermore, when the oxide semiconductor film is used for a channel layer of the semiconductor, it is difficult for the structure of the TFT, such as the structure in Japanese Patent Application Laid-Open No. 2001-56474 (FIGS. 1 and 3), to stably obtain sufficient electrical characteristics of an interface at an electrical bonding portion between the source electrode and the drain electrode, and the oxide semiconductor having the high mobility fails to make full use of its performances due to an increase in electrical resistance at the interface.

Moreover, the liquid crystal display in Japanese Patent Application Laid-Open No. 2013-254121 needs a special process not being used for manufacturing the typical liquid crystal display such that the oxide semiconductor is irradiated with the energy ray to be used as the pixel electrode, thereby increasing the manufacturing costs. It is known that an electrical conductivity temporarily increases and then decreases due to a change over time or a heat treatment in the technique of decreasing a resistance (increasing a carrier) by the irradiation with the energy ray to increase the electrical conductivity, so that necessary electrical characteristics cannot be obtained in the end. Additionally, in the liquid crystal display in Japanese Patent Application Laid-Open No. 2013-254121, the channel semiconductor of the TFT and the transparent pixel electrode are separately formed with an end of the gate electrode disposed in the lower layer as a boundary therebetween, and thus the gate electrode fails to sufficiently shield the channel semiconductor from the light, thereby deteriorating the electrical characteristics.

SUMMARY OF THE INVENTION

The present invention has been made in view of the above-mentioned problems, and an object thereof is to provide an active matrix substrate that can easily use an oxide semiconductor film as a semiconductor channel film of a TFT and that includes a light transmissive pixel electrode of a TN mode or an FFS mode having excellent electrical characteristics and to provide a manufacturing method capable of suppressing the number of photolithography processes of manufacturing the active matrix substrate.

A thin film transistor of the present invention is a thin film transistor substrate including a plurality of pixels arranged in matrix. Each of the pixels includes: a gate electrode and a common electrode selectively disposed on a substrate; a gate insulating film that covers the gate electrode and the common electrode; a transparent oxide film selectively disposed on the gate insulating film; a source electrode and a drain electrode that are spaced from each other on the transparent oxide film and overlap the gate electrode; and a light transmissive pixel electrode electrically connected to the drain electrode. The transparent oxide film includes a conductive region and a semiconductor region. The conductive region is disposed in a lower portion of the source electrode and the drain electrode and disposed in a portion that continues from the lower portion of the drain electrode, extends to part of an upper portion of the common electrode, and forms the pixel electrode. The semiconductor region is disposed in a portion corresponding to a lower layer in a region between the source electrode and the drain electrode and forms a channel region of a thin film transistor. The source electrode and the drain electrode are electrically connected to the conductive region of the transparent oxide film.

The thin film transistor can suppress the number of photolithography processes of manufacturing the active matrix substrate including the TFT and the light transmissive pixel electrode, and thus productivity can be improved and manufacturing costs can be reduced. The oxide semiconductor having a high mobility can be easily used for the semiconductor channel film of the TFT, which can also contribute to high definition and high performances of the active matrix substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Configuration of Pixel of TFT Substrate

Figure 1:
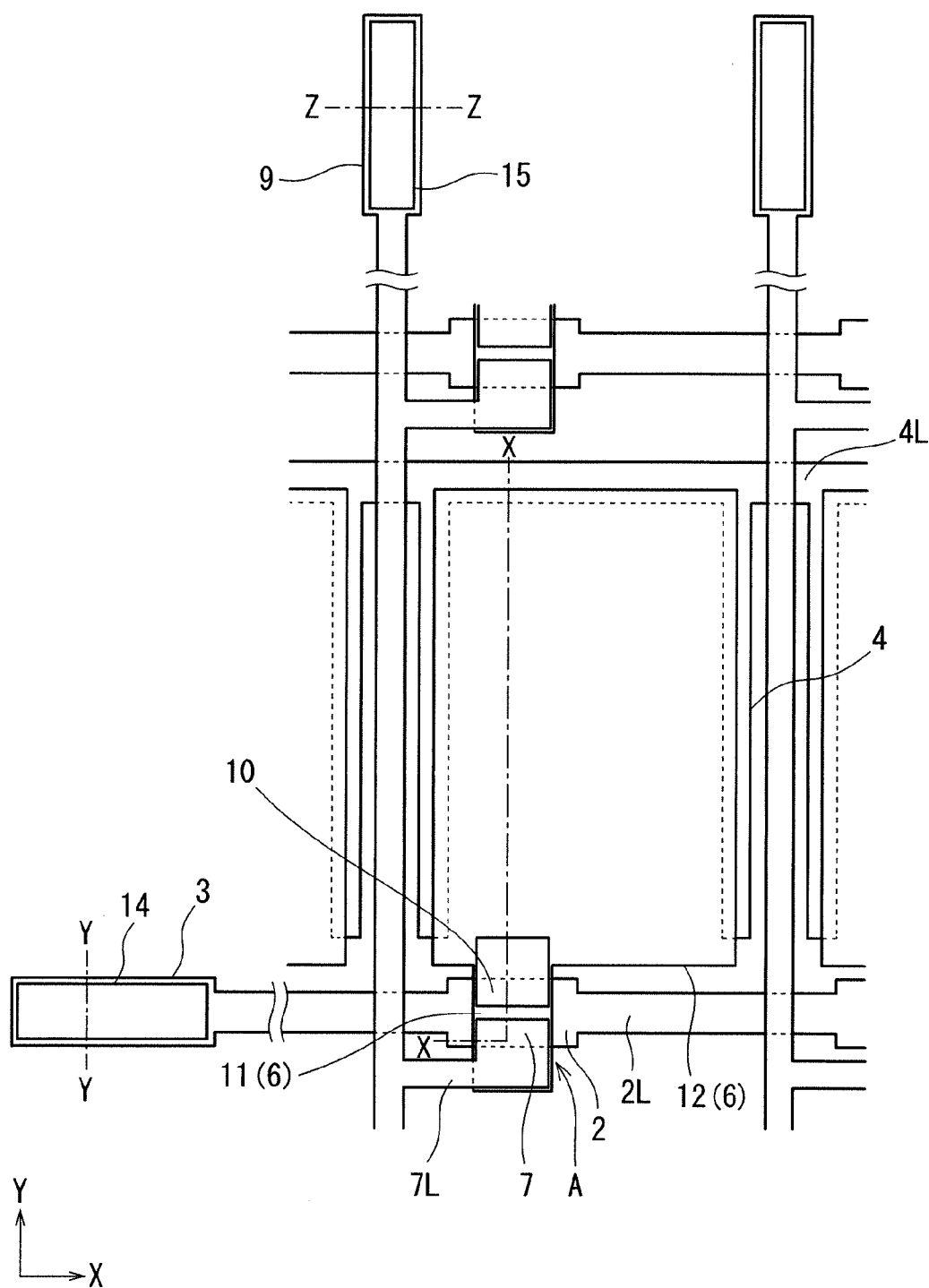
FIG. 1 is a plan view showing a configuration of a TFT substrate in a first preferred embodiment and a fifth preferred embodiment according to the present invention.
Figure 2:
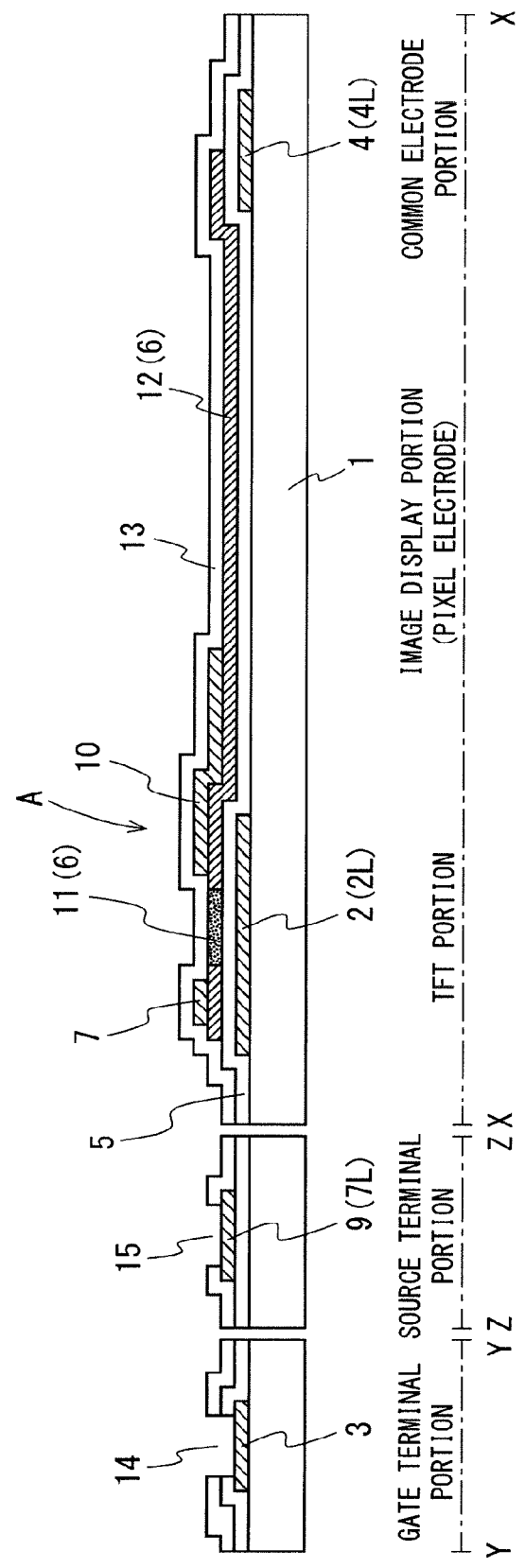
FIG. 2 is a cross-sectional view showing the configuration of the TFT substrate in the first preferred embodiment according to the present invention.

First, with reference to FIGS. 1 and 2, a configuration of a TFT substrate 100 in a first preferred embodiment is described. The present invention relates to the TFT substrate, and a configuration of a pixel particularly has characteristics, so that the configuration of the pixel is described below. FIG. 1 is a diagram showing a plane configuration of the pixel of the TFT substrate 100 according to the first preferred embodiment. FIG. 2 is a cross-sectional view showing a cross-sectional configuration taken along an X-X line in FIG. 1, a cross-sectional configuration taken along a Y-Y line in FIG. 1, and a cross-sectional configuration taken along a Z-Z line in FIG. 1. In addition, it is described hereinafter that the TFT substrate 100 is used in a transmissive liquid crystal display of a TN mode.

The cross-sectional configuration taken along the X-X line in FIG. 1 corresponds to a region (pixel portion) in which the pixel is formed and includes cross-sectional configurations of a "TFT portion" being a region in which a TFT is formed, an "image display portion" being a region in which a pixel electrode 12 is formed, and a "common electrode portion."

The cross-sectional configuration taken along the Y-Y line in FIG. 1 includes a cross-sectional configuration of a "gate terminal portion" being a region in which a gate terminal 3 for supplying a gate signal to a gate wiring 2L is formed. The cross-sectional configuration taken along the Z-Z line in FIG. 1 includes a cross-sectional configuration of a "source terminal portion" being a region in which a source terminal 9 for applying a display signal to a source wiring 7L is formed. In addition, the gate terminal 3 is disposed at an end of the gate wiring 2L, and the source terminal 9 is disposed at an end of the source wiring 7L.

As shown in FIG. 1, the TFT substrate 100 includes a plurality of gate wirings 2L (scanning signal lines) and a plurality of source wirings 7L (display signal lines) disposed to go straight to cross each other, and a TFT element A is disposed close to an intersection point of both of the wirings. A gate electrode 2 of the TFT element A is connected to the gate wiring 2L, and a source electrode 7 of the TFT element A is connected to the source wiring 7L.

In other words, in the TFT element A, part of the gate wiring 2L as the gate electrode 2 is disposed below a region (TFT portion) in which the TFT element A is formed, and the source electrode 7 branches off from the source wiring 7L to extend to the region in which the TFT element A is formed.

A region surrounded by the adjacent gate wirings 2L and the adjacent source wirings 7L is one of pixel regions, and thus the TFT substrate 100 has the configuration in which the pixel regions are arranged in matrix.

In FIG. 1, the gate wirings 2L are disposed to extend in a horizontal direction (X direction), and the source wirings 7L are disposed to extend in a vertical direction (Y direction).

As shown in FIG. 1, a common electrode (auxiliary capacitance electrode) 4 having a square U-shape in a plan view is disposed so as to overlap an outer edge of the pattern of the pixel electrode 12 being an upper layer in each of the pixel regions. The common electrode 4 is disposed to have an open end on the side where the TFT element A is disposed, and the common electrode 4 is connected to the other common electrode 4 disposed for the adjacent pixel with a common wiring 4L. In addition, the common electrode 4 is not limited to the square U-shape and may be a linear shape or an L-shape if a predetermined auxiliary capacitor is obtained.

As shown in FIG. 2, the TFT substrate 100 includes the gate electrode 2 of the TFT element A, the gate wiring 2L, the gate terminal 3, the common electrode 4, and the common wiring 4L formed on a transparent insulating substrate 1 made of for example, a glass, and a gate insulating film 5 (first insulating film) is formed to cover them. The gate insulating film 5 is omitted in FIG. 1.

A transparent oxide film 6 forming the pixel electrode 12 and the source terminal 9 are formed on the gate insulating film 5. The source electrode 7 and a drain electrode 10 are formed on the transparent oxide film 6 of the TFT portion. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

The pixel electrode 12 is formed to have the outer edge slightly smaller than a periphery of the common electrode 4, and part of the outer edge on the TFT element A side extends to cover the TFT element A. The source electrode 7 and the drain electrode 10 are disposed on the extending portion. In addition, the pixel electrode 12 is a flat-shaped conductive electrode formed of the transparent oxide film and is formed independently in each pixel in the first preferred embodiment.

The common electrode 4 is formed to be a film of the same layer as the gate electrode 2 and the gate terminal 3, and part of the pattern of the pixel electrode 12 is disposed to overlap part of the pattern of the common electrode 4 through the gate insulating film 5 below the pixel electrode 12 in the plan view, whereby a storage capacitor of the pixel electrode 12 is obtained.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, the source wiring 7L, the source terminal 9, the drain electrode 10, the channel region 11 of the TFT element A, and the pixel electrode 12. The protective insulating film 13 is omitted in FIG. 1.

A gate-terminal-portion contact hole 14 and a source-terminal-portion contact hole 15 are formed in the protective insulating film 13. The gate-terminal-portion contact hole 14 is formed to penetrate the protective insulating film 13 and the gate insulating film 5 and reach the gate terminal 3, and the source-terminal-portion contact hole 15 is formed to penetrate the protective insulating film 13 and reach the source terminal 9.

<Manufacturing Method>

Hereinafter, a method for manufacturing the TFT substrate 100 in the first preferred embodiment is described with reference to FIGS. 3 to 10. The plan view and the cross-sectional view in the final step correspond to FIGS. 1 and 2, respectively. In FIGS. 3 to 10, the same components as those shown in FIGS. 1 and 2 are denoted by the same references.

<Description of the Whole Method>

The whole manufacturing method is described with reference to FIGS. 3 to 5. First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film.

The Al—3 mol % Ni film may be formed by sputtering using an Al—3 mol % Ni alloy target. Herein, the Al—3 mol % Ni film having a thickness of 200 nm is formed to form the first conductive film. Ar gas, Kr gas, or the like may be used as sputtering gas.

Figure 3:
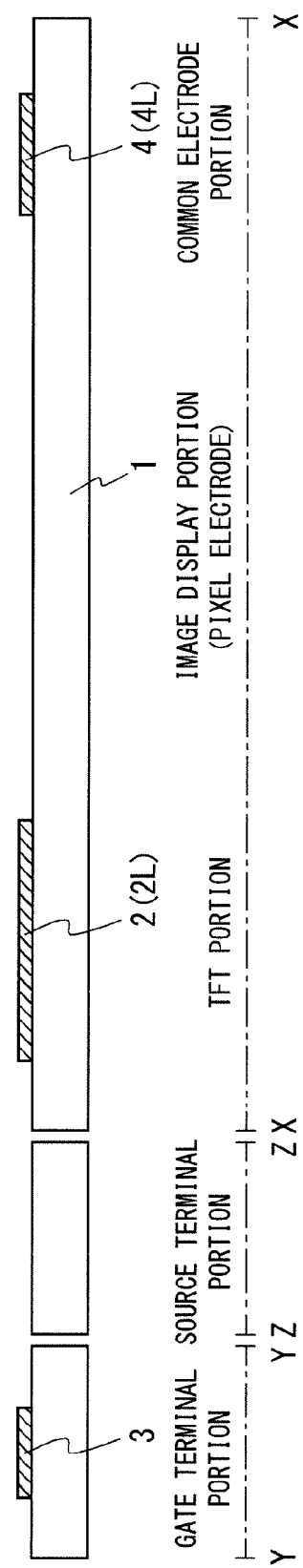
FIGS. 3 to 10 are cross-sectional views showing a method for manufacturing the TFT substrate in the first preferred embodiment according to the present invention.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 3.

In this preferred embodiment, the first conductive film (Al—3 mol % Ni film) is etched with a chemical solution of PAN system including phosphoric acid, acetic acid, and nitric acid, and subsequently, the resist pattern is stripped and removed with a resist stripping solution of amine system.

Figure 4:
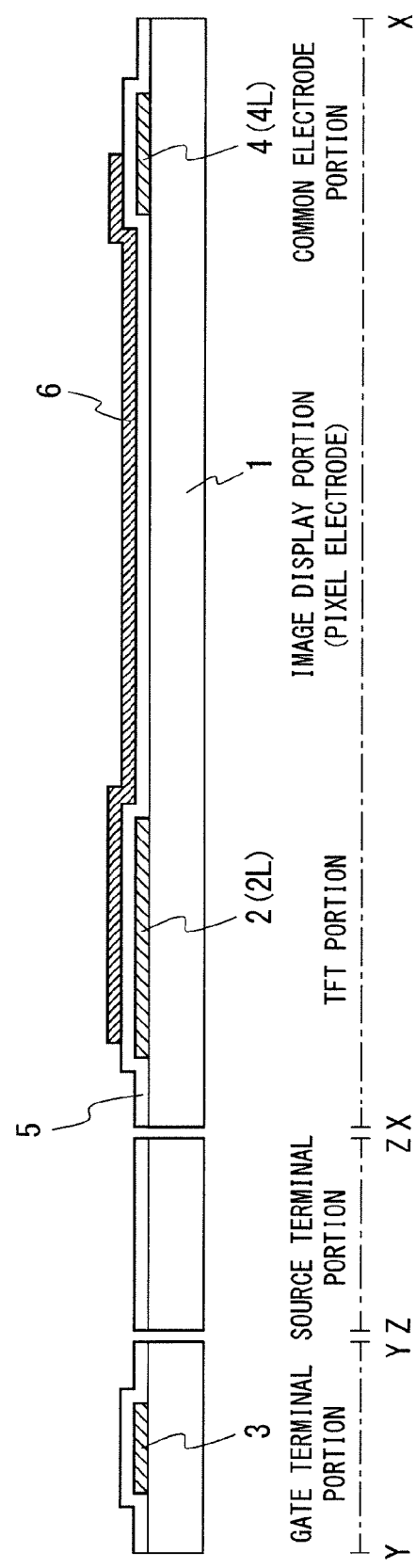

Next, in the step shown in FIG. 4, the first insulating film as the material for the gate insulating film 5 is formed on the entire surface of the transparent insulating substrate 1. In this preferred embodiment, a silicon oxide (SiO) film having a thickness of 300 nm is formed by a chemical-vapor deposition (CVD) technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film may be formed by a DC sputtering technique using InGaZnO target [$In_2O_3 \cdot (Ga_2O_3) \cdot (ZnO)_2$] in which an atomic composition ratio of In:Ga:Zn:O is 1:1:1:4. The argon (Ar) gas, the krypton (Kr) gas, or the like may be used as the sputtering gas. The InGaZnO film formed by the sputtering technique normally has the atomic composition ratio of oxygen less than stoichiometric composition, thereby forming an oxide film in a deficiency state of oxygen ions (composition ratio of O is less than 4 in the example above). The deficiency of oxygen ions generates a free electron, and carrier conduction of n-type exhibits conductivity. In this preferred embodiment, the InGaZnO film being formed is a conductive film having a specific resistance value of 0.1 Ωm or less (minimum specific resistance value is approximately $1 \times 10^{-6}$ Ωm in terms of characteristics of the materials for the film of the InGaZnO system).

The deficiency of oxygen ions in the InGaZnO film being formed can be increased by adding gas that includes hydrogen (H), for example, to the Ar gas or the Kr gas upon the sputtering and by reducing the film. On the other hand, it can be reduced by adding gas that includes oxygen (O) to the Ar gas or Kr gas and by oxidizing the film. The InGaZnO film is oxidized or reduced to control the deficiency state of oxygen ions, whereby the specific resistance value of the InGaZnO film being formed can be properly controlled. The InGaZnO film has an amorphous structure immediately after being formed. The InGaZnO film exhibits high transmittance characteristics of 70% or more in a visible light region with wavelengths of 400 to 800 nm.

Subsequently, a photoresist applied and formed on the transparent film is patterned in a second photolithography process to form a resist pattern, and the transparent oxide film 6 is patterned with the resist pattern serving as an etching mask, to thereby selectively form the transparent oxide film 6 on the gate insulating film 5, as shown in FIG. 4.

In this preferred embodiment, the transparent oxide film 6 (InGaZnO film) is etched with a chemical solution of oxalic acid system, and subsequently, the resist pattern is stripped and removed with the resist stripping solution of amine system.

Next, a second conductive film as a material for the source electrode 7, the source wiring 7L, the source terminal 9, and the drain electrode 10 is formed on the transparent insulating substrate 1. In this preferred embodiment, the alloy film of aluminum (Al) system being a metal, and more specifically, the alloy film (Al—3 mol % Ni film) in which Ni of 3 mol % is added to Al is used as the second conductive film.

The Al—3 mol % Ni film may be formed by sputtering using the Al—3 mol % Ni alloy target. Herein, the Al—3 mol % Ni film having the thickness of 200 nm is formed to form the second conductive film. The Ar gas, the Kr gas, or the like may be used as the sputtering gas.

Figure 5:
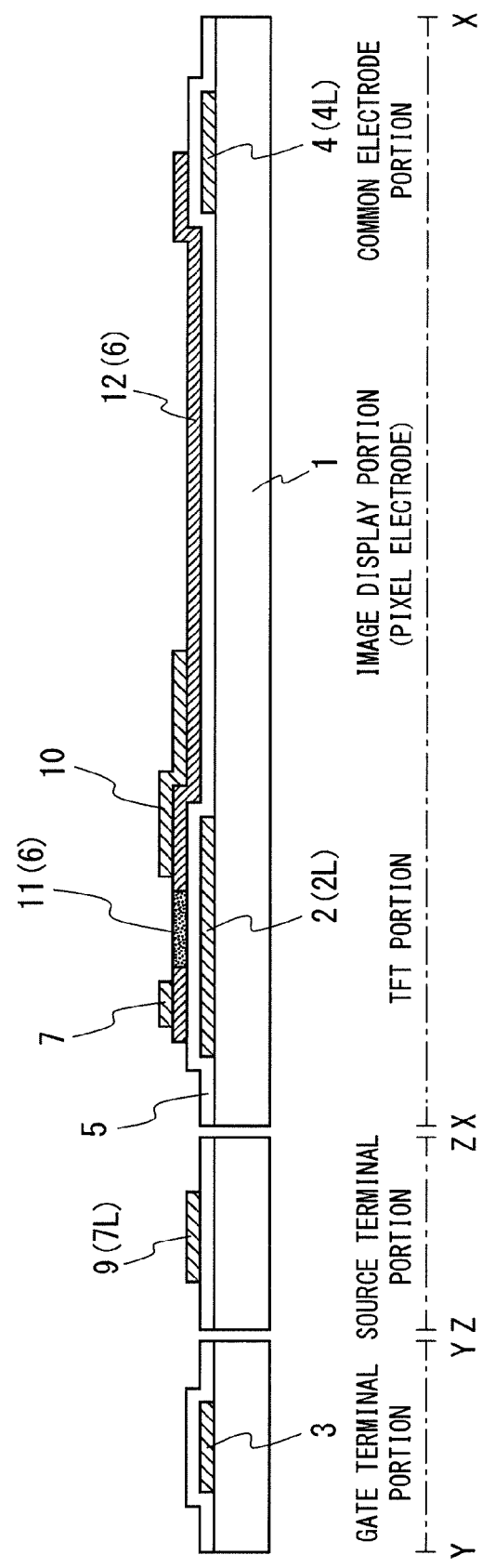
Figure 6:
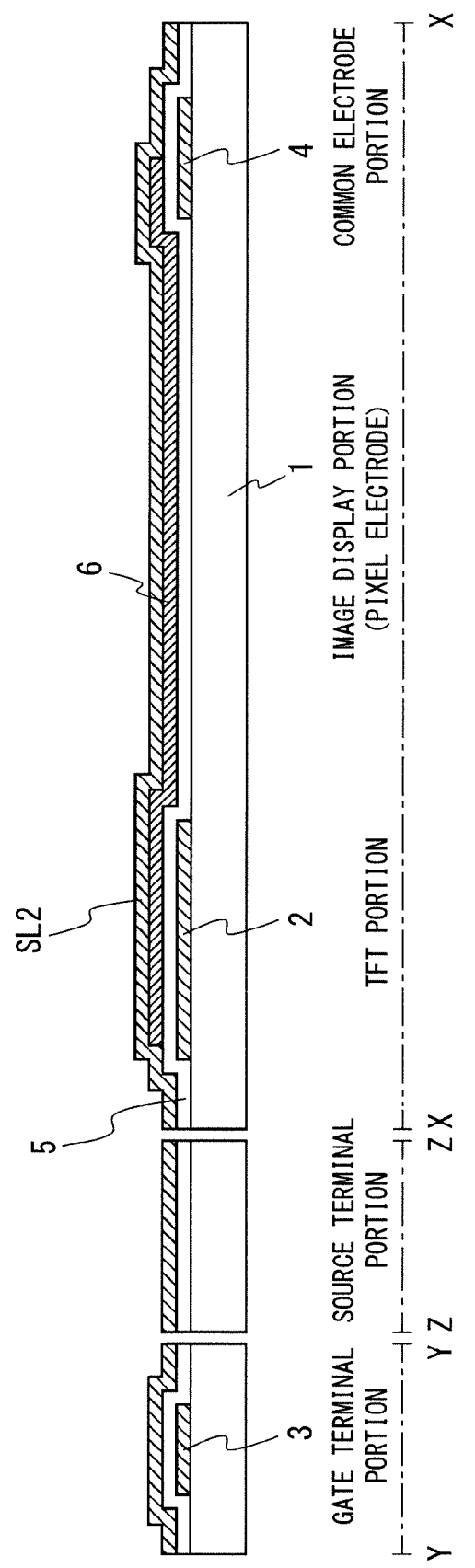

Subsequently, a photoresist applied and formed on the second conductive film is patterned in a third photolithography process to form a resist pattern, and the second conductive film is patterned with the resist pattern serving as an etching mask, to thereby form the source electrode 7, the source wiring 7L, the source terminal 9, and the drain electrode 10, as shown in FIG. 5.

In this preferred embodiment, the second conductive film (Al—3 mol % Ni film) is etched with an alkaline system chemical solution of TMAH including tetra methyl ammonium hydroxide (TMAH), and subsequently, the resist pattern is stripped and removed with the resist stripping solution of amine system.

When the well-known chemical solution of PAN system typically used as an etching chemical solution for an Al system alloy film is used, the transparent oxide film 6 being the lower layer is also etched at the same time, resulting in difficulty in etching only the second conductive film. However, only the second conductive film can be selectively etched without etching the transparent oxide film 6 being the lower layer by using the alkaline system chemical solution.

In addition, this step includes the step of oxidizing the transparent oxide film 6 corresponding to the lower layer in the region between the source electrode 7 and the drain electrode 10 and reducing the deficiency of oxygen to increase an electrical resistance, to thereby form a semiconductor that serves as the channel region 11 of the TFT element A.

Specifically, the resistance is increased such that the semiconductor region has the specific resistance value of more than 0.1 Ωm and less than 1×10$^6$ Ωm. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 being the lower portion of the source electrode 7 and the drain electrode 10 also maintains conductivity as a conductive region without the oxidation.

A technology of halftone exposure of a photoresist is applicable to the steps as described above, and the steps are described below with reference to FIGS. 6 to 10.

A second insulating film as a material for the protective insulating film 13 is formed on the entire surface of the transparent insulating substrate 1 that finished the steps up to FIG. 5. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a fourth photolithography process to form a resist pattern, and the gate-terminal-portion contact hole 14 and the source-terminal-portion contact hole 15 are formed with the resist mask serving as an etching mask. The gate-terminal-portion contact hole 14 penetrates the protective insulating film 13 and the gate insulating film 5 and reaches the gate terminal 3. The source-terminal-portion contact hole 15 penetrates the protective insulating film 13 and reaches the source terminal 9. Thus, the cross-sectional structure shown in FIG. 2 is obtained.

In this preferred embodiment, the protective insulating film 13 and the gate insulating film 5 are etched by a dry etching technique using sulfur hexafluoride ($SF_6$) gas and $O_2$ gas, and subsequently, the resist pattern is stripped and removed with the resist stripping solution of amine system.

<Description of Steps Using Halftone Exposure>

Next, the steps using the technology of the halftone exposure are described with reference to FIGS. 6 to 10. In the step shown in FIG. 6, a second conductive film SL2 as a material for the source electrode 7, the source wiring 7L, the source terminal 9, and the drain electrode 10 is formed on the entire surface of the transparent insulating substrate 1 that finished the steps up to FIG. 4.

In this preferred embodiment, the alloy film of aluminum (Al) system being a metal, and more specifically, the Al—3 mol % Ni film with the thickness of 200 nm in which Ni of 3 mol % is added to Al is formed as the second conductive film SL2. A formation method is already described, so that the descriptions are omitted.

Subsequently, a photoresist applied and formed on the second conductive film SL2 is patterned in the third photolithography process to form a resist pattern.

More specifically, first, the photoresist formed of a positive-type photosensitive resin of novolac system is applied and formed on the second conductive film SL2. Subsequently, development is performed with an organic alkaline system developing solution including the tetra methyl ammonium hydroxide (TMAH) after exposure of the photoresist, to thereby form resist patterns PR1, PR2, and PR3, as shown in FIG. 7.

Figure 7:
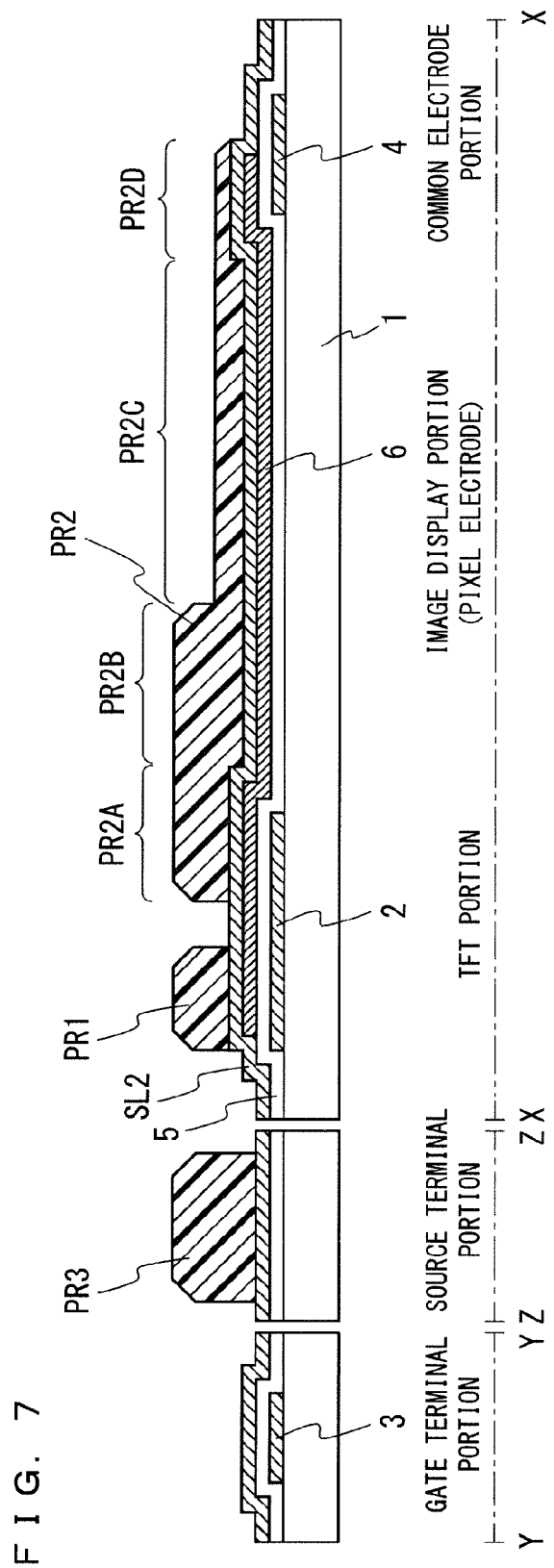

The resist patterns PR1, PR2, and PR3 shown in FIG. 7 are independent patterns separated from each other. The resist pattern PR2 has a first portion PR2A, a second portion PR2B, a third portion PR2C, and a fourth portion PR2D. The first portion PR2A and the second portion PR2B have different film thicknesses due to a step height of underlayers. The third portion PR2C and the fourth portion PR2D have entire film thicknesses thinner than those of the first portion PR2A and the second portion PR2B and have different film thicknesses due to the step height of the underlayers. Thus, the resist pattern PR2 is a pattern having the plurality of different film thicknesses. Hereinafter, this may be referred to as a complex resist pattern.

The resist pattern having the plurality of different film thicknesses may be formed by the technology of the "halftone exposure" in which light intensity upon exposure varies depending on a position by using a "halftone mask" having a plurality of transmittance.

In other words, the third portion PR2C and the fourth portion PR2D are intermediate exposure regions by being exposed to light having reduced intensity upon the exposure and are regions having the film thicknesses reduced by removal of only the upper layer portion of the photoresist upon the development. On the other hand, the first portion PR2A and the second portion PR2B and the resist patterns PR1 and PR3 are non-exposure regions by being shielded from light upon the exposure and are regions having no thicknesses reduced upon the development.

Figure 8:
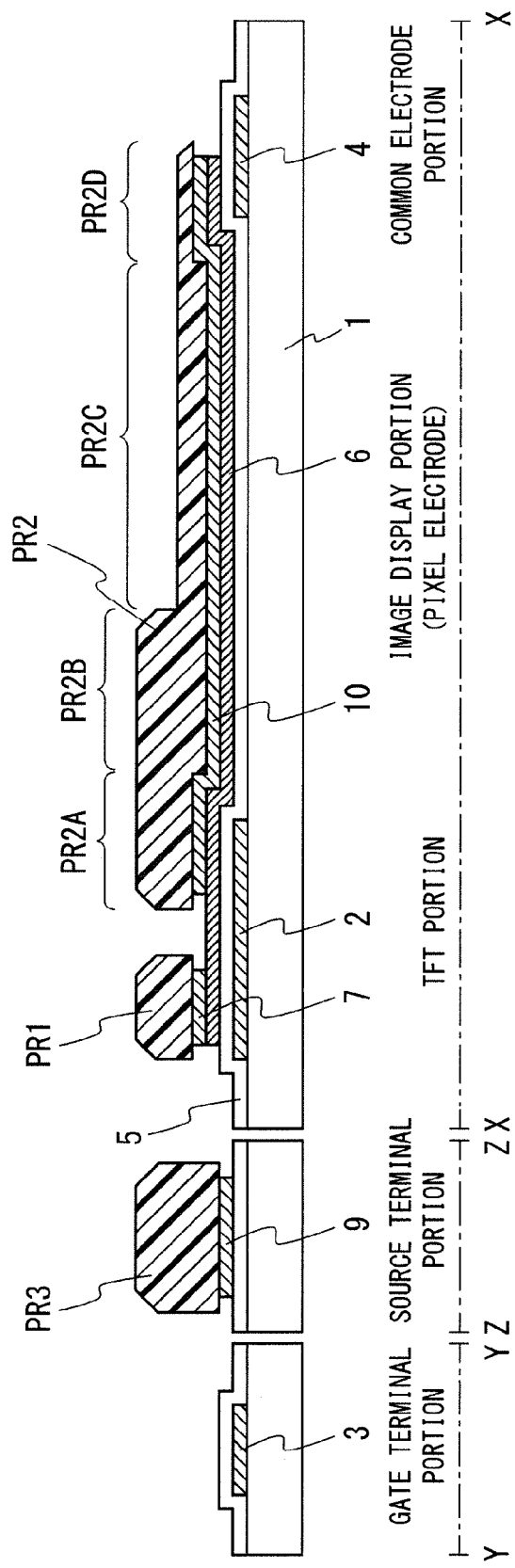

Next, the second conductive film SL2 is patterned by etching with the resist patterns PR1 to PR3 as an etching mask. In this preferred embodiment, as described above, the second conductive film (Al—3 mol % Ni film) SL2 is etched with the alkaline system chemical solution of TMAH. As the chemical solution of TMAH herein, the organic alkaline developing solution including TMAH used for developing the photoresist may be used. Thus, as shown in FIG. 8, the source electrode 7, the source wiring 7L, the source terminal 9, and the drain electrode 10 are patterned. In addition, each end edge portion of the source electrode 7, the source wiring 7L, the source terminal 9, and the drain electrode 10 is etched so as to be located inside end edge portions of the resist patterns PR1 to PR3.

Next, the resist patterns PR1 to PR3 are subjected to ashing with $O_2$ gas plasma used on the whole transparent insulating substrate 1 to completely remove the third portion PR2C and the fourth portion PR2D having the thin film thicknesses and to reduce the film thicknesses of the resist patterns PR1 and PR3 and the first portion PR2A and the second portion PR2B.

Figure 9:
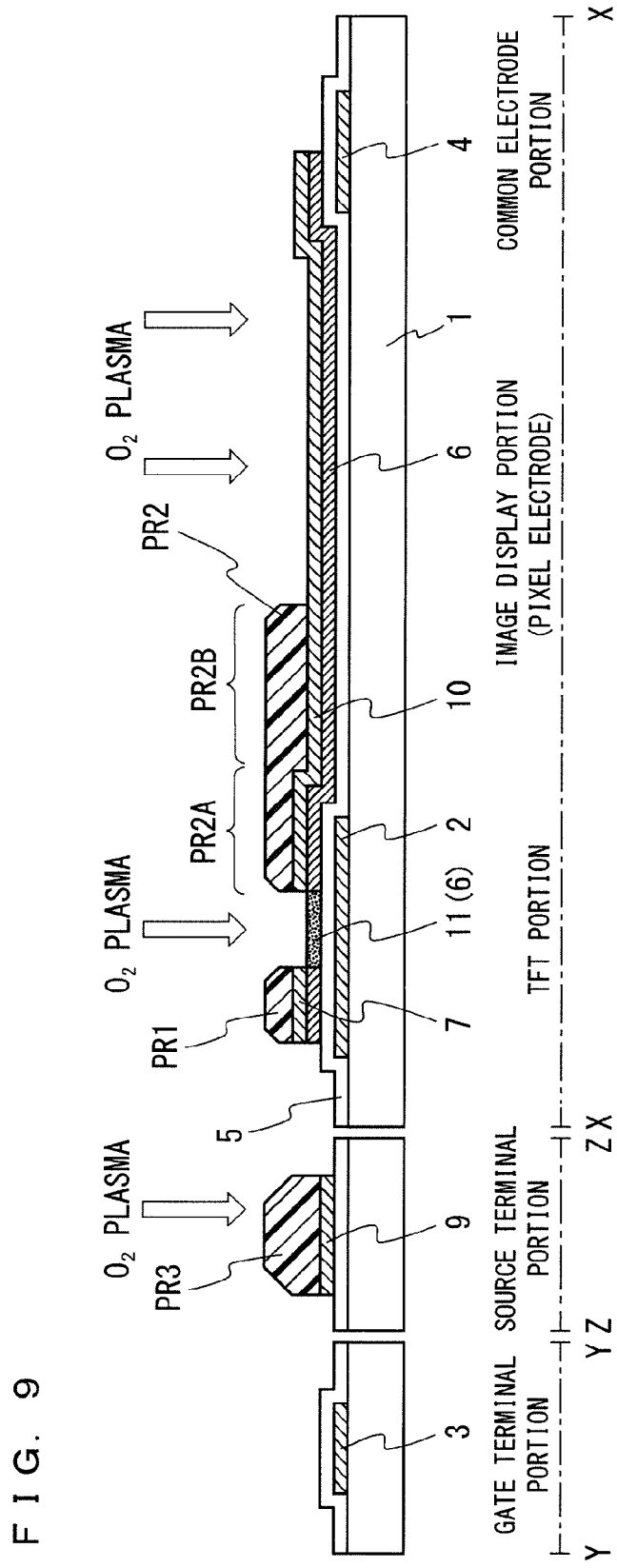

At this time, in the transparent oxide film 6 corresponding to the lower layer in the region between the source electrode 7 and the drain electrode 10, an oxidation reaction by the ashing with the $O_2$ gas plasma proceeds and the resistance is thus increased to form the channel region 11 of the TFT element A as shown in FIG. 9, and the resistance increased by the oxidation can also cause improvement in the resistance to the etching chemical solution. Then, after the ashing with the $O_2$ gas plasma, a plasma treatment may be further performed with nitrous oxide ($N_2O$) gas. The $N_2O$ gas plasma can more efficiently cause the increase in the resistance of the transparent oxide film 6 corresponding to the lower layer in the region between the source electrode 7 and the drain electrode 10.

Subsequently, the second conductive film SL2 is patterned again by etching in which the remaining resist patterns PR1 and PR3, first portion PR2A, and second portion PR2B thinned by the ashing serve as an etching mask.

Figure 10:
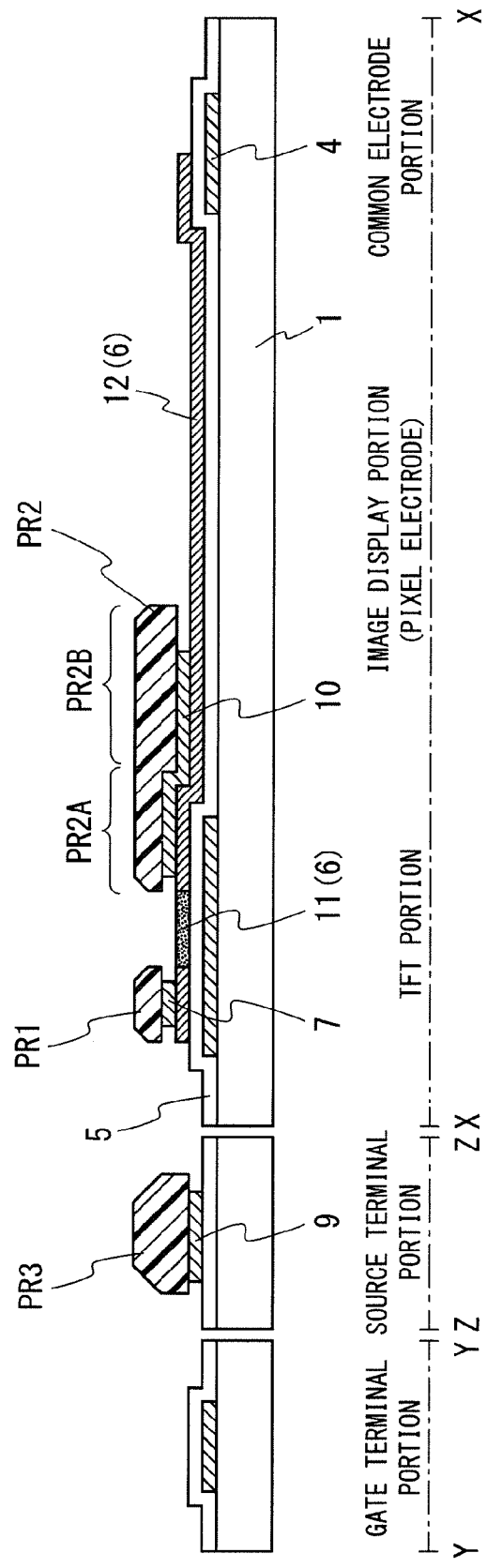

Thus, as shown in FIG. 10, a portion of the second conductive film SL2 that is not covered with the resist patterns is removed, and each of the end edge portions of the source electrode 7, the source wiring 7L, the source terminal 9, and the drain electrode 10 is further located inside the end edge portions of the resist patterns PR1 to PR3.

Subsequently, the resist patterns PR1 to PR3 are stripped and removed with the resist stripping solution of amine system, and thus the cross-sectional configuration shown in FIG. 5 is obtained.

In addition, the channel region 11 of the TFT element A and the pixel electrode 12 made of the transparent oxide film 6 are formed in the same layer, but upon the ashing described with reference to FIG. 9, the pixel electrode 12 has the upper portion covered with the second conductive film SL2, so that the pixel electrode 12 is not oxidized and functions as a transparent pixel electrode 12 while maintaining the conductivity in the early stage.

As described above, the TFT substrate 100 (active matrix substrate of TN mode) in the first preferred embodiment shown in FIGS. 1 and 2 can be formed with great productivity in the four photolithography processes.

When a liquid crystal display panel is assembled, an alignment film or spacers are formed on the surface of the finished TFT substrate 100. The alignment film is a film for aligning liquid crystals and is made of polyimide or the like. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the TN mode.

The TFT-LCD finished in this manner includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

Second Preferred Embodiment

Configuration of Pixel of TFT Substrate

Figure 11:
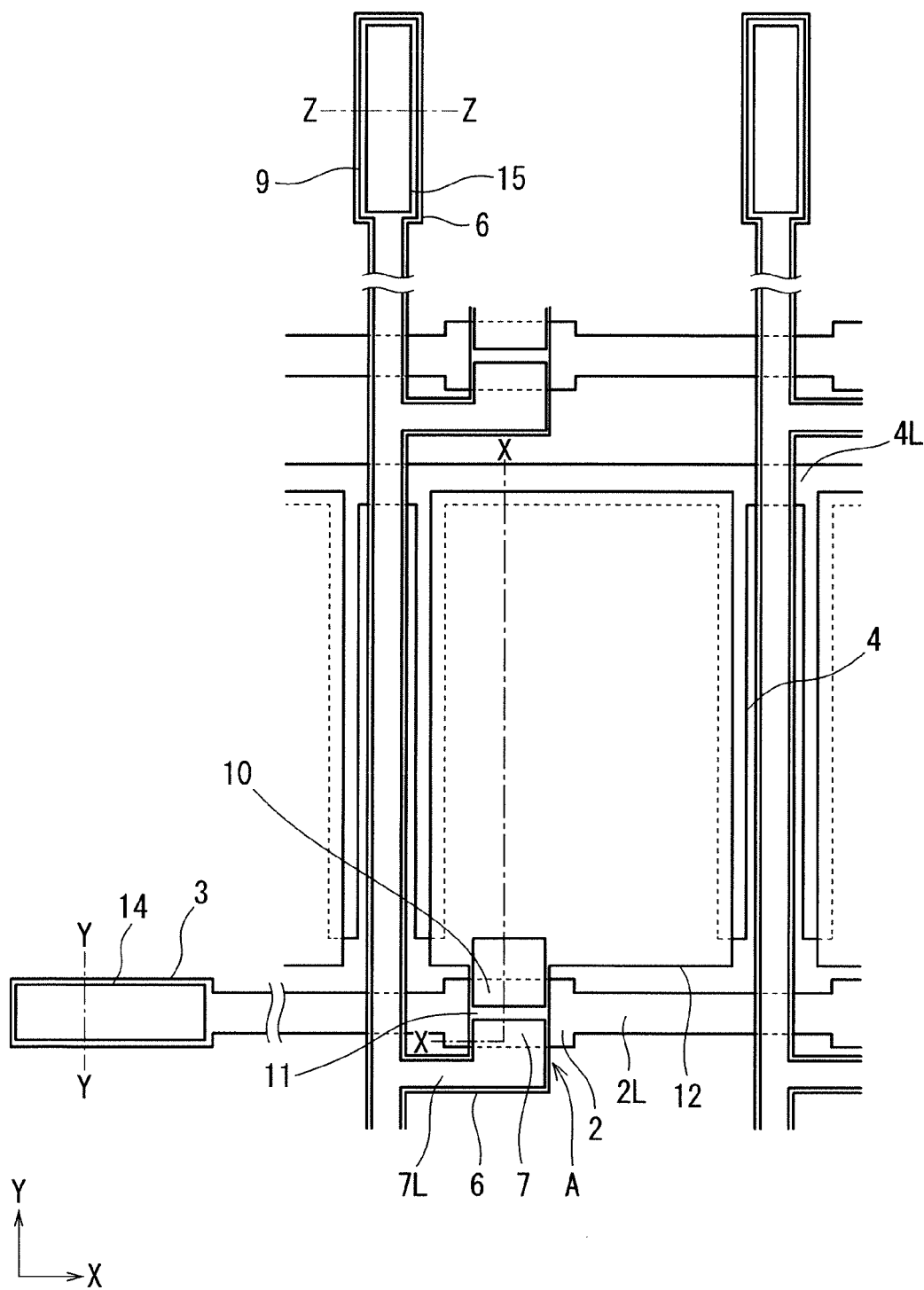
FIG. 11 is a plan view showing a configuration of a TFT substrate in a second preferred embodiment and a sixth preferred embodiment according to the present invention.
Figure 12:
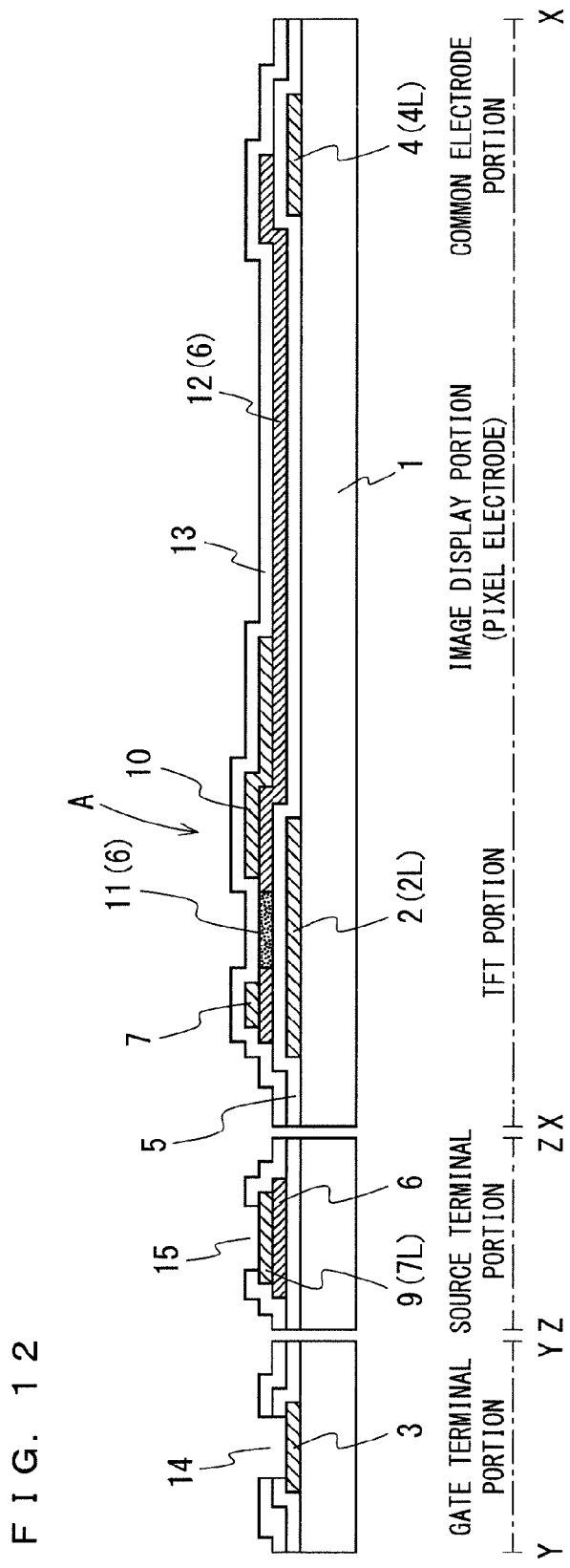
FIG. 12 is a cross-sectional view showing the configuration of the TFT substrate in the second preferred embodiment according to the present invention.

First, with reference to FIGS. 11 and 12, a configuration of a TFT substrate 200 in a second preferred embodiment is described. FIG. 11 is a plan view showing a configuration of a pixel of the TFT substrate 200 according to the second preferred embodiment. FIG. 12 is a cross-sectional view showing a cross-sectional configuration taken along an X-X line in FIG. 11, a cross-sectional configuration taken along a Y-Y line in FIG. 11, and a cross-sectional configuration taken along a Z-Z line in FIG. 11. In addition, it is described hereinafter that the TFT substrate 200 is used in a transmissive liquid crystal display of a TN mode.

The cross-sectional configuration taken along the X-X line in FIG. 11 corresponds to a region (pixel portion) in which the pixel is formed and includes cross-sectional configurations of a "TFT portion" being a region in which a TFT is formed, an "image display portion" being a region in which a pixel electrode 12 is formed, and a "common electrode portion."

The cross-sectional configuration taken along the Y-Y line in FIG. 11 includes a cross-sectional configuration of a "gate terminal portion" being a region in which a gate terminal 3 for supplying a gate signal to a gate wiring 2L is formed. The cross-sectional configuration taken along the Z-Z line in FIG. 11 includes a cross-sectional configuration of a "source terminal portion" being a region in which a source terminal 9 for applying a display signal to a source wiring 7L is formed. In addition, the gate terminal 3 is disposed at an end of the gate wiring 2L, and the source terminal 9 is disposed at an end of the source wiring 7L.

The TFT substrate 200 is different from the TFT substrate 100 in the first preferred embodiment. The TFT substrate 200 includes a transparent oxide film 6 also in a lower portion of the source wiring 7L and the source terminal 9, and the source wiring 7L and the source terminal 9 substantially have a laminated structure. The TFT substrate 200 is the same as the TFT substrate 100 in a plan view except for that the transparent oxide film 6 is disposed below the source wiring 7L and the source terminal 9, so that redundant descriptions are omitted.

As shown in FIG. 12, the TFT substrate 200 includes a gate electrode 2 of a TFT element A, the gate wiring 2L, the gate terminal 3, a common electrode 4, and a common wiring 4L formed on a transparent insulating substrate 1 made of, for example, a glass, and a gate insulating film 5 (first insulating film) is formed to cover them. The gate insulating film 5 is omitted in FIG. 11.

The transparent oxide film 6 forming the pixel electrode 12 is formed on the gate insulating film 5, and the transparent oxide film 6 is also formed in a position corresponding to the lower portion of the source wiring 7L and the source terminal 9 on the gate insulating film 5. The source electrode 7 and a drain electrode 10 are formed on the transparent oxide film 6 of the TFT portion. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

The pixel electrode 12 is formed to have its outer edge slightly smaller than a periphery of the common electrode 4, and part of the outer edge on the TFT element A side extends to cover the TFT element A. The source electrode 7 and the drain electrode 10 are disposed on the extending portion. In addition, the pixel electrode 12 is a flat-shaped conductive electrode formed of the transparent oxide film and is formed independently in each pixel in the second preferred embodiment.

The common electrode 4 is formed to be a film of the same layer as the gate electrode 2 and the gate terminal 3, and part of the pattern of the pixel electrode 12 is disposed to overlap part of the pattern of the common electrode 4 through the gate insulating film 5 below the pixel electrode 12 in the plan view, whereby a storage capacitor of the pixel electrode 12 is obtained.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, the source wiring 7L, the source terminal 9, the drain electrode 10, the channel region 11 of the TFT element A, and the pixel electrode 12. The protective insulating film 13 is omitted in FIG. 11.

A gate-terminal-portion contact hole 14 and a source-terminal-portion contact hole 15 are formed in the protective insulating film 13. The gate-terminal-portion contact hole 14 is formed to penetrate the protective insulating film 13 and the gate insulating film 5 and reach the gate terminal 3, and the source-terminal-portion contact hole 15 is formed to penetrate the protective insulating film 13 and reach the source terminal 9.

<Manufacturing Method>

Hereinafter, a method for manufacturing the TFT substrate 200 in the second preferred embodiment is described with reference to FIGS. 13 to 21. The plan view and the cross-sectional view in the final step correspond to FIGS. 11 and 12, respectively. In FIGS. 13 to 21, the same components as those shown in FIGS. 11 and 12 are denoted by the same references.

<Description of the Whole Method>

The whole manufacturing method is described with reference to FIGS. 13 and 14. First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. Herein, the Al—3 mol % Ni film having a thickness of 200 nm is formed to form the first conductive film. In addition, a method for forming the Al—3 mol % Ni film is described as in the first preferred embodiment.

Figure 13:
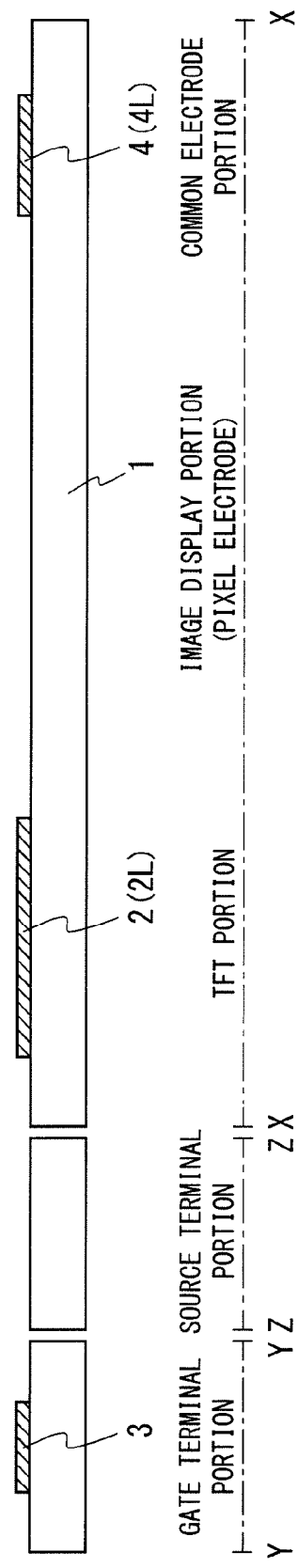
FIGS. 13 to 21 are cross-sectional views showing a method for manufacturing the TFT substrate in the second preferred embodiment according to the present invention.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 13.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO (InGaZnO film) system in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 $\Omega$m or less (minimum specific resistance value is approximately $1 \times 10^6$ $\Omega$m in terms of characteristics of the materials for the film of the InGaZnO system). A method for causing the deficiency state of oxygen is as described above.

Next, a second conductive film as a material for the source electrode 7, the source wiring 7L, the source terminal 9, and the drain electrode 10 is formed on the transparent insulating substrate 1 on which the transparent oxide film 6 is formed. In this preferred embodiment, the alloy film of aluminum (Al) system being a metal, and more specifically, the alloy film (Al—3 mol % Ni film) in which Ni of 3 mol % is added to Al is used as the second conductive film.

Figure 14:
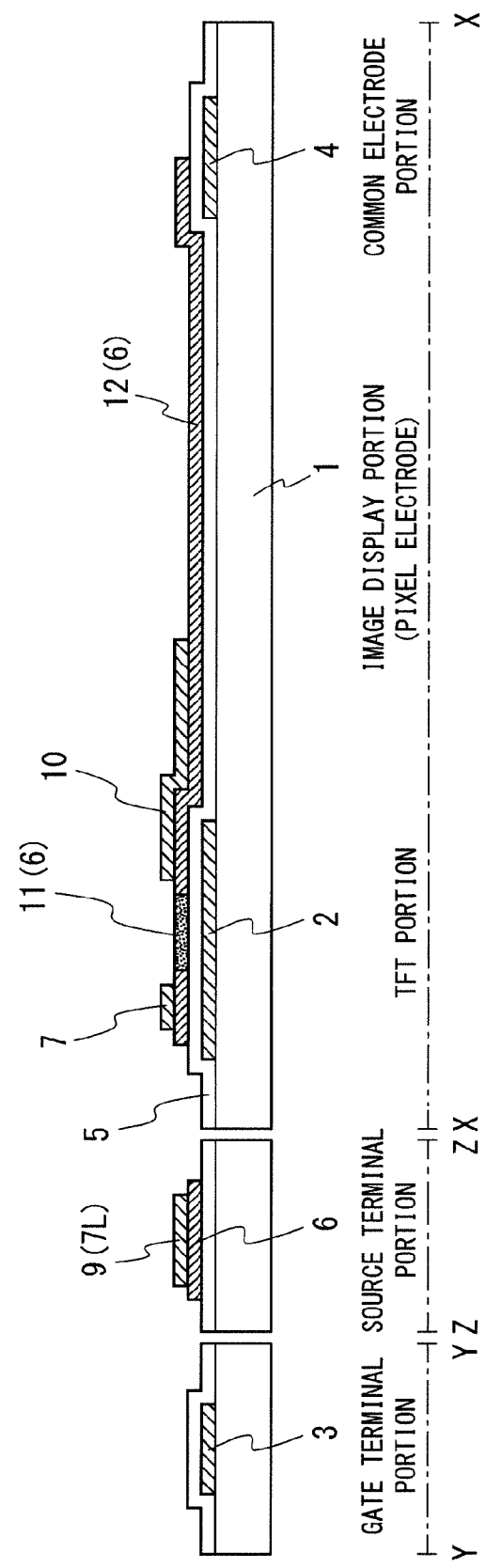

Subsequently, a photoresist applied and formed on the second conductive film is patterned in a second photolithography process to form a resist pattern, and the second conductive film and the transparent oxide film 6 are patterned with the resist pattern serving as an etching mask, to thereby form the source electrode 7, the source wiring 7L, the source terminal 9, and the drain electrode 10, as shown in FIG. 14. In this preferred embodiment, the transparent oxide film 6 is patterned to be left also in the lower portion of the source wiring 7L and the source terminal 9, so that the source wiring 7L and the source terminal 9 can substantially have the laminated structure.

This step includes the step of oxidizing the transparent oxide film 6 corresponding to the lower layer in the region between the source electrode 7 and the drain electrode 10 and reducing a deficiency of oxygen to increase an electrical resistance, to thereby form a semiconductor that serves as the channel region 11 of the TFT element A.

Specifically, the resistance is increased such that the semiconductor region has the specific resistance value of more than 0.1 $\Omega$m and less than $1 \times 10^6$ $\Omega$m. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 being the lower portion of the source electrode 7 and the drain electrode 10 also maintains conductivity as a conductive region without the oxidation.

A technology of halftone exposure of a photoresist is applicable to the steps as described above, and the steps are described below with reference to FIGS. 15 to 21.

A second insulating film as a material for the protective insulating film 13 is formed on the entire surface of the transparent insulating substrate 1 that finished the steps up to FIG. 14. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a third photolithography process to form a resist pattern, and the gate-terminal-portion contact hole 14 and the source-terminal-portion contact hole 15 are formed with the resist mask serving as an etching mask. The gate-terminal-portion contact hole 14 penetrates the protective insulating film 13 and the gate insulating film 5 and reaches the gate terminal 3. The source-terminal-portion contact hole 15 penetrates the protective insulating film 13 and reaches the source terminal 9. Thus, the cross-sectional structure shown in FIG. 12 is obtained.

In this preferred embodiment, the protective insulating film 13 and the gate insulating film 5 are etched by a dry etching technique using sulfur hexafluoride ($SF_6$) gas and $O_2$ gas, and subsequently, the resist pattern is stripped and removed with the resist stripping solution of amine system.

<Description of Steps Using Halftone Exposure>

Next, the steps using the technology of the halftone exposure are described with reference to FIGS. 15 to 21. The gate insulating film 5 is formed on the entire surface of the transparent insulating substrate 1 that finished the steps up to FIG. 13, and then, the transparent oxide film 6 is formed on the entire surface of the gate insulating film 5. In this preferred embodiment, the transparent oxide film 6 of InGaZnO system (InGaZnO film) having a thickness of 50 nm is formed as the transparent oxide film 6.

The InGaZnO film may be formed by a DC sputtering technique using InGaZnO target [$In_2O_3.(Ga_2O_3).(ZnO)_2$] in which an atomic composition ratio of In:Ga:Zn:O is 1:1:1:4. Argon (Ar) gas, krypton (Kr) gas, or the like may be used as sputtering gas. The InGaZnO film formed by the sputtering technique normally has the atomic composition ratio of oxygen less than stoichiometric composition, thereby forming an oxide film in a deficiency state of oxygen ions (composition ratio of O is less than 4 in the example above). The deficiency of oxygen ions generates a free electron, and carrier conduction of n-type exhibits conductivity. In this preferred embodiment, the InGaZnO film being formed is a conductive film having a specific resistance value of 0.1 $\Omega$m or less (minimum specific resistance value is approximately $1\times10^{-6}$ $\Omega$m in terms of characteristics of the materials for the film of the InGaZnO system).

The deficiency of oxygen ions in the InGaZnO film being formed can be increased by adding gas that includes hydrogen (H), for example, to the Ar gas or the Kr gas upon the sputtering and by reducing the film. On the other hand, it can be reduced by adding gas that includes oxygen (O) to the Ar gas or Kr gas and by oxidizing the film. The InGaZnO film is oxidized or reduced to control the deficiency state of oxygen ions, whereby the specific resistance value of the InGaZnO film being formed can be properly controlled. The InGaZnO film has an amorphous structure immediately after being formed. The InGaZnO film exhibits high transmittance characteristics of 70% or more in a visible light region with wavelengths of 400 to 800 nm.

Figure 15:
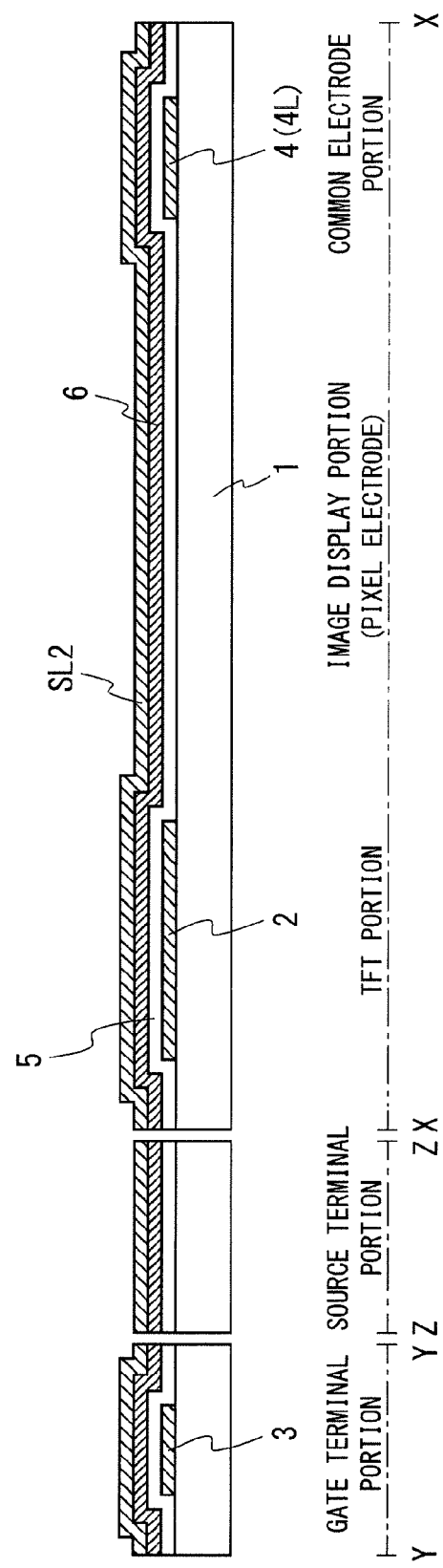

Next, a second conductive film SL2 as a material for the source electrode 7, the source wiring 7L, the source terminal 9, and the drain electrode 10 is formed on an entire surface of the transparent oxide film 6, to thereby form a laminated film of the gate insulating film 5, the transparent oxide film 6, and the second conductive film SL2 on the transparent insulating substrate 1, as shown in FIG. 15.

In this preferred embodiment, the alloy film of aluminum (Al) system being a metal, and more specifically, the Al—3 mol % Ni film with the thickness of 200 nm in which Ni of 3 mol % is added to Al is formed as the second conductive film SL2. A formation method is already described, so that the descriptions are omitted.

Subsequently, a photoresist applied and formed on the second conductive film SL2 is patterned in the second photolithography process to form a resist pattern.

Figure 16:
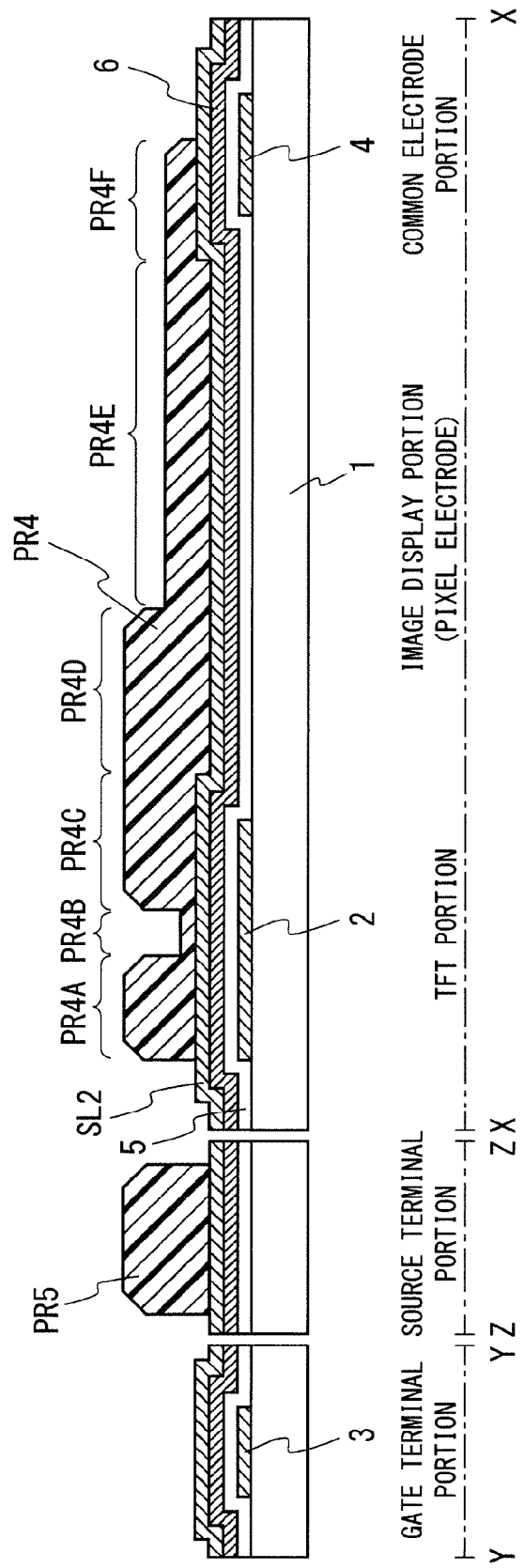

More specifically, first, the photoresist formed of a positive-type photosensitive resin of novolac system is applied and formed on the second conductive film SL2. Subsequently, development is performed with an organic alkaline system developing solution including tetra methyl ammonium hydroxide (TMAH) after exposure of the photoresist, to thereby form resist patterns PR4 and PR5, as shown in FIG. 16.

The resist patterns PR4 and PR5 are independent patterns separated from each other. The resist pattern PR4 has a first portion PR4A, a second portion PR4B, a third portion PR4C, a fourth portion PR4D, a fifth portion PR4E, and a sixth portion PR4F. The first portion PR4A, the third portion PR4C, and the fourth portion PR4D have different film thicknesses due to a step height of underlayers. The fifth portion PR4E and the sixth portion PR4F have entire film thicknesses thinner than those of the first portion PR4A, the third portion PR4C, and the fourth portion PR4D and have different film thicknesses due to the step height of the underlayers. The second portion PR4B has a thickness thinner than those of the fifth portion PR4E and the sixth portion PR4F. Thus, the resist pattern PR4 is a pattern having the plurality of different film thicknesses.

The resist pattern having the plurality of different film thicknesses may be formed by the technology of the "halftone exposure" in which light intensity upon exposure varies depending on a position by using a "halftone mask" having a plurality of transmittance.

In other words, the second portion PR4B is an intermediate exposure region by being exposed to light having reduced intensity upon the exposure and is a region having the film thickness reduced by removal of only the upper layer portion of the photoresist upon the development. The fifth portion PR4E and the sixth portion PR4F are second intermediate exposure regions by being exposed to light having more reduced intensity than the light for the second portion PR4B and are regions having the film thicknesses reduced by removal of only the upper layer portion of the photoresist upon the development. On the other hand, the first portion PR4A, the third portion PR4C, and the fourth portion PR4D are non-exposure regions by being shielded from light upon the exposure and are regions having no thicknesses reduced upon the development.

Figure 17:
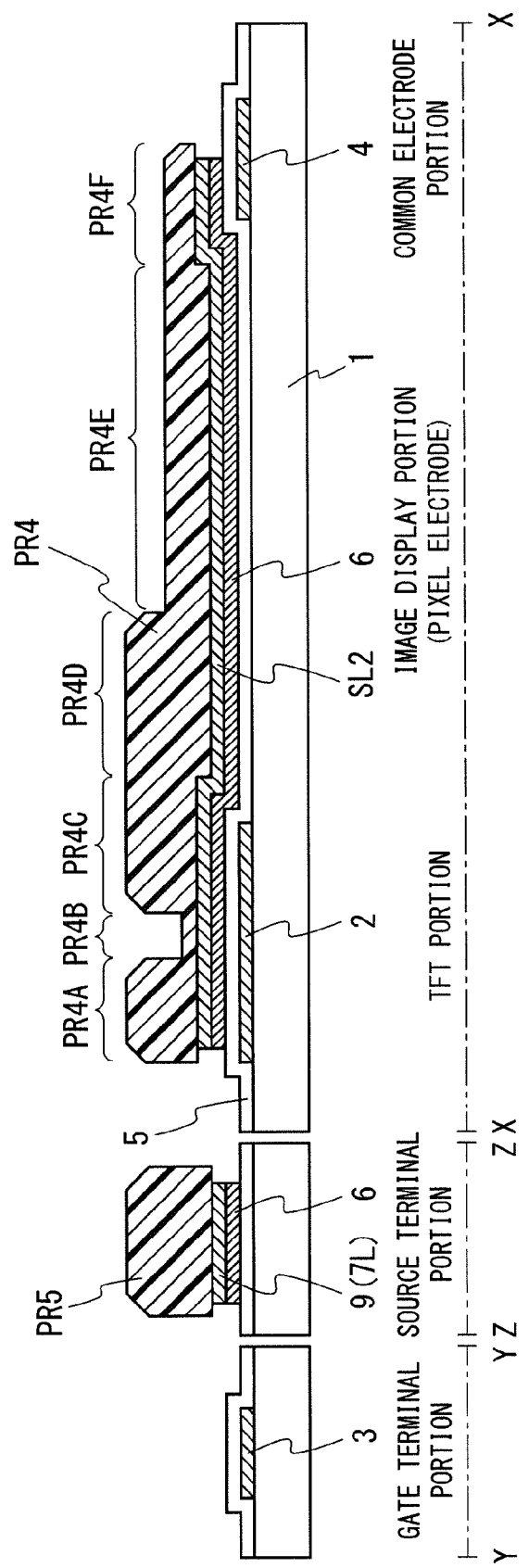

Next, the second conductive film SL2 and the transparent oxide film 6 are patterned by etching with the resist patterns PR4 and PR5 as an etching mask. In this preferred embodiment, as described above, the second conductive film (Al—3 mol % Ni film) SL2 is etched with the alkaline system chemical solution of TMAH. As the chemical solution of TMAH herein, the organic alkaline system developing solution including TMAH used for developing the photoresist may be used. Subsequently, the transparent oxide film 6 is then etched with a chemical solution of oxalic acid system. As shown in FIG. 17, the patterns of the source wiring 7L and the source terminal 9 and the pattern of the transparent oxide film 6 therebelow can be formed by the two etchings described above.

As shown in FIG. 17, each of the end edge portions of the source wiring 7L, the source terminal 9, and the transparent oxide film 6 therebelow is etched so as to be located inside the end edge portion of the resist pattern PR5.

Figure 18:
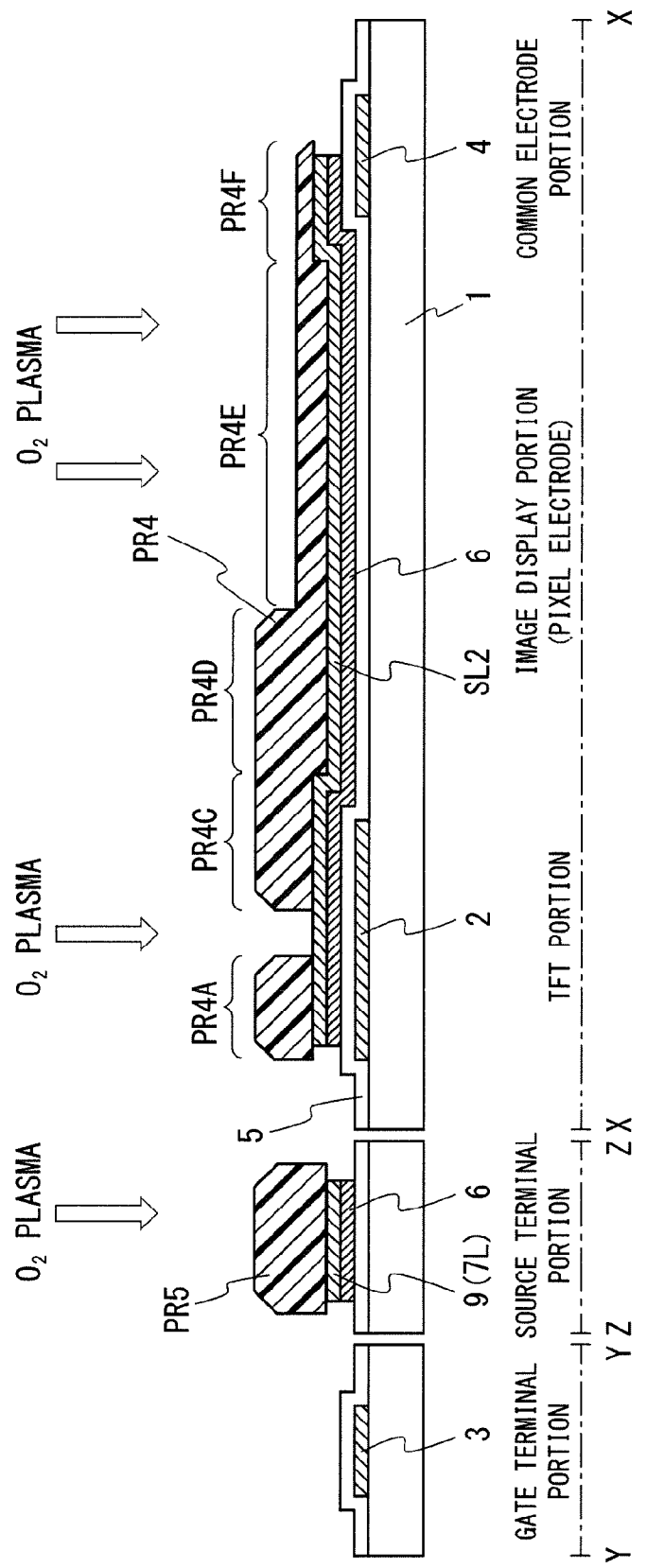

Next, the resist patterns PR4 and PR5 are subjected to first ashing with $O_2$ gas plasma used on the whole transparent insulating substrate 1 to completely remove the second portion PR4B having the thinnest film thickness and to reduce the film thicknesses of the other portions of the resist pattern PR4 and the film thickness of the resist pattern PR5, as shown in FIG. 18.

Figure 19:
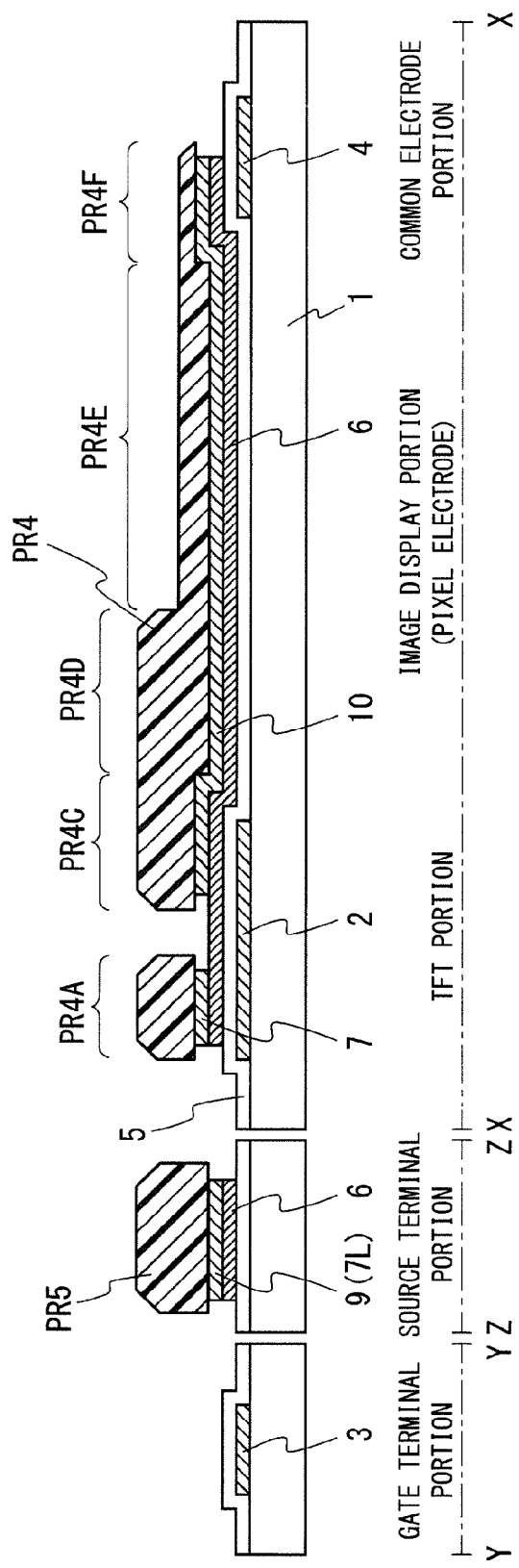

Subsequently, only the second conductive film SL2 is selectively etched with the alkaline system chemical solution of TMAH with the remaining resist pattern PR4 (PR4A, PR4C, PR4D, PR4E, PR4F) and resist pattern PR5 serving as an etching mask, the resist patterns PR4 and PR5 being thinned by the ashing. Thus, as shown in FIG. 19, the source electrode 7 and the drain electrode 10 are patterned, and a portion of the second conductive film SL2 that is not covered with the resist patterns is etched, exposing the surface of the transparent oxide film 6 being the lower layer. In addition, this etching causes each of the end edge portions of the source electrode 7, the source wiring 7L, and the drain electrode 10 to be located inside the end edge portion of the resist pattern PR4.

Figure 20:
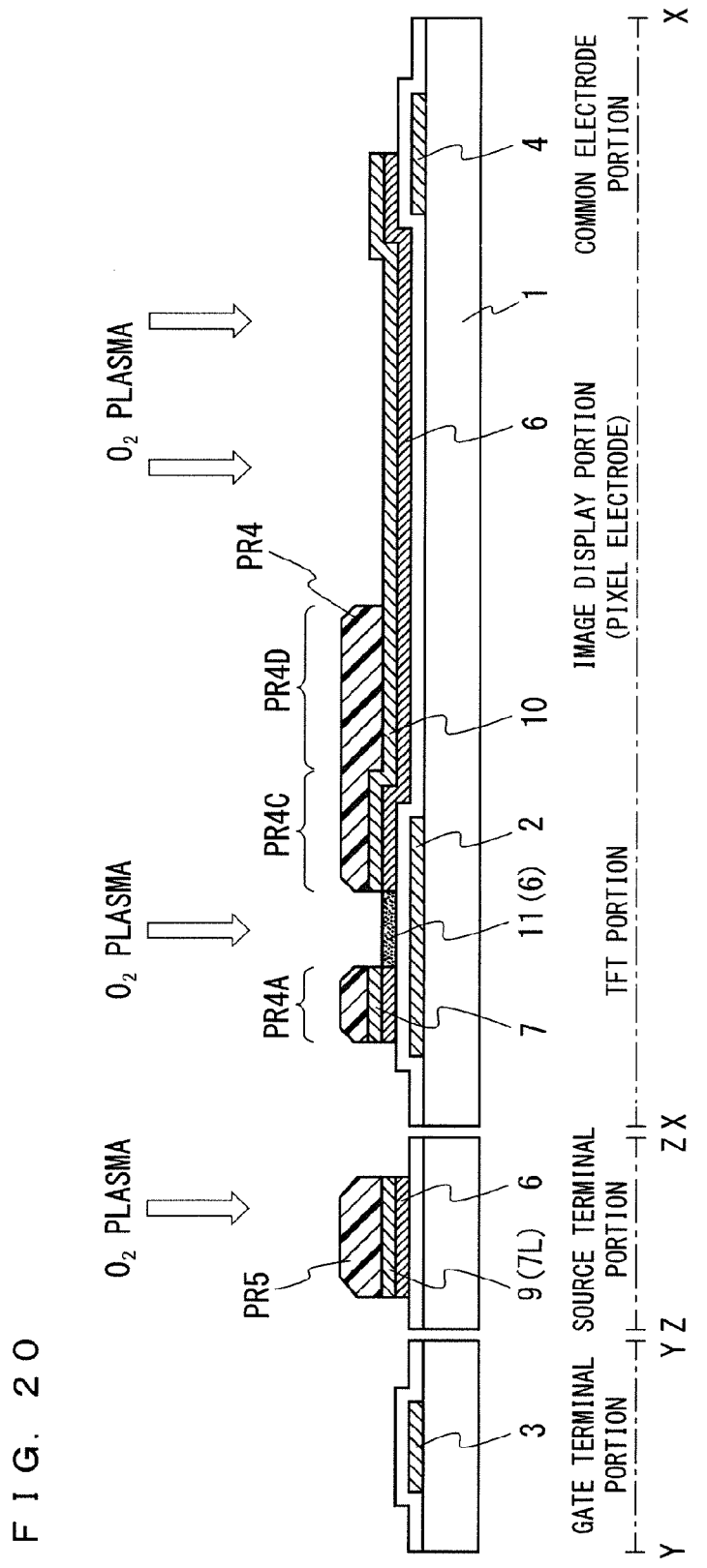

Next, the resist patterns PR4 and PR5 are subjected to second ashing with the $O_2$ gas plasma used on the whole transparent insulating substrate 1 to completely remove the fifth portion PR4E and the sixth portion PR4F having the thin film thicknesses and to further reduce the film thicknesses of the other portions of the resist pattern PR4 and the film thickness of the resist pattern PR5, as shown in FIG. 20.

At this time, in the transparent oxide film 6 corresponding to the lower layer in the region between the source electrode 7 and the drain electrode 10, an oxidation reaction by the ashing with the $O_2$ gas plasma proceeds and the resistance is thus increased to form the channel region 11 of the TFT element A as shown in FIG. 20, and the resistance increased by the oxidation can also cause improvement in the resistance to the etching chemical solution. Then, after the ashing with the $O_2$ gas plasma, a plasma treatment may be further performed with nitrous oxide ($N_2O$) gas. The $N_2O$ gas plasma can more efficiently cause the increase in the resistance of the transparent oxide film 6 corresponding to the lower layer in the region between the source electrode 7 and the drain electrode 10.

Subsequently, the second conductive film SL2 is patterned again with the remaining resist pattern PR5, first portion PR4A, third portion PR4C, and fourth portion PR4D serving as an etching mask, the resist pattern PR5, the first portion PR4A, the third portion PR4C, and the fourth portion PR4D being thinned by the second ashing.

Figure 21:
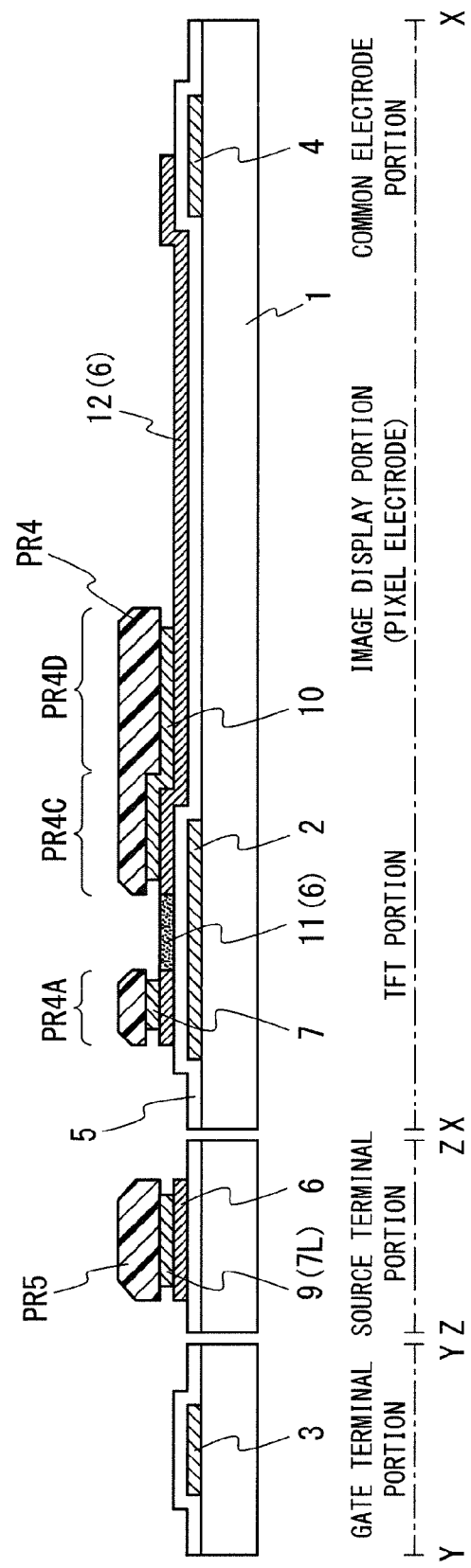

Thus, as shown in FIG. 21, each of the end edge portions of the source electrode 7, the source wiring 7L, the source terminal 9, and the drain electrode 10 is further located inside the end edge portions of the resist pattern PR5, the first portion PR4A, the third portion PR4C, and the fourth portion PR4D.

Subsequently, the resist pattern PR5, the first portion PR4A, the third portion PR4C, and the fourth portion PR4D are stripped and removed with the resist stripping solution of amine system, and thus the cross-sectional configuration shown in FIG. 14 is obtained.

In addition, the channel region 11 of the TFT element A and the pixel electrode 12 made of the transparent oxide film 6 are formed in the same layer, but upon the second ashing described with reference to FIG. 20, the pixel electrode 12 has the upper portion covered with the second conductive film SL2, so that the pixel electrode 12 is not oxidized and functions as a transparent pixel electrode 12 while maintaining the conductivity in the early stage.

As described above, the TFT substrate 200 (active matrix substrate of TN mode) in the second preferred embodiment shown in FIGS. 11 and 12 can be formed with great productivity in the three photolithography processes, which is one less photolithography process than the manufacturing method in the first preferred embodiment, so that the productivity can be more improved.

When a liquid crystal display panel is assembled, an alignment film or spacers are formed on the surface of the finished TFT substrate 200. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the TN mode.

The TFT-LCD finished in this manner includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

The transparent oxide film 6 is also disposed in the lower portion of the source wiring 7L that substantially has a laminated structure, so that the source wiring 7L is a so-called redundant wiring capable of greatly reducing a break in the source wiring 7L.

Third Preferred Embodiment

Configuration of Pixel of TFT Substrate

Figure 22:
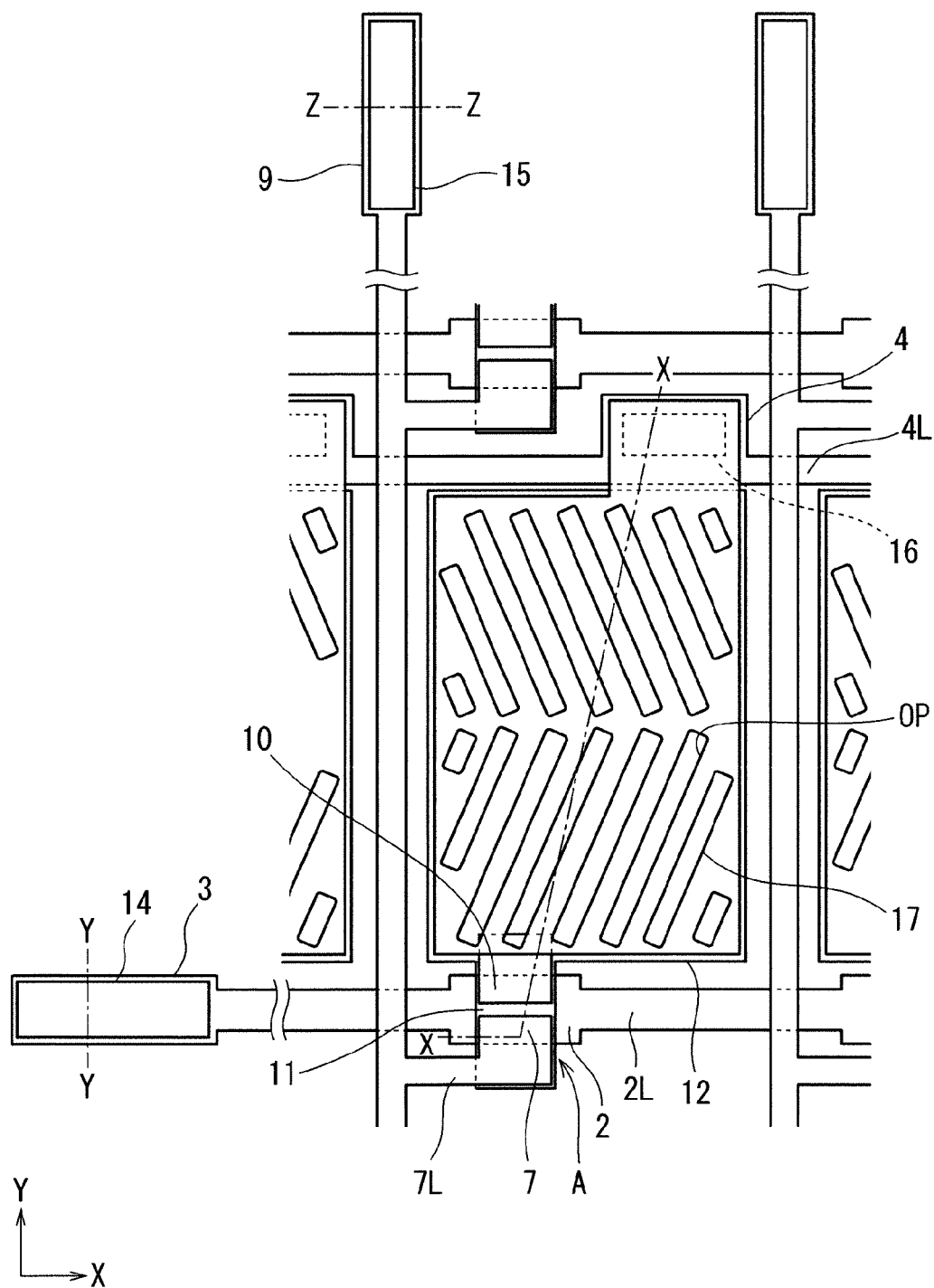
FIG. 22 is a plan view showing a configuration of a TFT substrate in a third preferred embodiment an a seventh preferred embodiment according to the present invention.
Figure 23:
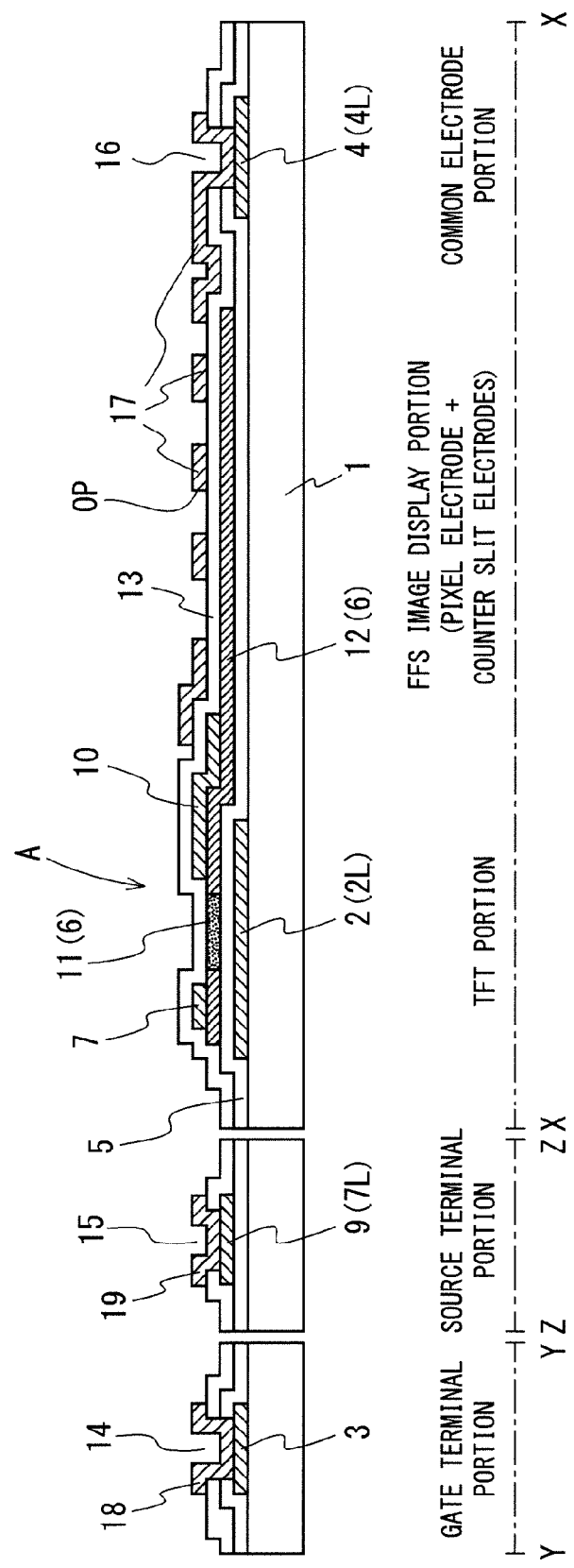
FIG. 23 is a cross-sectional view showing the configuration of the TFT substrate in the third preferred embodiment according to the present invention.

First, with reference to FIGS. 22 and 23, a configuration of a TFT substrate 300 in a third preferred embodiment is described. FIG. 22 is a plan view showing a configuration of a pixel of the TFT substrate 300 according to the third preferred embodiment. FIG. 23 is a cross-sectional view showing a cross-sectional configuration taken along an X-X line in FIG. 22, a cross-sectional configuration taken along a Y-Y line in FIG. 22, and a cross-sectional configuration taken along a Z-Z line in FIG. 22. In addition, it is described hereinafter that the TFT substrate 300 is used in a transmissive liquid crystal display of an FFS mode.

The cross-sectional configuration taken along the X-X line in FIG. 22 corresponds to a region (pixel portion) in which the pixel is formed and includes cross-sectional configurations of a "TFT portion" being a region in which a TFT is formed, an "FFS image display portion" being a region in which a pixel electrode 12 and counter slit electrodes 17 are formed, and a "common electrode portion."

The cross-sectional configuration taken along the Y-Y line in FIG. 22 includes a cross-sectional configuration of a "gate terminal portion" being a region in which a gate terminal 3 for supplying a gate signal to a gate wiring 2L is formed. The cross-sectional configuration taken along the Z-Z line in FIG. 22 includes a cross-sectional configuration of a "source terminal portion" being a region in which a source terminal 9 for applying a display signal to a source wiring 7L is formed. In addition, the gate terminal 3 is disposed at an end of the gate wiring 2L, and the source terminal 9 is disposed at an end of the source wiring 7L.

As shown in FIG. 22, the TFT substrate 300 includes a plurality of gate wirings 2L (scanning signal lines) and a plurality of source wirings 7L (display signal lines) disposed to go straight to cross each other, and a TFT element A is disposed close to an intersection point of both of the wirings. A gate electrode 2 of the TFT element A is connected to the gate wiring 2L, and a source electrode 7 of the TFT element A is connected to the source wiring 7L.

In other words, in the TFT element A, part of the gate wiring 2L as the gate electrode 2 is disposed below a region (TFT portion) in which the TFT element A is formed, and the source electrode 7 branches off from the source wiring 7L to extend to the region in which the TFT element A is formed.

A region surrounded by the adjacent gate wirings 2L and the adjacent source wirings 7L is one of pixel regions, and thus the TFT substrate 300 has the configuration in which the pixel regions are arranged in matrix.

In FIG. 22, the gate wirings 2L are disposed to extend in a horizontal direction (X direction), and the source wirings 7L are disposed to extend in a vertical direction (Y direction).

As shown in FIG. 22, the counter slit electrodes 17 are disposed on the pixel electrode 12 so as to almost entirely cover the pixel electrode 12. A common electrode (auxiliary capacitance electrode) 4 is disposed on a side opposite to the TFT element A of the pixel electrode 12, and the common electrode 4 is connected to the other common electrode 4 disposed for the adjacent pixel with a common wiring 4L. The common electrode 4 is connected to the counter slit electrodes 17 through a common-electrode-portion contact hole 16.

As shown in FIG. 23, the TFT substrate 300 includes the gate electrode 2 of the TFT element A, the gate wiring 2L, the gate terminal 3, the common electrode 4, and the common wiring 4L formed on a transparent insulating substrate 1 made of, for example, a glass, and a gate insulating film 5 (first insulating film) is formed to cover them. The gate insulating film 5 is omitted in FIG. 22.

A transparent oxide film 6 forming the pixel electrode 12 and the source terminal 9 are formed on the gate insulating film 5. The source electrode 7 and a drain electrode 10 are formed on the transparent oxide film 6 of the TFT portion. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

In the FFS image display portion, the counter slit electrodes 17 are formed on the pixel electrode 12. In this preferred embodiment, the pixel electrode 12 is a flat-shaped conductive electrode formed of the transparent oxide film 6 and is formed independently in each pixel.

Furthermore, the common electrode 4 and the common wiring 4L are formed in the common electrode portion, and the common electrode 4 and the common wiring 4L are formed to be a film of the same layer as the gate electrode 2 and the gate terminal 3.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, the source wiring 7L, the source terminal 9, the drain electrode 10, the channel region 11 of the TFT element A, and the pixel electrode 12. The protective insulating film 13 is omitted in FIG. 22.

A gate-terminal-portion contact hole 14, a source-terminal-portion contact hole 15, and a common-electrode-portion contact hole 16 are formed in the protective insulating film 13.

The gate-terminal-portion contact hole 14 is formed to penetrate the protective insulating film 13 and the gate insulating film 5 and reach the gate terminal 3. The source-terminal-portion contact hole 15 is formed to penetrate the protective insulating film 13 and reach the source terminal 9. The common-electrode-portion contact hole 16 is formed to penetrate the protective insulating film 13 and the gate insulating film 5 and reach the common electrode 4.

A gate terminal pad 18 electrically connected to the gate terminal 3 through the gate-terminal-portion contact hole 14, a source terminal pad 19 electrically connected to the source terminal 9 through the source-terminal-portion contact hole 15, and the counter slit electrodes 17 opposite to the pixel electrode 12 are formed on the protective insulating film 13.

The counter slit electrodes 17 have a plurality of openings OP formed in a grid pattern or a slit pattern. The counter slit electrodes 17 are electrically connected to the common electrode 4 being the lower layer through the common-electrode-portion contact hole 16. Thus, the counter slit electrodes 17 are supplied with a fixed potential signal, and an active matrix substrate of a fringe field switching (FFS) mode capable of laterally driving liquid crystals by a lateral electric field depending on a combination of the pixel electrode 12 and the counter slit electrodes 17 can be obtained. The counter slit electrodes 17, the gate terminal pad 18, and the source terminal pad 19 are made of a light-transmissive (transparent) conductive oxide film.

<Manufacturing Method>

Hereinafter, a method for manufacturing the TFT substrate 300 in the third preferred embodiment is described with reference to FIGS. 24 to 27. The plan view and the cross-sectional view in the final step correspond to FIGS. 22 and 23, respectively. In FIGS. 24 to 27, the same components as those shown in FIGS. 22 and 23 are denoted by the same references.

First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. Herein, the Al—3 mol % Ni film having a thickness of 200 nm is formed to form the first conductive film. A method for manufacturing the Al—3 mol % Ni film is described as in the first preferred embodiment.

Figure 24:
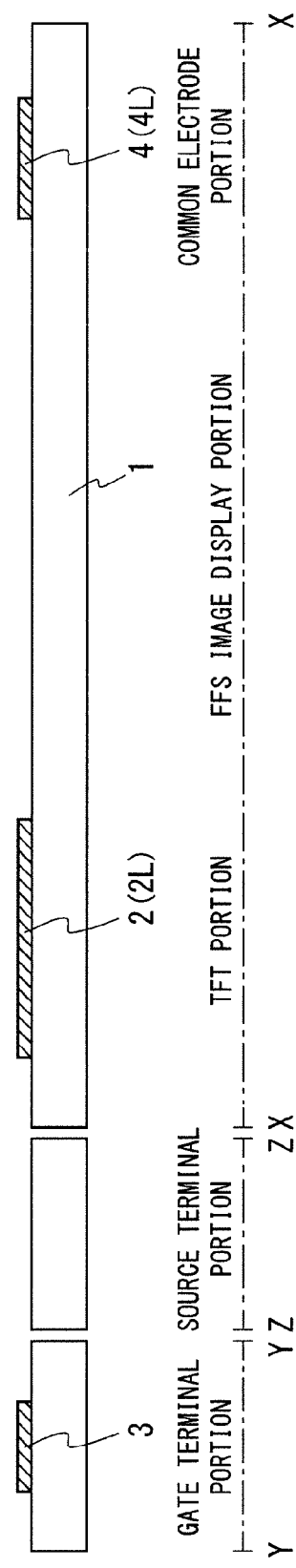
FIGS. 24 to 27 are cross-sectional views showing a method for manufacturing the TFT substrate in the third preferred embodiment according to the present invention.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 24.

In this preferred embodiment, the first conductive film (Al—3 mol % Ni film) is etched with a chemical solution of PAN system, and subsequently, the resist pattern is stripped and removed with a resist stripping solution of amine system.

Figure 25:
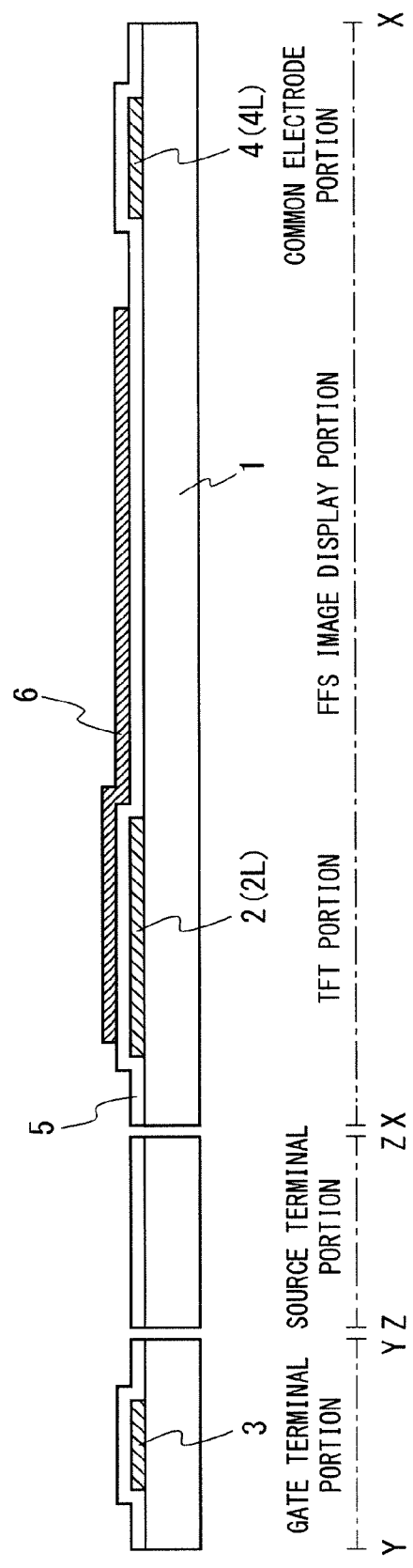

Next, in the step shown in FIG. 25, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 $\Omega$m or less (minimum specific resistance value is approximately $1\times10^{-6}$ $\Omega$m in terms of characteristics of the materials for the film of the InGaZnO system). A method for causing the deficiency state of oxygen is as described above.

Subsequently, a photoresist applied and formed on the transparent film is patterned in a second photolithography process to form a resist pattern, and the transparent oxide film 6 is patterned with the resist pattern serving as an etching mask, to thereby selectively form the transparent oxide film 6 on the gate insulating film 5, as shown in FIG. 25.

In this preferred embodiment, the transparent oxide film 6 is etched with a chemical solution of oxalic acid system, and subsequently, the resist pattern is stripped and removed with the resist stripping solution of amine system.

Next, a second conductive film as a material for the source electrode 7, the source wiring 7L, the source terminal 9, and the drain electrode 10 is formed on the transparent insulating substrate 1. In this preferred embodiment, the alloy film of aluminum (Al) system being a metal, and more specifically, the alloy film (Al—3 mol % Ni film) in which Ni of 3 mol % is added to Al is used as the second conductive film. In addition, a method for forming the Al—3 mol % Ni film is described as in the first preferred embodiment.

Figure 26:
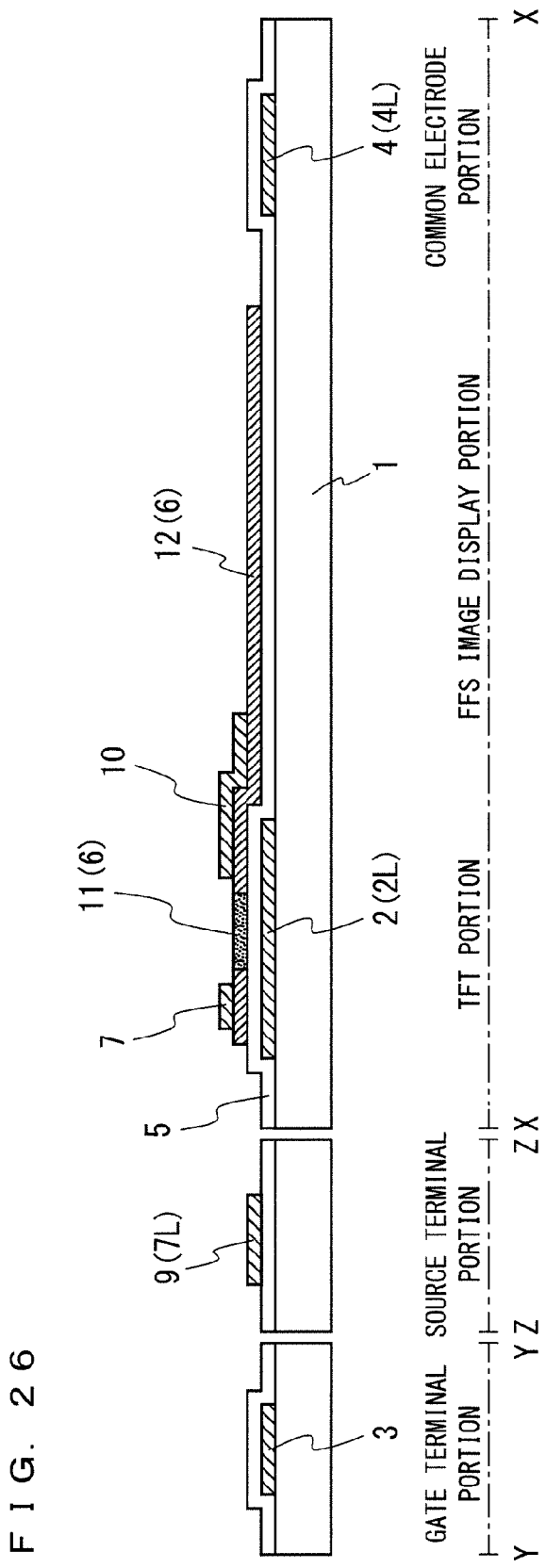

Subsequently, a photoresist applied and formed on the second conductive film is patterned in a third photolithography process to form a resist pattern, and the second conductive film is patterned with the resist pattern serving as an etching mask, to thereby form the source electrode 7, the source wiring 7L, the source terminal 9, and the drain electrode 10, as shown in FIG. 26.

In this preferred embodiment, the second conductive film (Al—3 mol % Ni film) is etched with an alkaline system chemical solution of TMAH including TMAH, and subsequently, the resist pattern is stripped and removed with the resist stripping solution of amine system.

When the well-known chemical solution of PAN system typically used as an etching chemical solution for an Al system alloy film is used, the transparent oxide film 6 being the lower layer is also etched at the same time, resulting in difficulty in etching only the second conductive film. However, only the second conductive film can be selectively etched without etching the transparent oxide film 6 being the lower layer by using the alkaline system chemical solution.

In addition, this step includes the step of oxidizing the transparent oxide film 6 corresponding to the lower layer in the region between the source electrode 7 and the drain electrode 10 and reducing the deficiency of oxygen to increase an electrical resistance, to thereby form a semiconductor that serves as the channel region 11 of the TFT element A.

Specifically, the resistance is increased such that the semiconductor region has the specific resistance value of more than 0.1 $\Omega$m and less than $1\times10^6$ $\Omega$m. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 being the lower portion of the source electrode 7 and the drain electrode 10 also maintains conductivity as a conductive region without the oxidation.

The technology of the halftone exposure of a photoresist described in the first preferred embodiment with reference to FIGS. 6 to 10 is applicable as it is in principle to the step described with reference to FIG. 26, and the descriptions are omitted.

Next, a second insulating film as a material for the protective insulating film 13 is formed on the entire surface of the transparent insulating substrate 1. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Figure 27:
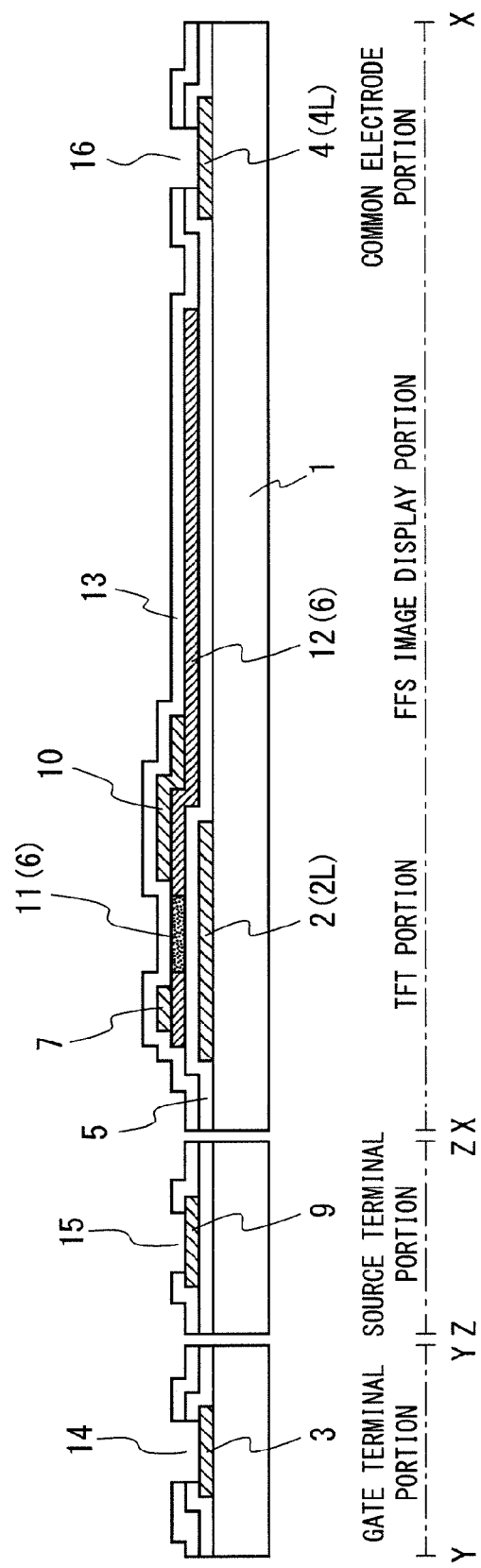

Subsequently, a photoresist applied and formed on the second insulating film is patterned in a fourth photolithography process to form a resist pattern, and the gate-terminal-portion contact hole 14, the source-terminal-portion contact hole 15, and the common-electrode-portion contact hole 16 are formed with the resist mask serving as an etching mask. The gate-terminal-portion contact hole 14 and the common-electrode-portion contact hole 16 penetrate the protective insulating film 13 and the gate insulating film 5 and reach the gate terminal 3 and the common electrode 4, respectively. The source-terminal-portion contact hole 15 penetrates the protective insulating film 13 and reaches the source terminal 9. Thus, the cross-sectional structure shown in FIG. 27 is obtained.

In this preferred embodiment, the protective insulating film 13 and the gate insulating film 5 are etched by a dry etching technique using sulfur hexafluoride ($SF_6$) gas and $O_2$ gas, and subsequently, the resist pattern is stripped and removed with the resist stripping solution of amine system.

Next, a third conductive film as a material for the counter slit electrodes 17, the gate terminal pad 18, and the source terminal pad 19 is formed on the entire surface of the transparent insulating substrate 1. In this preferred embodiment, as the third conductive film, an indium zinc oxide (InZnO) film being a conductive oxide film having light-transmissive properties is formed to have a thickness of 100 nm. A conductive oxide film having the light-transmissive properties, such as an indium tin oxide (ITO) film and a zinc oxide (ZnO) film, may be used, except for the InZnO film.

The InZnO film being the conductive oxide film may be formed by a DC sputtering technique using InZnO target composed of indium oxide $In_2O_3$ and ZnO in proportions of 9:1. Argon (Ar) gas, krypton (Kr) gas, or the like may be used as sputtering gas. The InZnO film formed by the sputtering technique normally has the atomic composition ratio of oxygen less than stoichiometric composition, thereby forming an oxide film in a state of poor light-transmissive properties (low light transmittance). Thus, a mixed gas in which oxygen (O) is added to the Ar gas or the Kr gas upon sputtering is preferably used. The InZnO film immediately after being formed exhibits high transmittance properties of 80% or more to a visible region with wavelengths of 400 to 800 nm. The InZnO film also has a low specific resistance value of $2 \times 10^{-6}$ Ωm, exhibiting a sufficient conductivity.

Subsequently, a photoresist applied and formed on a third conductive film (conductive oxide film) is patterned in a fifth photolithography process to form a resist pattern, and the conductive oxide film is patterned with the resist pattern serving as an etching mask. In this preferred embodiment, the conductive oxide film (InZnO film) is etched with the chemical solution of oxalic acid system.

Then, the resist pattern is stripped and removed with the resist stripping solution of amine system, and the counter slit electrodes 17 having openings OP in the slit pattern, the gate terminal pad 18, and the source terminal pad 19 are formed. The counter slit electrodes 17 are electrically connected to the common electrode 4 through the common-electrode-portion contact hole 16. The gate terminal pad 18 is electrically connected to the gate terminal 3 through the gate-terminal-portion contact hole 14. The source terminal pad 19 is electrically connected to the source terminal 9 through the source-terminal-portion contact hole 15. Thus, the cross-sectional configuration shown in FIG. 23 is obtained.

As described above, the TFT substrate 300 (active matrix substrate of FFS mode) in the third preferred embodiment shown in FIGS. 22 and 23 can be formed with great productivity in the five photolithography processes.

When a liquid crystal display panel is assembled, an alignment film or spacers are formed on the surface of the finished TFT substrate 300. The alignment film is a film for aligning liquid crystals and is made of polyimide or the like. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the FFS mode.

The TFT-LCD finished in this manner has a wide viewing angle because of the FFS mode laterally driving liquid crystals by fringe field switching and includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

Fourth Preferred Embodiment

Configuration of Pixel of TFT Substrate

Figure 28:
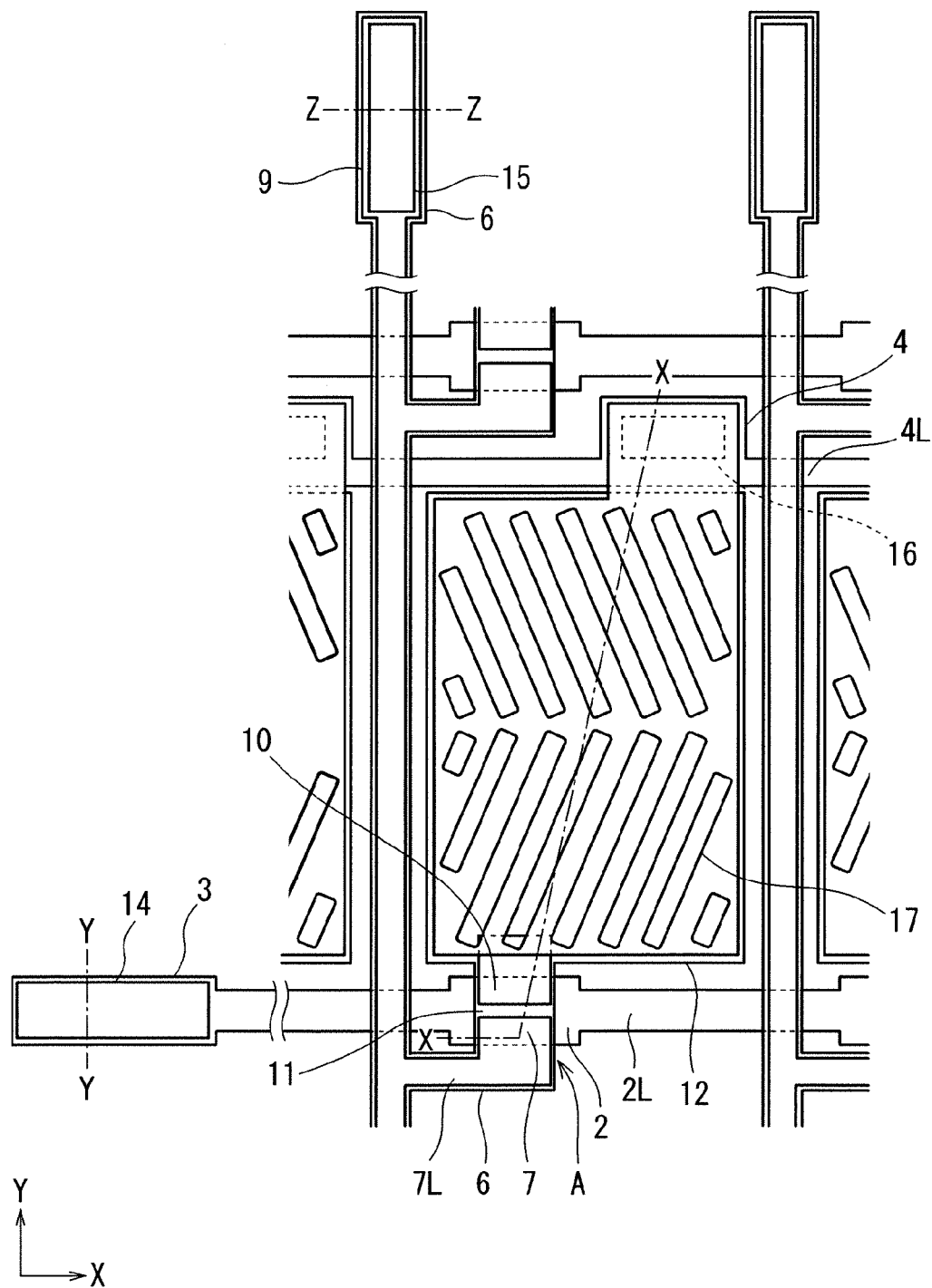
FIG. 28 is a plan view showing a configuration of a TFT substrate in a fourth preferred embodiment and an eighth preferred embodiment according to the present invention.
Figure 29:
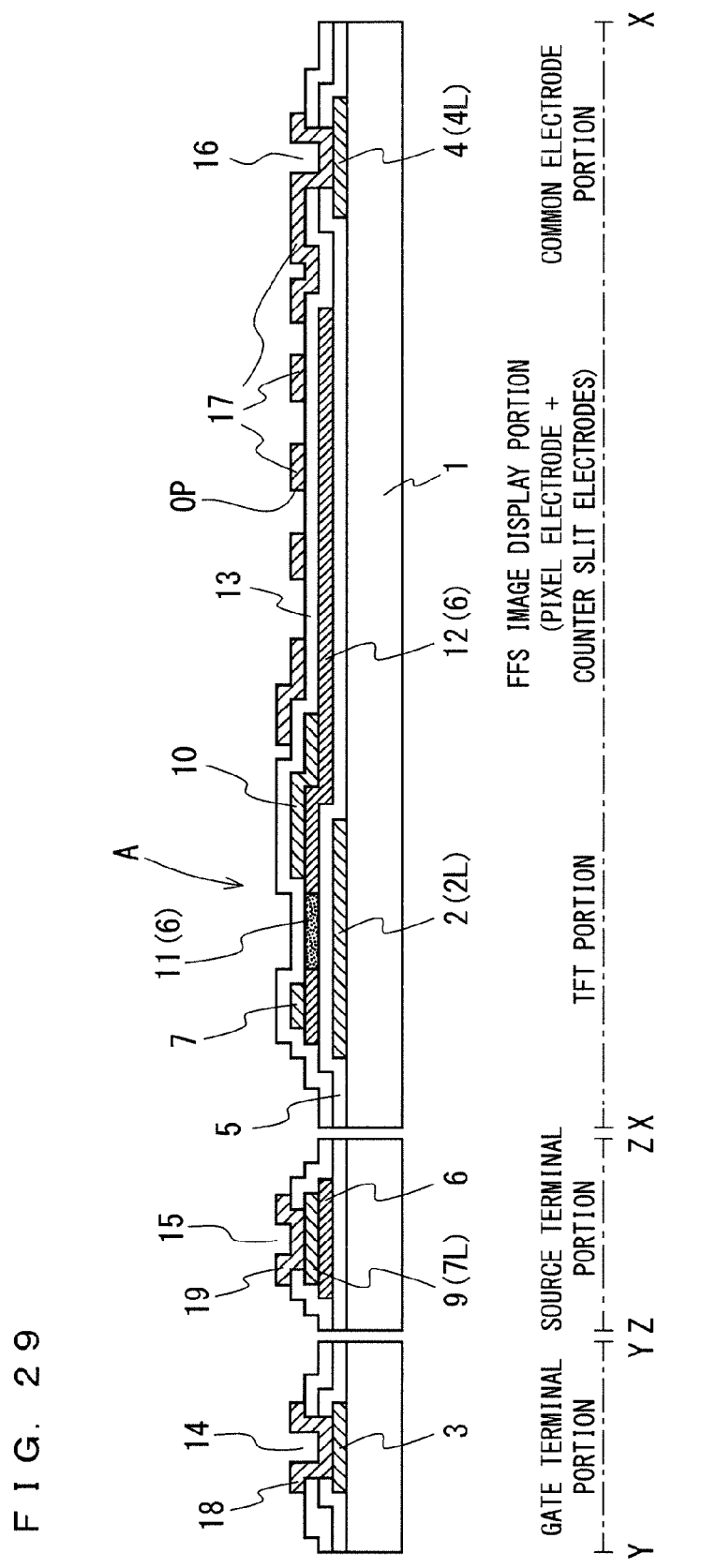
FIG. 29 is a cross-sectional view showing the configuration of the TFT substrate in the fourth preferred embodiment according to the present invention.

First, with reference to FIGS. 28 and 29, a configuration of a TFT substrate 400 in a fourth preferred embodiment is described. FIG. 28 is a plan view showing a configuration of a pixel of the TFT substrate 400 according to the fourth preferred embodiment. FIG. 29 is a cross-sectional view showing a cross-sectional configuration taken along an X-X line in FIG. 28, a cross-sectional configuration taken along a Y-Y line in FIG. 28, and a cross-sectional configuration taken along a Z-Z line in FIG. 28. In addition, it is described hereinafter that the TFT substrate 400 is used in a transmissive liquid crystal display of an FFS mode.

The cross-sectional configuration taken along the X-X line in FIG. 28 corresponds to a region (pixel portion) in which the pixel is formed and includes cross-sectional configurations of a "TFT portion" being a region in which a TFT is formed, an "FFS image display portion" being a region in which a pixel electrode 12 and counter slit electrodes 17 are formed, and a "common electrode portion."

The cross-sectional configuration taken along the Y-Y line in FIG. 28 includes a cross-sectional configuration of a "gate terminal portion" being a region in which a gate terminal 3 for supplying a gate signal to a gate wiring 2L is formed. The cross-sectional configuration taken along the Z-Z line in FIG. 28 includes a cross-sectional configuration of a "source terminal portion" being a region in which a source terminal 9 for applying a display signal to a source wiring 7L is formed. In addition, the gate terminal 3 is disposed at an end of the gate wiring 2L, and the source terminal 9 is disposed at an end of the source wiring 7L.

The TFT substrate 400 is different from the TFT substrate 300 in the third preferred embodiment. The TFT substrate 400 includes a transparent oxide film 6 also in a lower portion of the source wiring 7L and the source terminal 9, and the source wiring 7L and the source terminal 9 substantially have a laminated structure. The TFT substrate 400 is the same as the TFT substrate 300 in a plan view except for that the transparent oxide film 6 is disposed below the source wiring 7L and the source terminal 9, so that redundant descriptions are omitted.

As shown in FIG. 29, the TFT substrate 400 includes the gate electrode 2 of the TFT element A, the gate wiring 2L, the gate terminal 3, the common electrode 4, and the common wiring 4L formed on a transparent insulating substrate 1 made of, for example, a glass, and a gate insulating film 5 (first insulating film) is formed to cover them. The gate insulating film 5 is omitted in FIG. 28.

The transparent oxide film 6 forming the pixel electrode 12 is formed on the gate insulating film 5, and the transparent oxide film 6 is also formed in a position corresponding to the lower portion of the source wiring 7L and the source terminal 9 on the gate insulating film 5. The source electrode 7 and the drain electrode 10 are formed on the transparent oxide film 6 of the TFT portion. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

In the FFS image display portion, the counter slit electrodes 17 are formed on the pixel electrode 12. In this preferred embodiment, the pixel electrode 12 is a flat-shaped conductive electrode formed of the transparent oxide film and is formed independently in each pixel.

Furthermore, the common electrode 4 and the common wiring 4L are formed in the common electrode portion, and the common electrode 4 and the common wiring 4L are formed to be a film of the same layer as the gate electrode 2 and the gate terminal 3.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, the source wiring 7L, the source terminal 9, the drain electrode 10, the channel region 11 of the TFT element A, and the pixel electrode 12. The protective insulating film 13 is omitted in FIG. 28.

A gate-terminal-portion contact hole 14, a source-terminal-portion contact hole 15, and a common-electrode-portion contact hole 16 are formed in the protective insulating film 13.

The gate-terminal-portion contact hole 14 is formed to penetrate the protective insulating film 13 and the gate insulating film 5 and reach the gate terminal 3. The source-terminal-portion contact hole 15 is formed to penetrate the protective insulating film 13 and reach the source terminal 9. The common-electrode-portion contact hole 16 is formed to penetrate the protective insulating film 13 and the gate insulating film 5 and reach the common electrode 4.

A gate terminal pad 18 electrically connected to the gate terminal 3 through the gate-terminal-portion contact hole 14, a source terminal pad 19 electrically connected to the source terminal 9 through the source-terminal-portion contact hole 15, and the counter slit electrodes 17 opposite to the pixel electrode 12 are formed on the protective insulating film 13.

The counter slit electrodes 17 have a plurality of openings OP formed in a grid pattern or a slit pattern. The counter slit electrodes 17 are electrically connected to the common electrode 4 being the lower layer through the common-electrode-portion contact hole 16. Thus, the counter slit electrodes 17 are supplied with a fixed potential signal, and an active matrix substrate of a FFS mode capable of laterally driving liquid crystals by a lateral electric field depending on a combination of the pixel electrode 12 and the counter slit electrodes 17 can be obtained. The counter slit electrodes 17, the gate terminal pad 18, and the source terminal pad 19 are made of a light-transmissive (transparent) conductive oxide film.

<Manufacturing Method>

Figure 30:
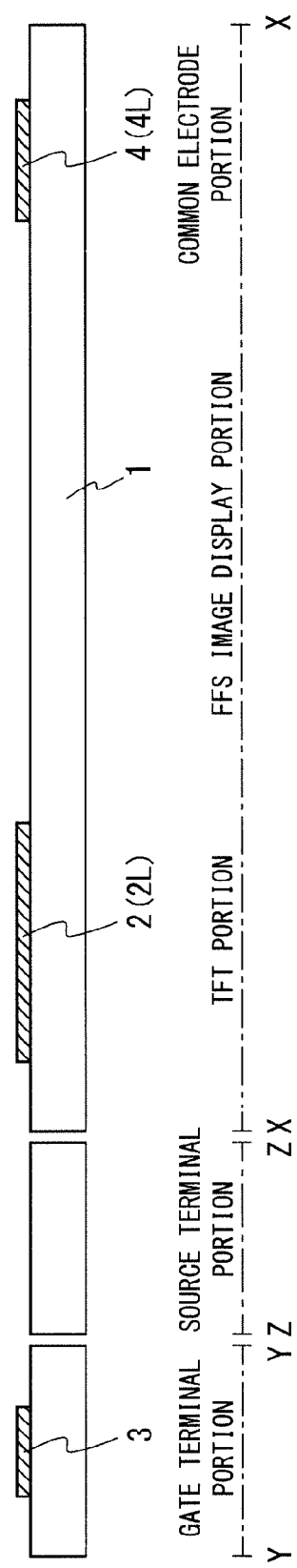
FIGS. 30 to 32 are cross-sectional views showing a method for manufacturing the TFT substrate in the fourth preferred embodiment according to the present invention.
Figure 31:
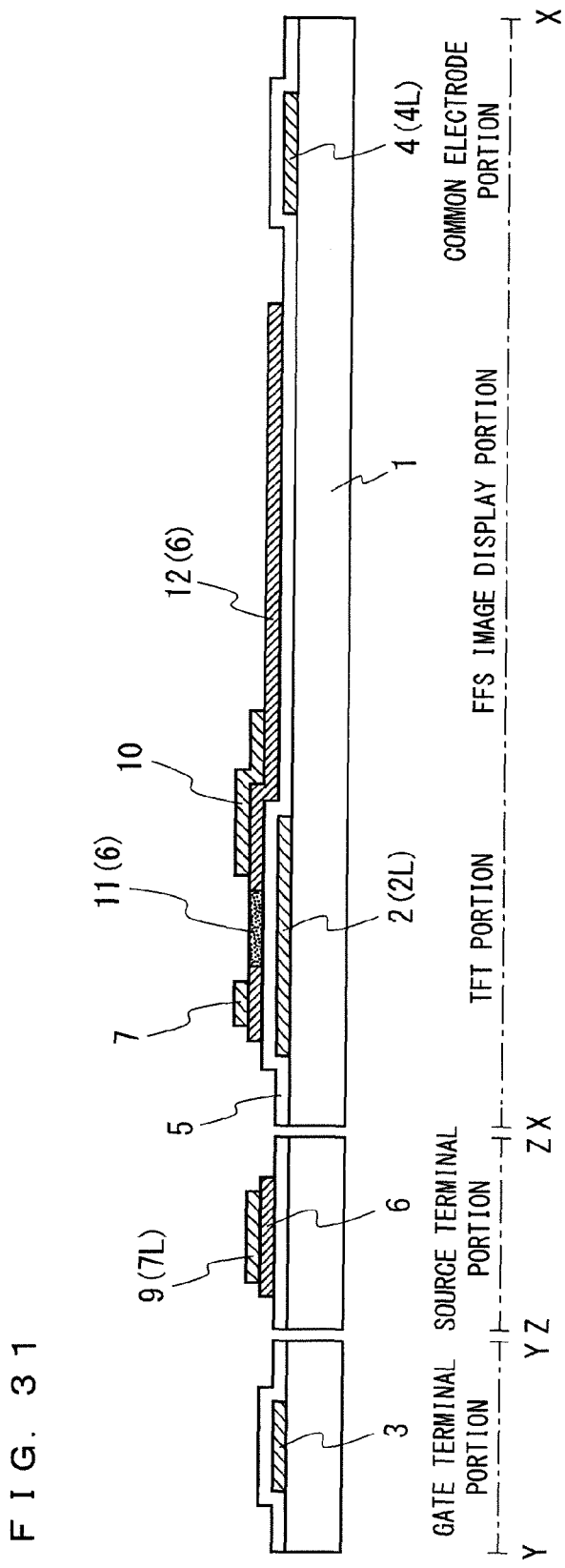
Figure 32:
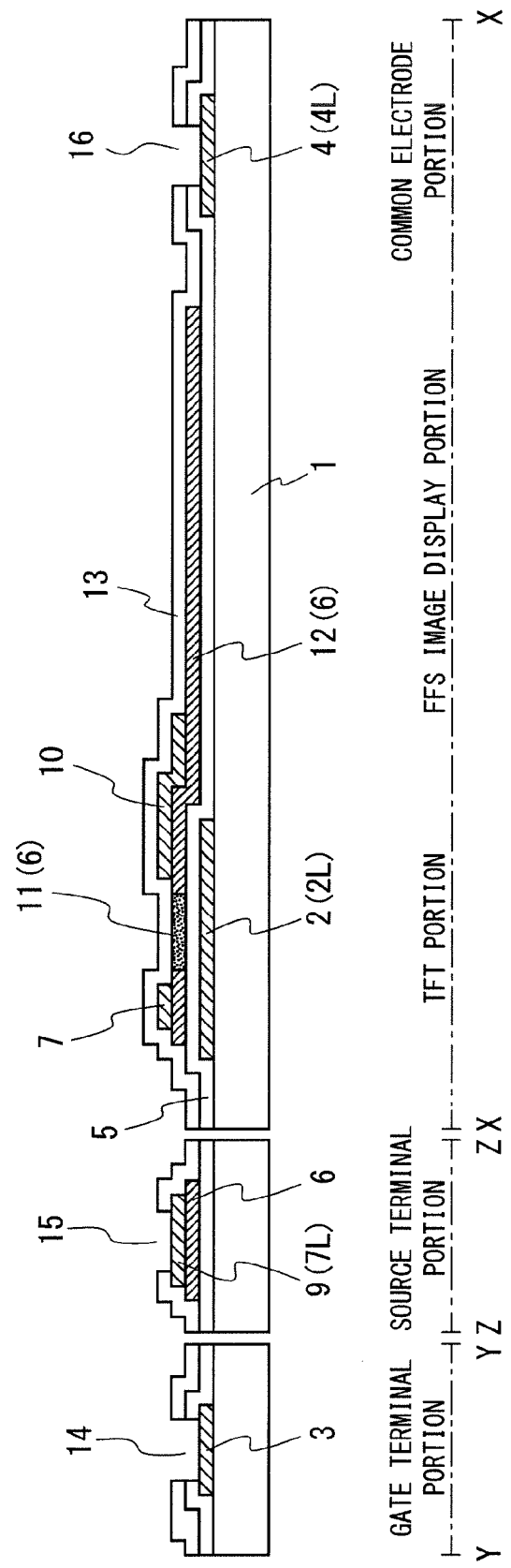

Hereinafter, a method for manufacturing the TFT substrate 400 in the fourth preferred embodiment is described with reference to FIGS. 30 to 32. The plan view and the cross-sectional view in the final step correspond to FIGS. 28 and 29, respectively. In FIGS. 30 to 32, the same components as those shown in FIGS. 28 and 29 are denoted by the same references.

First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. Herein, the Al—3 mol % Ni film having a thickness of 200 nm is formed to form the first conductive film. A method for manufacturing the Al—3 mol % Ni film is described as in the first preferred embodiment. Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 30.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 Ωm or less (minimum specific resistance value is approximately $1 \times 10^{-6}$ Ωm in terms of characteristics of the materials for the film of the InGaZnO system). A method for causing the deficiency state of oxygen is as described above.

Next, a second conductive film as a material for the source electrode 7, the source wiring 7L, the source terminal 9, and the drain electrode 10 is formed on the transparent insulating substrate 1 on which the transparent oxide film 6 is formed. In this preferred embodiment, the alloy film of aluminum (Al) system being a metal, and more specifically, the alloy film (Al—3 mol % Ni film) in which Ni of 3 mol % is added to Al is used as the second conductive film.

Subsequently, a photoresist applied and formed on the second conductive film is patterned in a second photolithography process to form a resist pattern, and the second conductive film and the transparent oxide film 6 are patterned with the resist pattern serving as an etching mask, to thereby form the source electrode 7, the source wiring 7L, the source terminal 9, and the drain electrode 10, as shown in FIG. 31. In this preferred embodiment, the transparent oxide film 6 is patterned to be left also in the lower portion of the source wiring 7L and the source terminal 9, so that the source wiring 7L and the source terminal 9 can substantially have the laminated structure.

In addition, this step includes the step of oxidizing the transparent oxide film 6 corresponding to the lower layer in the region between the source electrode 7 and the drain electrode 10 and reducing the deficiency of oxygen to increase an electrical resistance, to thereby form a semiconductor that serves as the channel region 11 of the TFT element A.

Specifically, the resistance is increased such that the semiconductor region has the specific resistance value of more than $0.1\ \Omega m$ and less than $1 \times 10^6\ \Omega m$. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 being the lower portion of the source electrode 7 and the drain electrode 10 also maintains conductivity as a conductive region without the oxidation.

The technology of the halftone exposure of a photoresist described in the second preferred embodiment with reference to FIGS. 15 to 21 is applicable as it is in principle to the steps described above, and the descriptions are omitted.

A second insulating film as a material for the protective insulating film 13 is formed on the entire surface of the transparent insulating substrate 1 that finished the steps up to FIG. 31. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a third photolithography process to form a resist pattern, and the gate-terminal-portion contact hole 14, the source-terminal-portion contact hole 15, and the common-electrode-portion contact hole 16 are formed with the resist mask serving as an etching mask. The gate-terminal-portion contact hole 14 and the common-electrode-portion contact hole 16 penetrate the protective insulating film 13 and the gate insulating film 5 and reach the gate terminal 3 and the common electrode 4, respectively. The source-terminal-portion contact hole 15 penetrates the protective insulating film 13 and reaches the source terminal 9. Thus, the cross-sectional structure shown in FIG. 32 is obtained.

In this preferred embodiment, the protective insulating film 13 and the gate insulating film 5 are etched by a dry etching technique using sulfur hexafluoride ($SF_6$) gas and $O_2$ gas, and subsequently, the resist pattern is stripped and removed with the resist stripping solution of amine system.

Next, a third conductive film as a material for the counter slit electrodes 17, the gate terminal pad 18, and the source terminal pad 19 is formed on the entire surface of the transparent insulating substrate 1. In this preferred embodiment, as the third conductive film, an indium zinc oxide (InZnO) film being a conductive oxide film having light-transmissive properties is formed to have a thickness of 100 nm. A conductive oxide film having light-transmissive properties, such as an indium tin oxide (ITO) film and a zinc oxide (ZnO) film, may be used, except for the InZnO film.

A method for manufacturing the InZnO film is described as in the third preferred embodiment, and its properties are also the same.

Subsequently, a photoresist applied and formed on a third conductive film (conductive oxide film) is patterned in a fourth photolithography process to form a resist pattern, and the conductive oxide film is patterned with the resist pattern serving as an etching mask. In this preferred embodiment, the conductive oxide film (InZnO film) is etched with the chemical solution of oxalic acid system.

Then, the resist pattern is stripped and removed with the resist stripping solution of amine system, and the counter slit electrodes 17 having openings OP in the slit pattern, the gate terminal pad 18, and the source terminal pad 19 are formed. The counter slit electrodes 17 are electrically connected to the common electrode 4 through the common-electrode-portion contact hole 16. The gate terminal pad 18 is electrically connected to the gate terminal 3 through the gate-terminal-portion contact hole 14. The source terminal pad 19 is electrically connected to the source terminal 9 through the source-terminal-portion contact hole 15. Thus, the cross-sectional configuration shown in FIG. 29 is obtained.

As described above, the TFT substrate 400 (active matrix substrate of FFS mode) in the fourth preferred embodiment shown in FIGS. 28 and 29 can be formed with great productivity in the four photolithography processes.

When a liquid crystal display panel is assembled, an alignment film or spacers are formed on the surface of the finished TFT substrate 400. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the FFS mode.

The TFT-LCD finished in this manner has a wide viewing angle because of the FFS mode laterally driving liquid crystals by fringe field switching and includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

The transparent oxide film 6 is also disposed in the lower portion of the source wiring 7L that substantially has a laminated structure, so that the source wiring 7L is a so-called redundant wiring capable of greatly reducing a break in the source wiring 7L.

Fifth Preferred Embodiment

Configuration of Pixel of TFT Substrate

Figure 33:
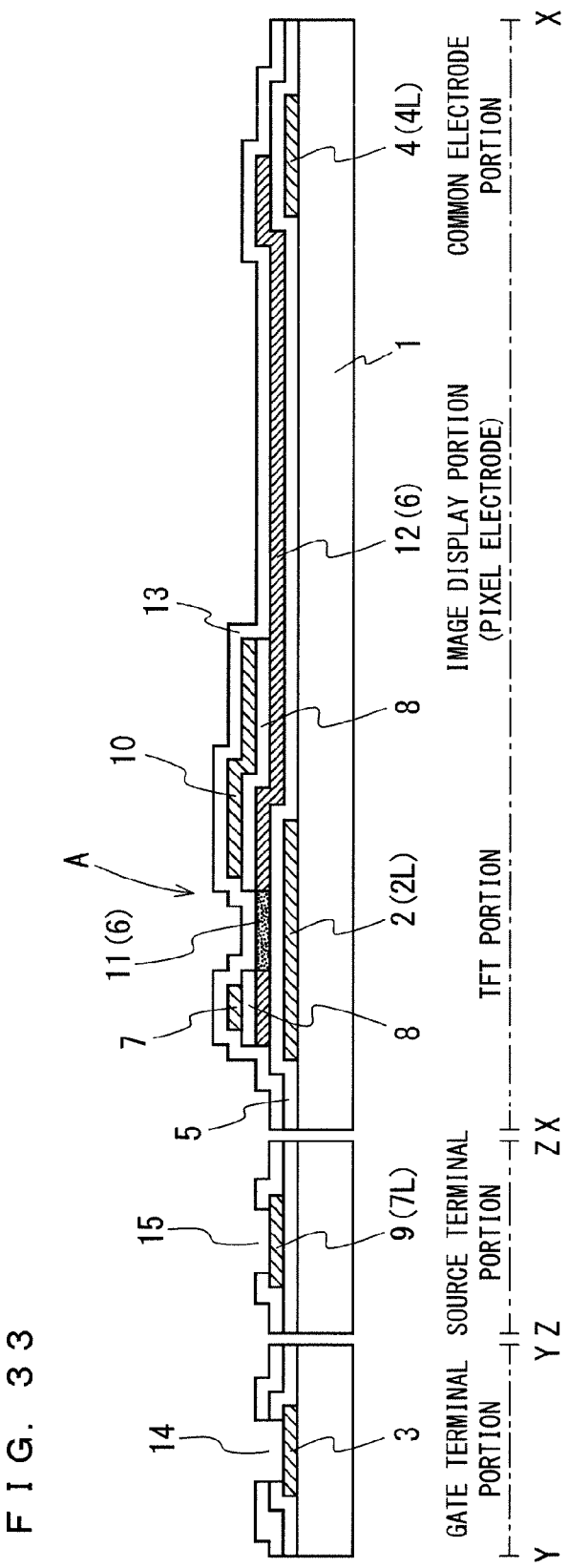
FIG. 33 is a cross-sectional view showing the configuration of the TFT substrate in the fifth preferred embodiment according to the present invention.

First, with reference to FIGS. 1 and 33, a configuration of a TFT substrate 500 in a fifth preferred embodiment is described. A plane configuration of a pixel of the TFT substrate 500 according to the fifth preferred embodiment is substantially the same as that of the TFT substrate 100 according to the first preferred embodiment, so that FIG. 1 is commonly used as the diagram showing the plane configuration of the TFT substrate 500, and redundant descriptions are omitted. FIG. 33 is a cross-sectional view showing a cross-sectional configuration taken along the X-X line in FIG. 1, a cross-sectional configuration taken along the Y-Y line in FIG. 1, and a cross-sectional configuration taken along the Z-Z line in FIG. 1. In addition, it is described hereinafter that the TFT substrate 500 is used in a transmissive liquid crystal display of a TN mode.

As shown in FIG. 33, the TFT substrate 500 according to the fifth preferred embodiment has a configuration that an n-type Si film 8 in which an n-type impurity is added to Si is disposed on the transparent oxide film 6 of the TFT substrate 100 according to the first preferred embodiment, and the source electrode 7 and the drain electrode 10 of the TFT substrate 100 are formed on the n-type Si film 8 such that the source electrode 7 and the drain electrode 10 are electrically connected to the transparent oxide film 6 through the n-type Si film 8.

As shown in FIG. 33, the TFT substrate 500 includes a gate electrode 2 of a TFT element A, a gate wiring 2L, a gate terminal 3, a common electrode 4, and a common wiring 4L formed on a transparent insulating substrate 1 made of, for example, a glass, and a gate insulating film 5 (first insulating film) is formed to cover them. The gate insulating film 5 is omitted in FIG. 1.

The transparent oxide film 6 forming a pixel electrode 12 and the source terminal 9 are formed on the gate insulating film 5. Then, on the transparent oxide film 6 of the TFT portion, the n-type Si film 8 containing the n-type impurity is formed in a region being a lower portion of the source electrode 7 and the drain electrode 10, and the source electrode 7 and the drain electrode 10 are formed on the n-type Si film 8. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

The pixel electrode 12 is formed to have the outer edge slightly smaller than a periphery of the common electrode 4, and part of the outer edge on the TFT element A side extends to cover the TFT element A. The source electrode 7 and the drain electrode 10 are disposed over the extending portion through the n-type Si film 8.

Then, a protective insulating film 13 (second insulating film) is formed on an entire surface of the transparent insulating substrate 1 to cover the gate electrode 2, the gate wiring 2L, the gate terminal 3, the common electrode 4, the n-type Si film 8, the source electrode 7, a source wiring 7L, the source terminal 9, the drain electrode 10, the channel region 11 of the TFT element A, and the pixel electrode 12. The protective insulating film 13 is omitted in FIG. 1.

A gate-terminal-portion contact hole 14 and a source-terminal-portion contact hole 15 are formed in the protective insulating film 13. The gate-terminal-portion contact hole 14 is formed to penetrate the protective insulating film 13 and the gate insulating film 5 and reach the gate terminal 3, and the source-terminal-portion contact hole 15 is formed to penetrate the protective insulating film 13 and reach the source terminal 9.

<Manufacturing Method>

Hereinafter, a method for manufacturing the TFT substrate 500 in the fifth preferred embodiment is described with reference to FIGS. 34 to 41. The plan view and the cross-sectional view in the final step correspond to FIGS. 1 and 33, respectively. In FIGS. 34 to 41, the same components as those shown in FIGS. 1 and 33 are denoted by the same references.

<Description of the Whole Method>

The whole manufacturing method is described with reference to FIGS. 34 to 36. First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. A method for forming the Al—3 mol % Ni film is described as in the first preferred embodiment.

Figure 34:
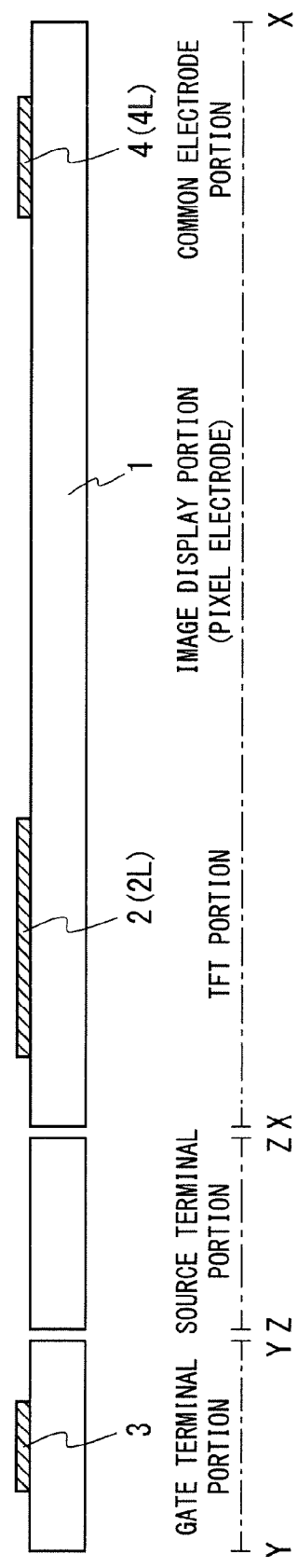
FIGS. 34 to 41 are cross-sectional views showing a method for manufacturing the TFT substrate in the fifth preferred embodiment according to the present invention.
Figure 35:
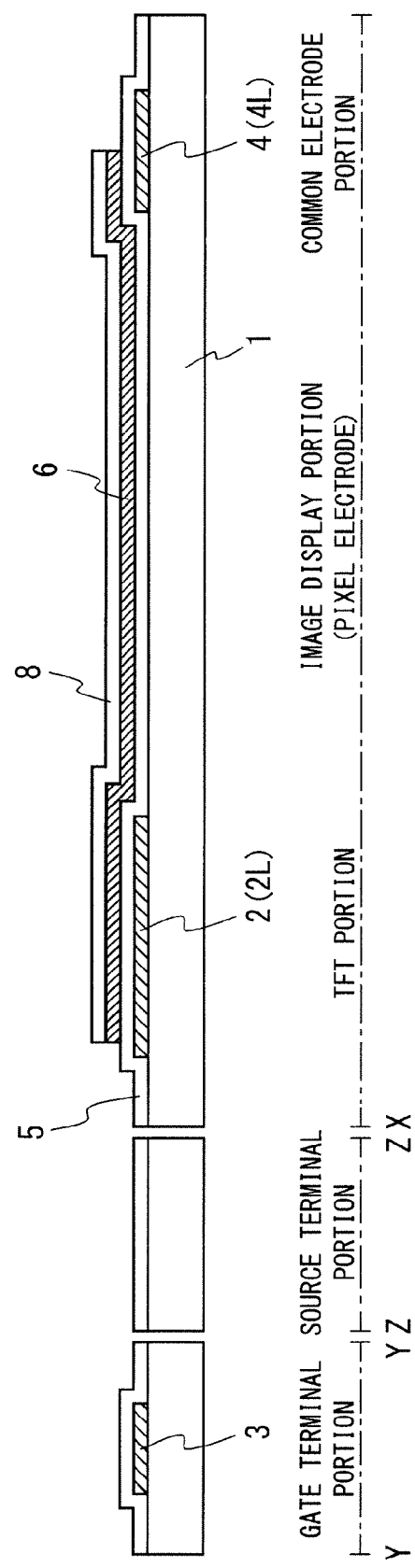

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 34.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 Ωm or less (minimum specific resistance value is approximately $1\times10^{-6}$ Ωm in terms of characteristics of the materials for the film of the InGaZnO system). A method for causing the deficiency state of oxygen is as described above.

Next, the n-type Si film 8 to which the n-type impurity is added is formed on the transparent oxide film 6. In this preferred embodiment, the n-type Si film 8 to which phosphorus (P) is added as the n-type impurity is formed to have a thickness of 30 nm by the CVD technique using silane ($SiH_4$) gas and phosphine ($PH_3$) gas. The n-type Si film 8 is set to have an impurity concentration of $1 \times 10^{13}/cm^3$ to $1 \times 10^{20}/cm^3$, and the n-type Si film 8 may be referred to as an Si film of $n^+$.

The thickness is not limited to 30 nm, and it needs to be 5 nm or more to obtain an uniform film structure with stability, for example. Moreover, the thickness does not preferably exceed a thickness of the transparent oxide film 6 being the lower layer and is less than 50 nm in the fifth preferred embodiment. The configuration of the film thickness can reduce a contact resistance at an interface between the channel region 11 of the TFT element A and the source electrode 7 and the drain electrode 10, and thus stable TFT characteristics can be achieved.

The n-type Si film 8 is formed on the transparent oxide film 6 by the CVD technique, so that when the film is formed, hydrogen (H) included in CVD gas reduces the transparent oxide film 6 being the lower layer, accelerating a deficiency of oxygen ions. This can cause the transparent oxide film 6 to be a stable conductive film having a lower specific resistance value. The n-type Si film 8 has excellent corrosion resistance to a chemical solution (acid, alkali), and thus the n-type Si film 8 also has an effect of functioning as a protective film of the transparent oxide film 6 being the lower layer.

Subsequently, a photoresist applied and formed on the n-type Si film 8 is patterned in a second photolithography process to form a resist pattern, and the n-type Si film 8 and the transparent oxide film 6 are patterned with the resist pattern serving as an etching mask. In this preferred embodiment, the n-type Si film 8 is etched by a dry etching technique using sulfur hexafluoride ($SF_6$) gas and $O_2$ gas, and subsequently, the transparent oxide film 6 is etched with a chemical solution of oxalic acid system. Then, the resist pattern is stripped and removed with a resist stripping solution of amine system, to thereby form the transparent oxide film 6 and the n-type Si film 8 laminated on the gate insulating film 5 of the TFT portion, the image display portion, and the common electrode portion, as shown in FIG. 35.

Next, a second conductive film as a material for the source electrode 7, the source wiring 7L, the source terminal 9, and the drain electrode 10 is formed on the transparent insulating substrate 1 on which the transparent oxide film 6 and the n-type Si film 8 are formed. In this preferred embodiment, the alloy film of aluminum (Al) system being a metal, and more specifically, the alloy film (Al—3 mol % Ni film) in which Ni of 3 mol % is added to Al is used as the second conductive film. A method for forming the Al—3 mol % Ni film is described as in the first preferred embodiment.

Figure 36:
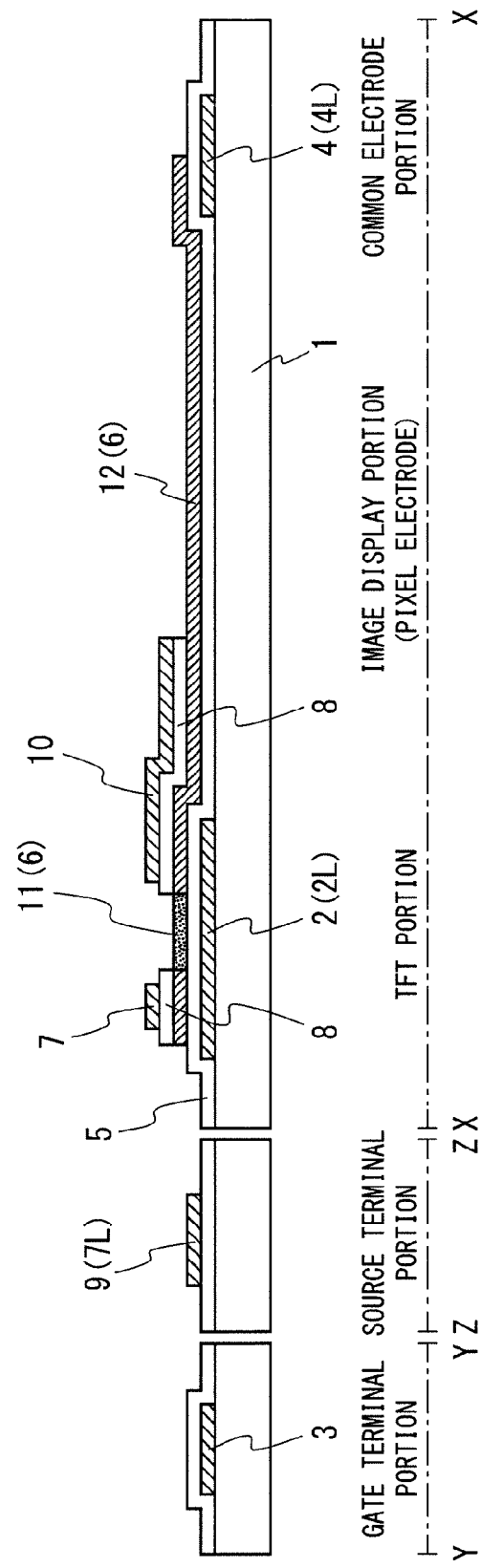

Subsequently, a photoresist applied and formed on the second conductive film is patterned in a third photolithography process to form a resist pattern, and the second conductive film is patterned with the resist pattern serving as an etching mask, to thereby form the source electrode 7, the source wiring 7L, the source terminal 9, and the drain electrode 10, as shown in FIG. 36.

In this preferred embodiment, the second conductive film (Al—3 mol % Ni film) is etched with the chemical solution of PAN system, and subsequently, the resist pattern is stripped and removed with the resist stripping solution of amine system.

At this time, the n-type Si film 8 having the excellent corrosion resistance to the chemical solution covers the transparent oxide film 6 and functions as the protective film of the transparent oxide film 6, whereby only the second conductive film can be selectively etched without etching the transparent oxide film 6.

Further, this step includes the step of oxidizing the transparent oxide film 6 being the lower layer of the n-type Si film 8 after the n-type Si film 8 being the lower portion in the region between the source electrode 7 and the drain electrode 10 is removed by etching and reducing the deficiency of oxygen to increase an electrical resistance, to thereby form a semiconductor that serves as the channel region 11 of the TFT element A.

Specifically, the resistance is increased such that the semiconductor region has the specific resistance value of more than $0.1\ \Omega m$ and less than $1 \times 10^6\ \Omega m$. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 below the source electrode 7 and the drain electrode 10 also maintains conductivity as a conductive region without the oxidation.

A technology of halftone exposure of a photoresist is applicable to the steps as described above, and the steps are described below with reference to FIGS. 37 to 41.

A second insulating film as a material for the protective insulating film 13 is formed on the entire surface of the transparent insulating substrate 1 that finished the steps up to FIG. 36. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a fourth photolithography process to form a resist pattern, and the gate-terminal-portion contact hole 14 and the source-terminal-portion contact hole 15 are formed with the resist mask serving as an etching mask. The gate-terminal-portion contact hole 14 penetrates the protective insulating film 13 and the gate insulating film 5 and reaches the gate terminal 3. The source-terminal-portion contact hole 15 penetrates the protective insulating film 13 and reaches the source terminal 9. Thus, the cross-sectional structure shown in FIG. 33 is obtained.

In this preferred embodiment, the protective insulating film 13 and the gate insulating film 5 are etched by the dry etching technique using the sulfur hexafluoride ($SF_6$) gas and the $O_2$ gas, and subsequently, the resist pattern is stripped and removed with the resist stripping solution of amine system.

<Description of Steps Using Halftone Exposure>

Figure 37:
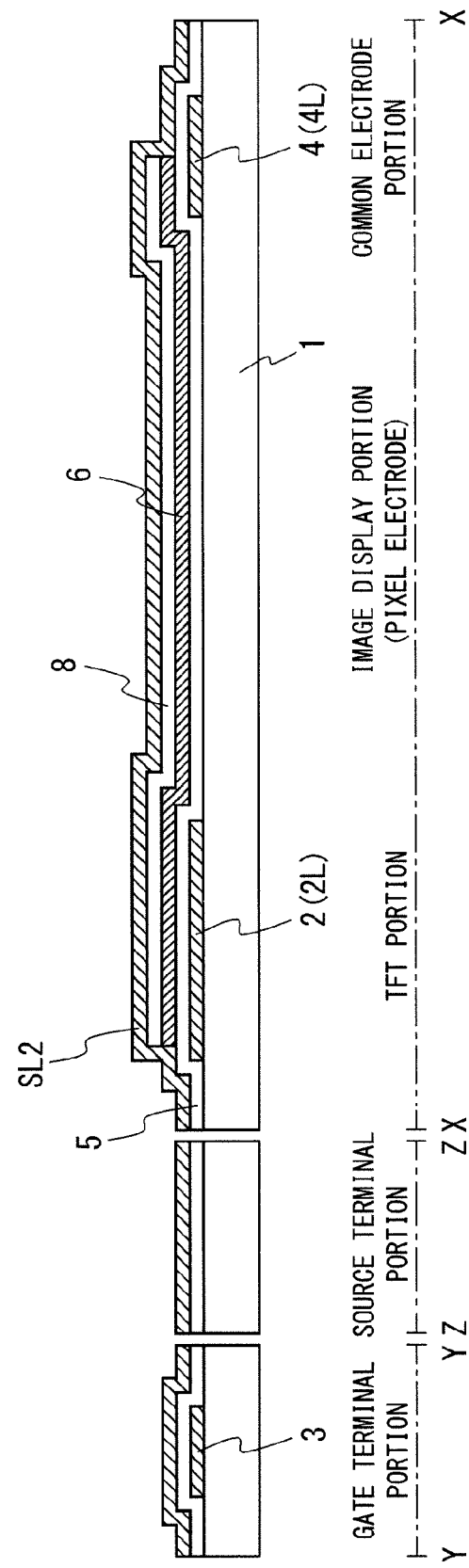

Next, the steps using the technology of the halftone exposure are described with reference to FIGS. 37 to 41. As shown in FIG. 37, an alloy film of aluminum (Al) system being a metal, and more specifically, a Al—3 mol % Ni film with a thickness of 200 nm in which Ni of 3 mol % is added to Al is formed as a second conductive film SL2 on the entire surface of the transparent insulating substrate 1 that finished the steps up to FIG. 35. A formation method is already described, so that the descriptions are omitted.

Subsequently, a photoresist applied and formed on the second conductive film SL2 is patterned in the third photolithography process to form a resist pattern.

More specifically, first, the photoresist formed of a positive-type photosensitive resin of novolac system is applied and formed on the second conductive film SL2. Subsequently, development is performed with an organic alkaline system developing solution including TMAH after exposure of the photoresist, to thereby form resist patterns PR1, PR2, and PR3, as shown in FIG. 38.

Figure 38:
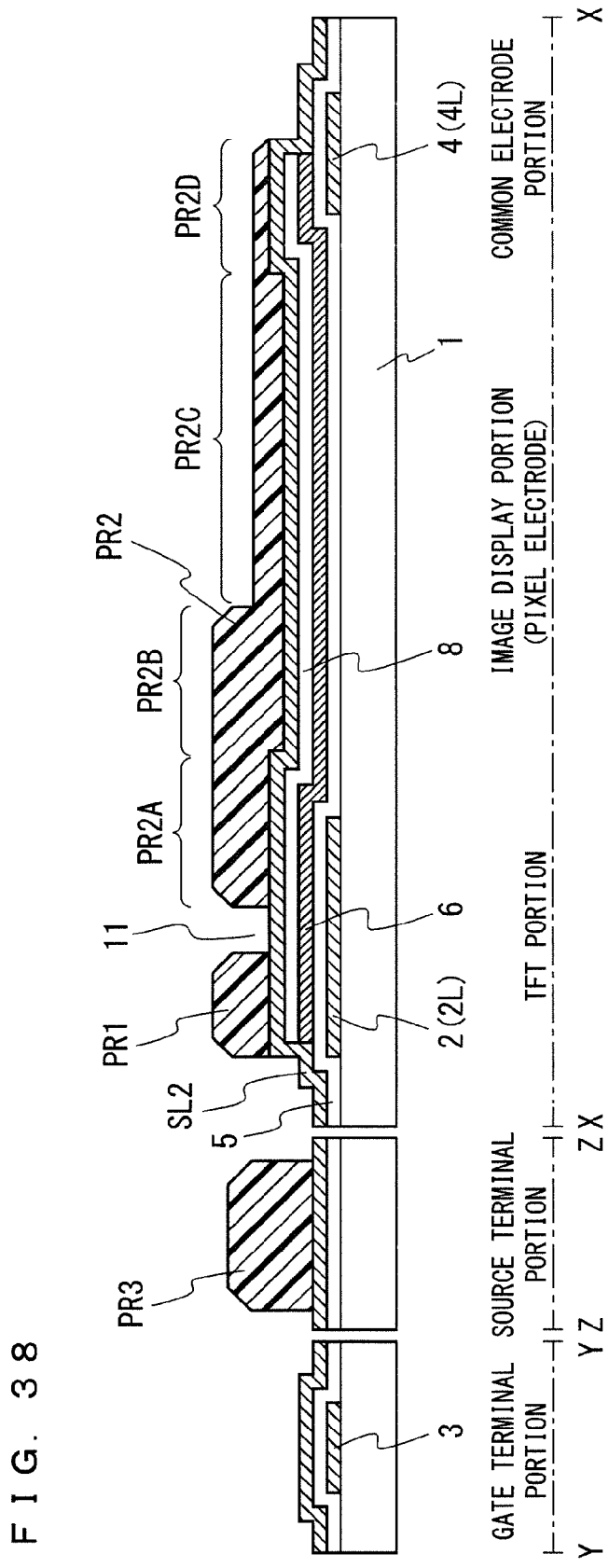

The resist patterns PR1, PR2, and PR3 shown in FIG. 38 are independent patterns separated from each other. The resist pattern PR2 has a first portion PR2A, a second portion PR2B, a third portion PR2C, and a fourth portion PR2D. The first portion PR2A and the second portion PR2B have different film thicknesses due to a step height of underlayers. The third portion PR2C and the fourth portion PR2D have entire film thicknesses thinner than those of the first portion PR2A and the second portion PR2B and have different film thicknesses due to the step height of the underlayers. Thus, the resist pattern PR2 is a pattern having the plurality of different film thicknesses.

The resist pattern having the plurality of different film thicknesses may be formed by the technology of the "halftone exposure" in which light intensity upon exposure varies depending on a position by using a "halftone mask" having a plurality of transmittance.

In other words, the third portion PR2C and the fourth portion PR2D are intermediate exposure regions by being exposed to light having reduced intensity upon the exposure and are regions having the film thicknesses reduced by removal of only the upper layer portion of the photoresist upon the development. On the other hand, the first portion PR2A and the second portion PR2B and the resist patterns PR1 and PR3 are non-exposure regions by being shielded from light upon the exposure and are regions having no thicknesses reduced upon the development.

Next, the second conductive film SL2 and the n-type Si film 8 are patterned by etching with the resist patterns PR1 to PR3 as an etching mask. In this preferred embodiment, after the second conductive film (Al—3 mol % Ni film) SL2 is etched with the chemical solution of PAN system, the n-type Si film 8 corresponding to the upper portion of the channel region 11 is etched by the dry etching technique using the sulfur hexafluoride ($SF_6$) gas and the $O_2$ gas. The transparent oxide film 6 being the lower layer is not etched by this dry etching.

Figure 39:
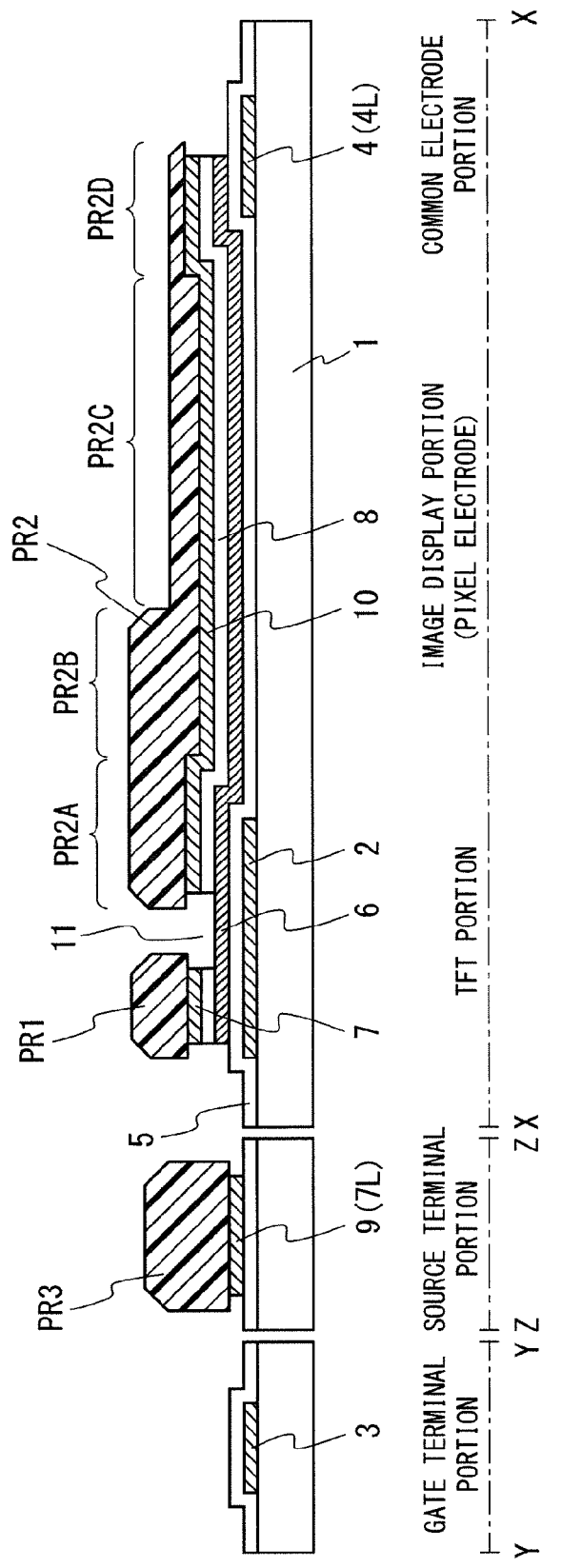

Thus, as shown in FIG. 39, the source electrode 7, the source wiring 7L, the source terminal 9, and the drain electrode 10 are patterned. In addition, each end edge portion of the source electrode 7, the source wiring 7L, the source terminal 9, and the drain electrode 10 is etched so as to be located inside end edge portions of the resist patterns PR1 to PR3.

Next, the resist patterns PR1 to PR3 are subjected to ashing with $O_2$ gas plasma used on the whole transparent insulating substrate 1 to completely remove the third portion PR2C and the fourth portion PR2D having the thin film thicknesses and to reduce the film thicknesses of the resist patterns PR1 and PR3 and the first portion PR2A and the second portion PR2B.

Figure 40:
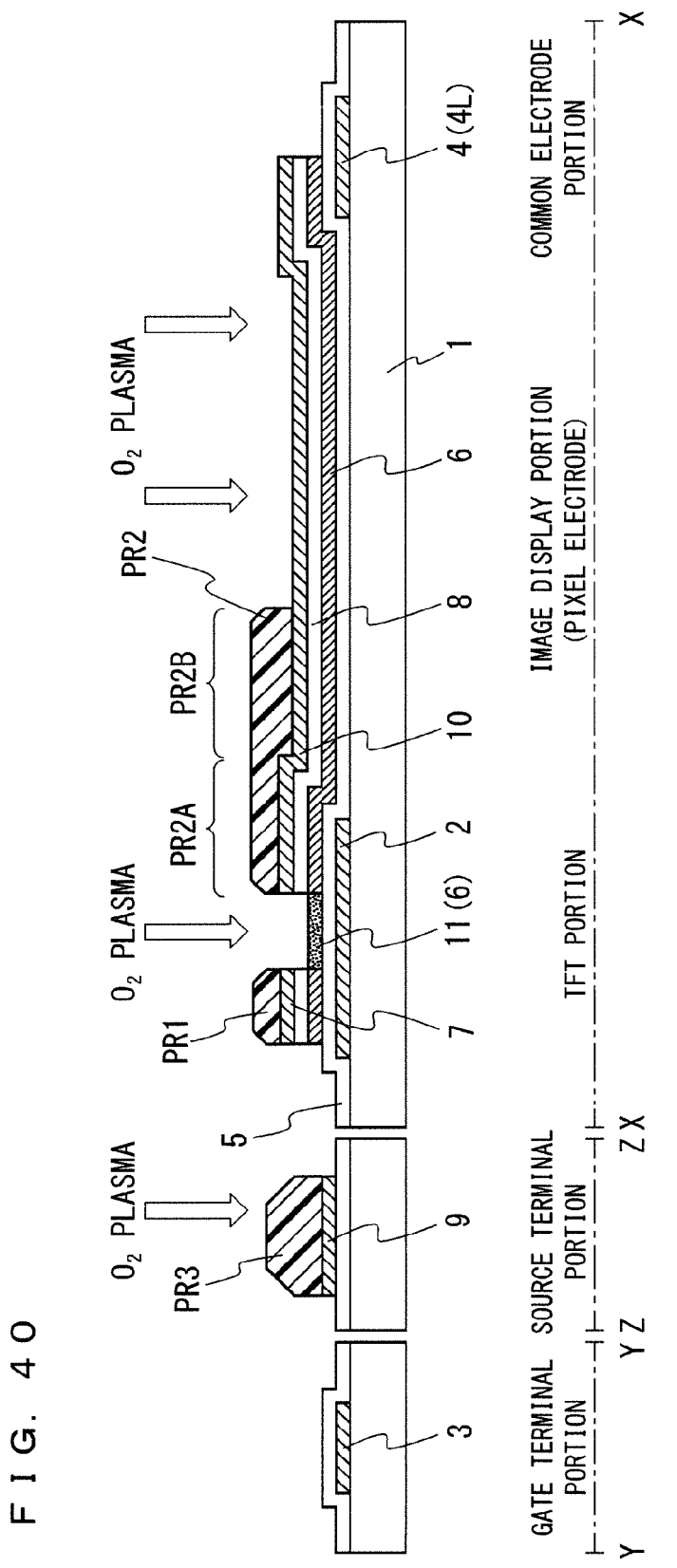

At this time, in the transparent oxide film 6 corresponding to the lower layer in the region between the source electrode 7 and the drain electrode 10, an oxidation reaction by the ashing with the $O_2$ gas plasma proceeds and the resistance is thus increased to form the channel region 11 of the TFT element A as shown in FIG. 40, and the resistance increased by the oxidation can also cause improvement in the resistance to the etching chemical solution. Then, after the ashing with the $O_2$ gas plasma, a plasma treatment may be further performed with nitrous oxide ($N_2O$) gas. The $N_2O$ gas plasma can more efficiently cause the increase in the resistance of the transparent oxide film 6 corresponding to the lower layer in the region between the source electrode 7 and the drain electrode 10.

Subsequently, the second conductive film SL2 and the n-type Si film 8 are patterned again by etching in which the remaining resist patterns PR1 and PR3, first portion PR2A, and second portion PR2B thinned by the ashing serve as an etching mask.

At this time, the transparent oxide film 6 in the channel region 11 has the high resistance increased by the oxidation while having the improved resistance to the etching chemical solution, so that the second conductive film SL2 can be selectively etched with the chemical solution of PAN system, and the n-type Si film 8 can be selectively etched by the dry etching technique using the sulfur hexafluoride ($SF_6$) gas and the $O_2$ gas.

Figure 41:
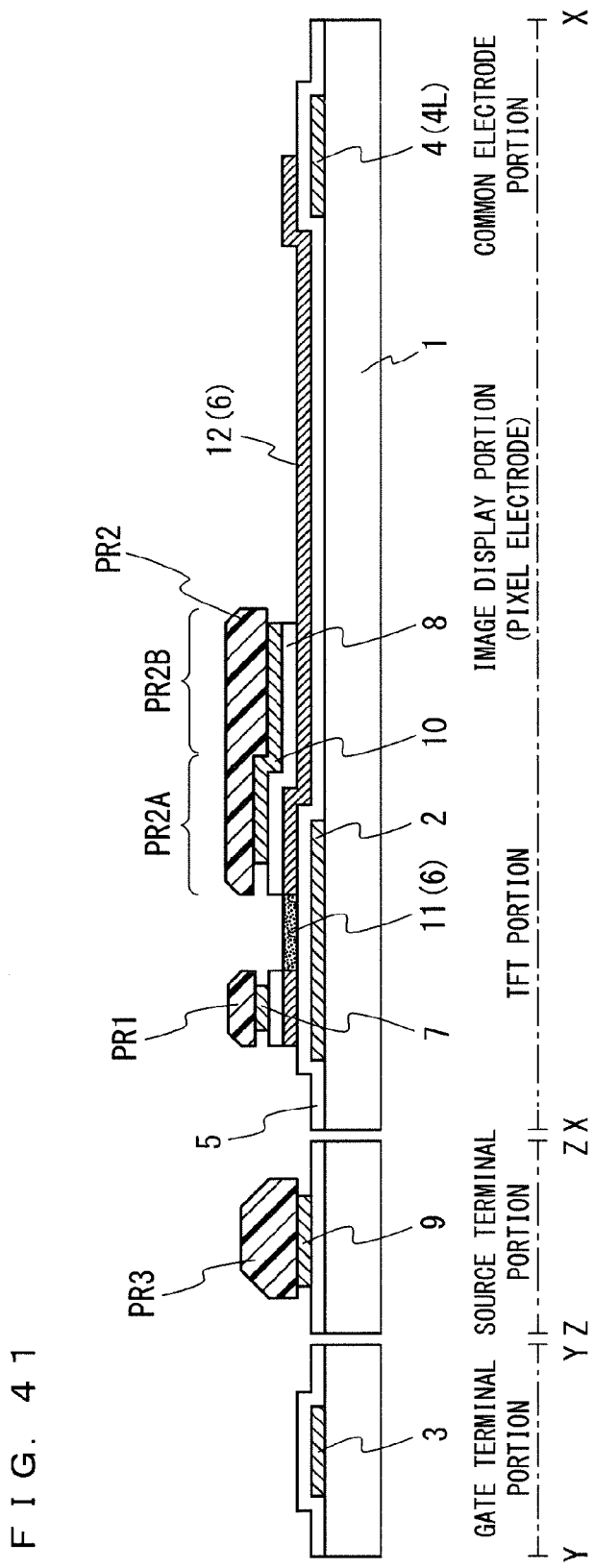

Thus, as shown in FIG. 41, portions of the second conductive film SL2 and the n-type Si film 8 that are not covered with the resist patterns are removed, and each of the end edge portions of the source electrode 7, the source wiring 7L, the source terminal 9, and the drain electrode 10 is further located inside the end edge portions of the resist patterns PR1 to PR3.

Subsequently, the resist patterns PR1 to PR3 are stripped and removed with the resist stripping solution of amine system, and thus the cross-sectional configuration shown in FIG. 36 is obtained.

In addition, the channel region 11 of the TFT element A and the pixel electrode 12 made of the transparent oxide film 6 are formed in the same layer, but upon the ashing described with reference to FIG. 40, the pixel electrode 12 has the upper portion covered with the second conductive film SL2, so that the pixel electrode 12 is not oxidized and functions as a transparent pixel electrode 12 while maintaining the conductivity in the early stage.

As described above, the TFT substrate 500 (active matrix substrate of TN mode) in the fifth preferred embodiment shown in FIGS. 1 and 33 can be formed with great productivity in the four photolithography processes.

The n-type Si film 8 is disposed on the transparent oxide film 6, so that sufficient conductivity in particular can be obtained while the specific resistance value of the pixel electrode 12 made of the transparent oxide film 6 is reduced. Furthermore, when the source electrode 7, the drain electrode 10, or the like is patterned, the n-type Si film 8 functions as the protective film of the transparent oxide film 6 from the etching chemical solution, so that a process margin to corrosion by the chemical solution can be secured. This reduces limitations on a material of the second conductive film SL2 and an etching chemical solution that are used for the source electrode 7 and the drain electrode 10, allowing for application of a wide variety of materials and chemical solutions.

When a liquid crystal display panel is assembled, an alignment film or spacers are formed on the surface of the finished TFT substrate 500. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the TN mode.

The TFT-LCD finished in this manner includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

Sixth Preferred Embodiment

Configuration of Pixel of TFT Substrate

Figure 42:
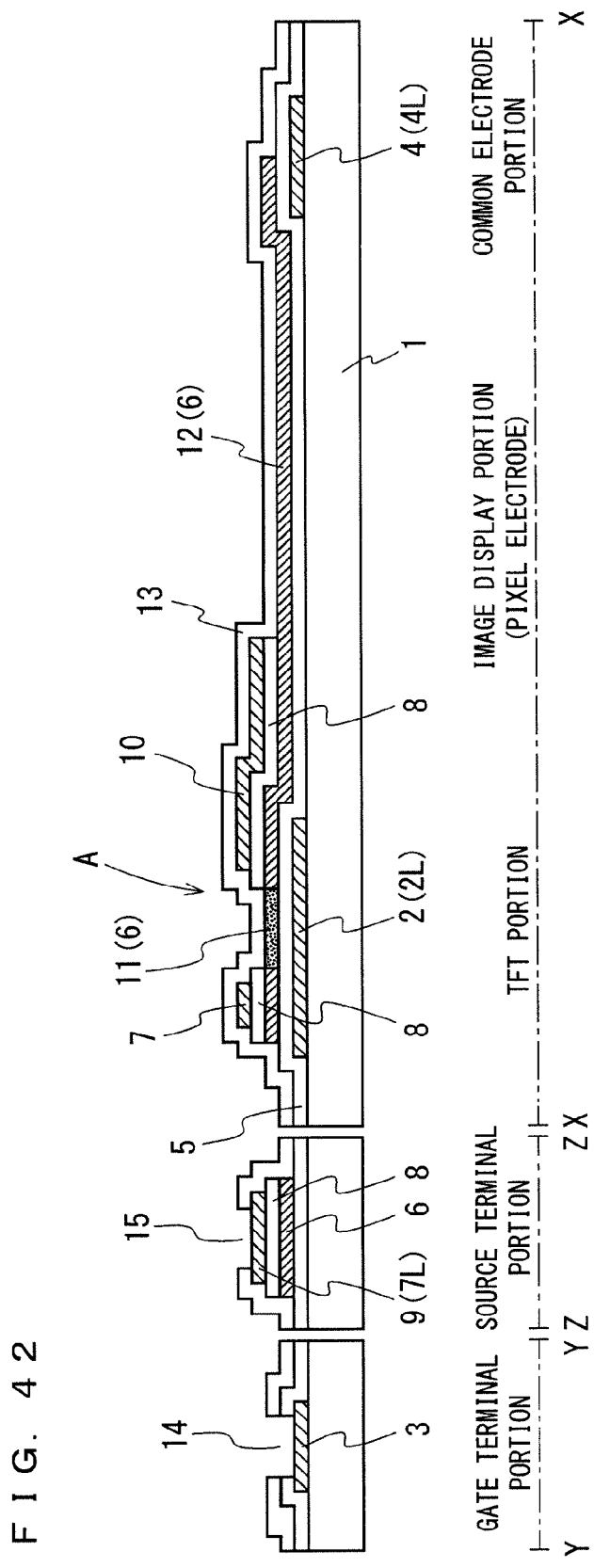
FIG. 42 is a cross-sectional view showing a method for manufacturing the TFT substrate in the sixth preferred embodiment according to the present invention.

First, with reference to FIGS. 11 and 42, a configuration of a TFT substrate 600 in a sixth preferred embodiment is described. A plane configuration of a pixel of the TFT substrate 600 according to the sixth preferred embodiment is substantially the same as that of the TFT substrate 200 according to the second preferred embodiment, so that FIG. 11 is commonly used as the diagram showing the plane configuration of the TFT substrate 600, and redundant descriptions are omitted. FIG. 42 is a cross-sectional view showing a cross-sectional configuration taken along the X-X line in FIG. 11, a cross-sectional configuration taken along the Y-Y line in FIG. 11, and a cross-sectional configuration taken along the Z-Z line in FIG. 11. In addition, it is described hereinafter that the TFT substrate 600 is used in a transmissive liquid crystal display of a TN mode.

As shown in FIG. 42, the TFT substrate 600 according to the sixth preferred embodiment has a configuration that an n-type Si film 8 in which an n-type impurity is added to Si is disposed on the transparent oxide film 6 of the TFT substrate 200 according to the second preferred embodiment, and the source electrode 7 and the drain electrode 10 of the TFT element A of the TFT substrate 200 are formed on the n-type Si film 8 such that the source electrode 7 and the drain electrode 10 are electrically connected to the transparent oxide film 6 through the n-type Si film 8.

As shown in FIG. 42, the TFT substrate 600 includes a gate electrode 2 of a TFT element A, a gate wiring 2L, a gate terminal 3, a common electrode 4, and a common wiring 4L formed on a transparent insulating substrate 1 made of, for example, a glass, and a gate insulating film 5 (first insulating film) is formed to cover them. The gate insulating film 5 is omitted in FIG. 11.

The transparent oxide film 6 forming a pixel electrode 12 is formed on the gate insulating film 5. The transparent oxide film 6 is also formed in a position corresponding to a portion below a source wiring 7L and a source terminal 9, and the n-type Si film 8 is formed on the transparent oxide film 6. Thus, the source wiring 7L and the source terminal 9 substantially have a laminated structure.

The source electrode 7 and the drain electrode 10 are formed on the transparent oxide film 6 of the TFT portion.

As seen in the plan view, at least part of the source electrode 7 and the drain electrode 10 overlap the pattern of the gate electrode 2. Then, in the region of the transparent oxide film 6 overlapping the gate electrode 2, the portion corresponding to the lower portion in the region between the source electrode 7 and the drain electrode 10 is a channel region 11 (active region) during an operation of the TFT element A.

The pixel electrode 12 is formed to have its outer edge slightly smaller than a periphery of the common electrode 4, and part of the outer edge on the TFT element A side extends to cover the TFT element A. The source electrode 7 and the drain electrode 10 are disposed over the extending portion through the n-type Si film 8.

Then, a protective insulating film 13 (second insulating film) is formed on an entire surface of the transparent insulating substrate 1 to cover the gate electrode 2, the gate wiring 2L, the gate terminal 3, the common electrode 4, the n-type Si film 8, the source electrode 7, the source wiring 7L, the source terminal 9, the drain electrode 10, the channel region 11 of the TFT element A, and the pixel electrode 12. The protective insulating film 13 is omitted in FIG. 11.

A gate-terminal-portion contact hole 14 and a source-terminal-portion contact hole 15 are formed in the protective insulating film 13. The gate-terminal-portion contact hole 14 is formed to penetrate the protective insulating film 13 and the gate insulating film 5 and reach the gate terminal 3, and the source-terminal-portion contact hole 15 is formed to penetrate the protective insulating film 13 and reach the source terminal 9.

<Manufacturing Method>

Hereinafter, a method for manufacturing the TFT substrate 600 in the sixth preferred embodiment is described with reference to FIGS. 43 to 51. The plan view and the cross-sectional view in the final step correspond to FIGS. 11 and 42, respectively. In FIGS. 43 to 51, the same components as those shown in FIGS. 11 and 42 are denoted by the same references.

<Description of the Whole Method>

The whole manufacturing method is described with reference to FIGS. 43 and 44. First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. In addition, a method for forming the Al—3 mol % Ni film is described as in the first preferred embodiment.

Figure 43:
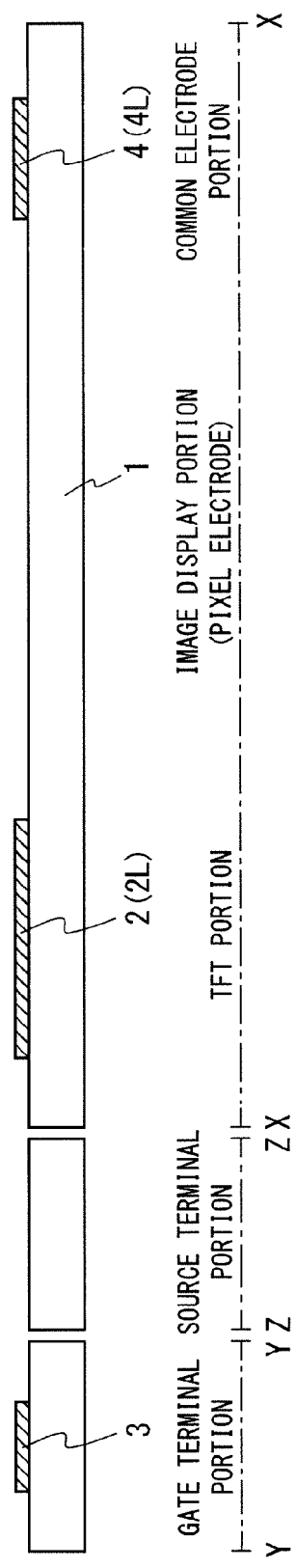
FIG. 43 is a cross-sectional view showing the configuration of the TFT substrate in the sixth preferred embodiment according to the present invention.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 43.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO (InGaZnO film) system in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 Ωm or less (minimum specific resistance value is approximately $1 \times 10^{-6}$ Ωm in terms of characteristics of the materials for the film of the InGaZnO system). A method for causing the deficiency state of oxygen is as described above.

Next, the n-type Si film 8 to which the n-type impurity is added is formed on the transparent oxide film 6. In this preferred embodiment, the n-type Si film 8 to which phosphorus (P) is added as the n-type impurity is formed to have a thickness of 30 nm by the CVD technique using silane ($SiH_4$) gas and phosphine ($PH_3$) gas. The thickness of the n-type Si film 8 is described as in the fifth preferred embodiment. The configuration of the film thickness can reduce a contact resistance at an interface between the channel region 11 of the TFT element A and the source electrode 7 and the drain electrode 10, and thus stable TFT characteristics can be achieved.

The n-type Si film 8 is formed on the transparent oxide film 6 by the CVD technique, so that when the film is formed, hydrogen (H) included in CVD gas reduces the transparent oxide film 6 being the lower layer, accelerating a deficiency of oxygen ions. This can cause the transparent oxide film 6 to be a stable conductive film having a lower specific resistance value. The n-type Si film 8 has excellent corrosion resistance to a chemical solution (acid, alkali), and thus the n-type Si film 8 also has an effect of functioning as a protective film of the transparent oxide film 6 being the lower layer.

Next, a second conductive film as a material for the source electrode 7, the source wiring 7L, the source terminal 9, and the drain electrode 10 is formed on the transparent insulating substrate 1 on which the n-type Si film 8 is formed. In this preferred embodiment, the alloy film of aluminum (Al) system being a metal, and more specifically, the alloy film (Al—3 mol % Ni film) in which Ni of 3 mol % is added to Al is used as the second conductive film.

Figure 44:
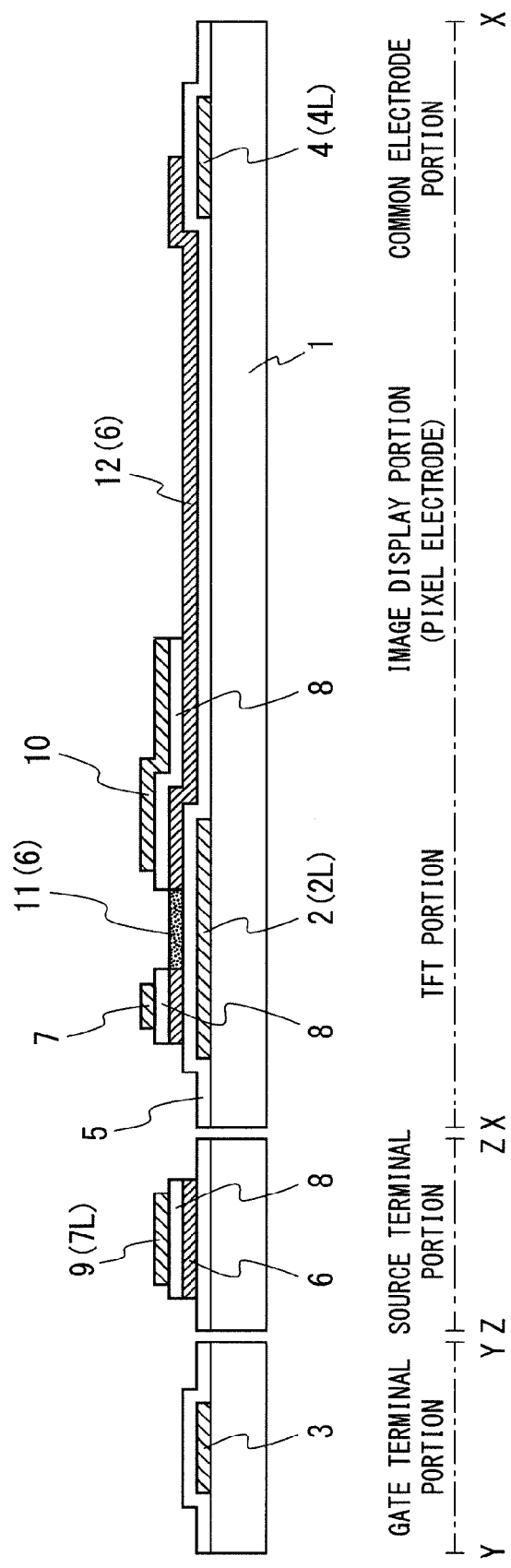
FIGS. 44 to 51 are cross-sectional views showing a method for manufacturing the TFT substrate in the sixth preferred embodiment according to the present invention.

Subsequently, a photoresist applied and formed on the second conductive film is patterned in a second photolithography process to form a resist pattern, and the second conductive film, the n-type Si film 8, and the transparent oxide film 6 are patterned with the resist pattern serving as an etching mask, to thereby form the source electrode 7, the source wiring 7L, the source terminal 9, and the drain electrode 10, as shown in FIG. 44. In this preferred embodiment, the n-type Si film 8 and the transparent oxide film 6 are patterned such that a laminated film of the n-type Si film 8 and the transparent oxide film 6 is also left below the source wiring 7L and the source terminal 9, so that the source wiring 7l, and the source terminal 9 can substantially have the laminated structure.

Further, this step includes the step of oxidizing the transparent oxide film 6 being the lower layer of the n-type Si film 8 after the n-type Si film 8 being the lower portion in the region between the source electrode 7 and the drain electrode 10 is removed by etching and reducing the deficiency of oxygen to increase an electrical resistance, to thereby form a semiconductor that serves as the channel region 11 of the TFT element A.

Specifically, the resistance is increased such that the semiconductor region has the specific resistance value of more than 0.1 Ωm and less than $1 \times 10^6$ Ωm. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 below the source electrode 7 and the drain electrode 10 also maintains conductivity as a conductive region without the oxidation.

A technology of halftone exposure of a photoresist is applicable to the steps as described above, and the steps are described below with reference to FIGS. 45 to 51.

A second insulating film as a material for the protective insulating film 13 is formed on the entire surface of the transparent insulating substrate 1 that finished the steps up to FIG. 44. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a third photolithography process to form a resist pattern, and the gate-terminal-portion contact hole 14 and the source-terminal-portion contact hole 15 are formed with the resist mask serving as an etching mask. The gate-terminal-portion contact hole 14 penetrates the protective insulating film 13 and the gate insulating film 5 and reaches the gate terminal 3. The source-terminal-portion contact hole 15 penetrates the protective insulating film 13 and reaches the source terminal 9. Thus, the cross-sectional structure shown in FIG. 42 is obtained.

In this preferred embodiment, the protective insulating film 13 and the gate insulating film 5 are etched by a dry etching technique using sulfur hexafluoride ($SF_6$) gas and $O_2$ gas, and subsequently, the resist pattern is stripped and removed with the resist stripping solution of amine system.

<Description of Steps Using Halftone Exposure>

Next, the steps using the technology of the halftone exposure are described with reference to FIGS. 45 to 51. The gate insulating film 5 is formed on the entire surface of the transparent insulating substrate 1 that finished the steps up to FIG. 43, and then, the transparent oxide film 6 is formed on the entire surface of the gate insulating film 5. In this preferred embodiment, the transparent oxide film 6 of InGaZnO system (InGaZnO film) having the thickness of 50 nm is formed as the transparent oxide film 6. The InGaZnO film is formed in the deficiency state of oxygen to be the conductive film having the specific resistance value of 0.1 Ωm or less (minimum specific resistance value is approximately $1 \times 10^{-6}$ Ωm in terms of characteristics of the materials for the film of the InGaZnO system). A method for causing the deficiency state of oxygen is as described above.

Next, the n-type Si film 8 to which the n-type impurity is added is formed on the transparent insulating substrate 1 on which the transparent oxide film 6 is formed. A method for forming the n-type Si film 8 and the thickness thereof is described as in the fifth preferred embodiment. The configuration of the film thickness can reduce a contact resistance at an interface between the channel region 11 of the TFT element A and the source electrode 7 and the drain electrode 10, and thus stable TFT characteristics can be achieved.

Figure 45:
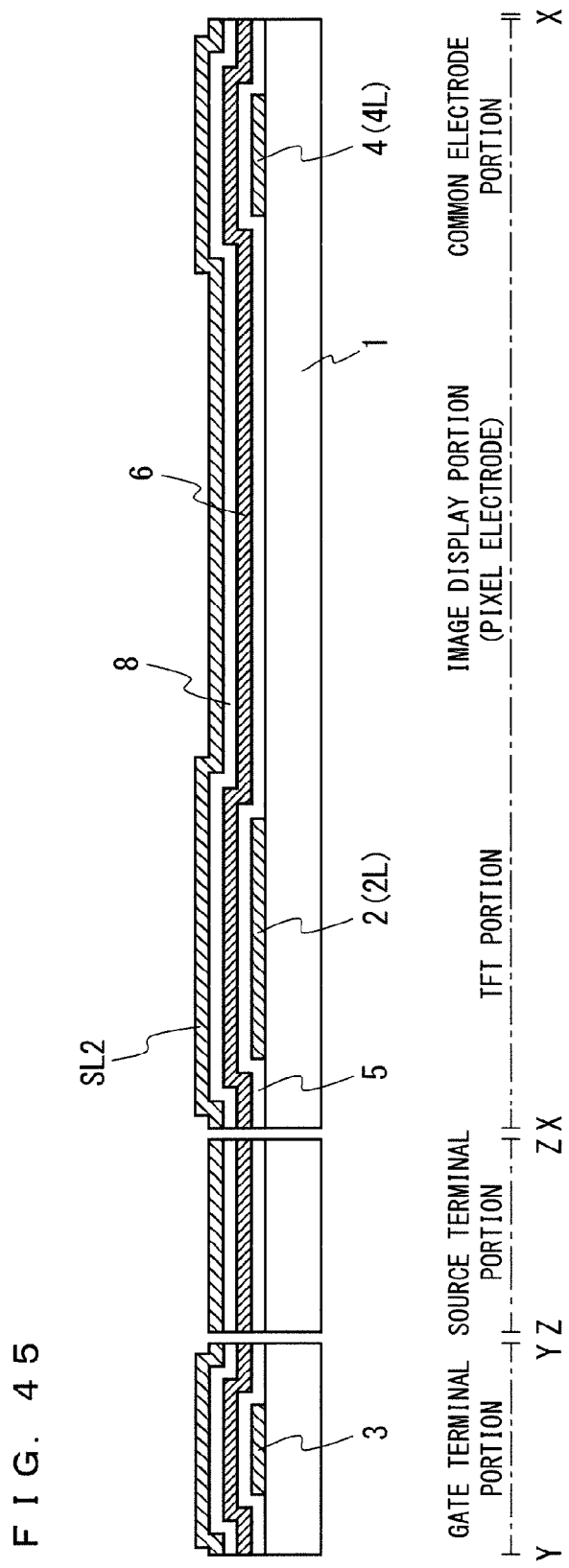

A second conductive film SL2 as a material for the source electrode 7, the source wiring 7L, the source terminal 9, and the drain electrode 10 is formed on an entire surface of the n-type Si film 8, to thereby form a laminated film of the gate insulating film 5, the transparent oxide film 6, the n-type Si film 8, and the second conductive film SL2 on the transparent insulating substrate 1, as shown in FIG. 45.

In this preferred embodiment, the alloy film of aluminum (Al) system being a metal, and more specifically, the Al—3 mol % Ni film with the thickness of 200 nm in which Ni of 3 mol % is added to Al is formed as the second conductive film SL2. A formation method is already described, so that the descriptions are omitted.

Subsequently, a photoresist applied and formed on the second conductive film SL2 is patterned in the second photolithography process to form a resist pattern.

Figure 46:
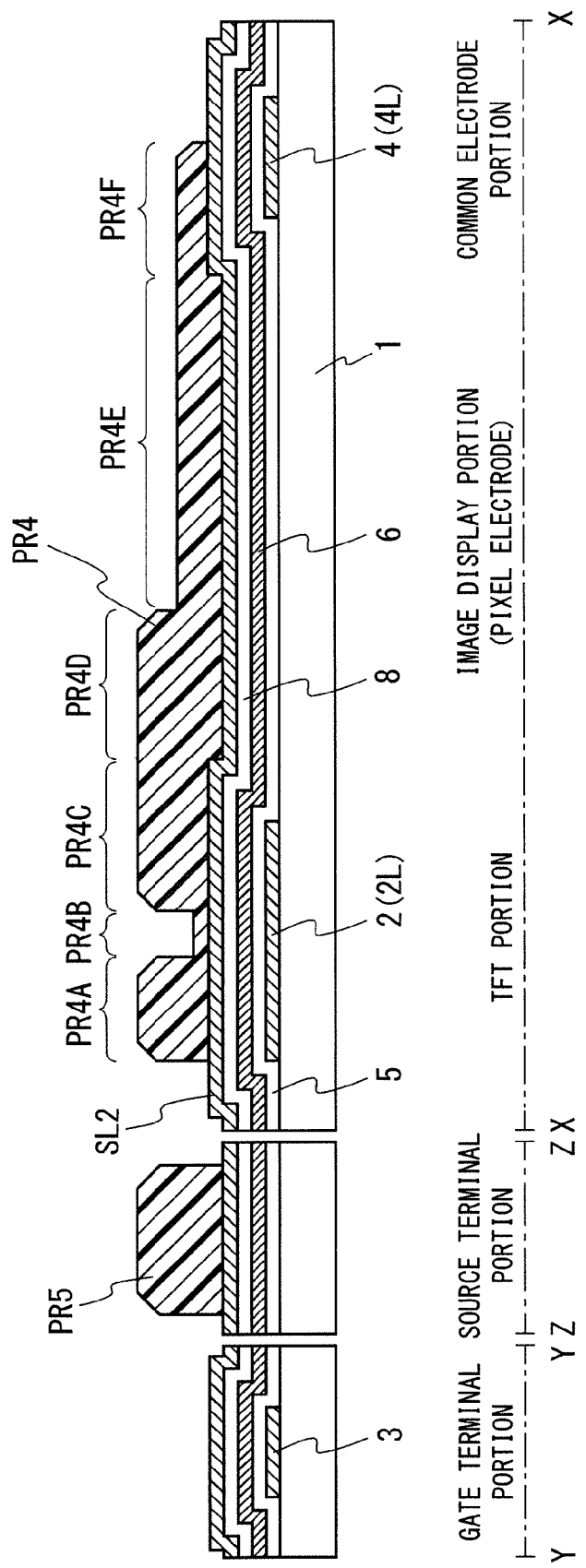

More specifically, first, the photoresist formed of a positive-type photosensitive resin of novolac system is applied and formed on the second conductive film SL2. Subsequently, development is performed with an organic alkaline system developing solution including TMAH after exposure of the photoresist, to thereby form resist patterns PR4 and PR5, as shown in FIG. 46.

The resist patterns PR4 and PR5 are independent patterns separated from each other. The resist pattern PR4 has a first portion PR4A, a second portion PR4B, a third portion PR4C, a fourth portion PR4D, a fifth portion PR4E, and a sixth portion PR4F. The first portion PR4A, the third portion PR4C, and the fourth portion PR4D have different film thicknesses due to a step height of underlayers. The fifth portion PR4E and the sixth portion PR4F have entire film thicknesses thinner than those of the first portion PR4A, the third portion PR4C, and the fourth portion PR4D and have different film thicknesses due to the step height of the underlayers. The second portion PR4B has a thickness thinner than those of the fifth portion PR4E and the sixth portion PR4F. Thus, the resist pattern PR4 is a pattern having the plurality of different film thicknesses.

The resist pattern having the plurality of different film thicknesses may be formed by the technology of the "halftone exposure" in which light intensity upon exposure varies depending on a position by using a "halftone mask" having a plurality of transmittance.

In other words, the second portion PR4B is an intermediate exposure region by being exposed to light having reduced intensity upon the exposure and is a region having the film thickness reduced by removal of only the upper layer portion of the photoresist upon the development. The fifth portion PR4E and the sixth portion PR4F are second intermediate exposure regions by being exposed to light having more reduced intensity than the light for the second portion PR4B and are regions having the film thicknesses reduced by removal of only the upper layer portion of the photoresist upon the development. On the other hand, the first portion PR4A, the third portion PR4C, and the fourth portion PR4D are non-exposure regions by being shielded from light upon the exposure and are regions having no thicknesses reduced upon the development.

Figure 47:
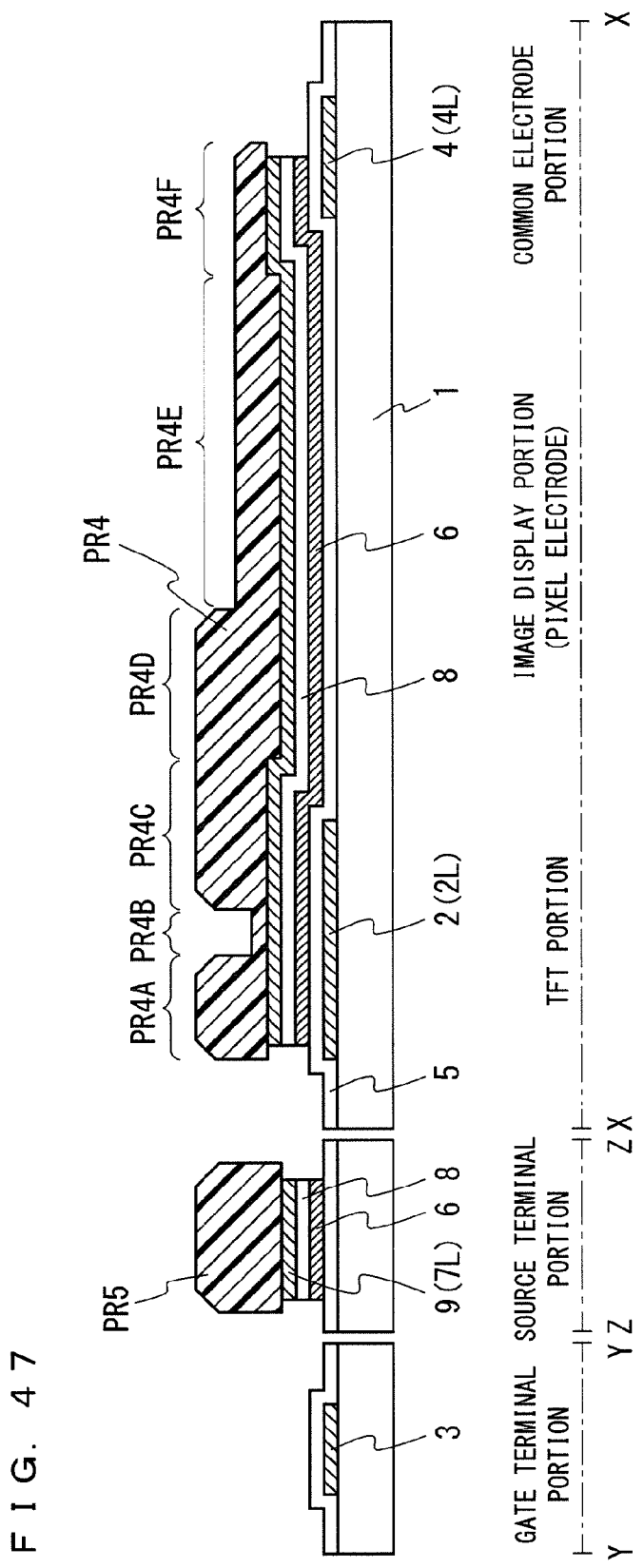

Next, the second conductive film SL2, the n-type Si film 8, and the transparent oxide film 6 are patterned by etching with the resist patterns PR4 and PR5 as an etching mask. In this preferred embodiment, after the second conductive film (Al—3 mol % Ni film) SL2 is etched with a chemical solution of PAN system, the n-type Si film 8 is etched by the dry etching technique using the sulfur hexafluoride ($SF_6$) gas and the $O_2$ gas. Subsequently, the transparent oxide film 6 is then etched with a chemical solution of oxalic acid system. As shown in FIG. 47, the patterns of the source wiring 7L and the source terminal 9 are formed by the three etchings.

The n-type Si film 8 and the transparent oxide film 6 are left below the source wiring 7L and the source terminal 9, and end edge portions of the source wiring 7L, the source terminal 9, the n-type Si film 8, and the transparent oxide film 6 are etched so as to be located inside an end edge portion of the resist pattern PR5.

Figure 48:
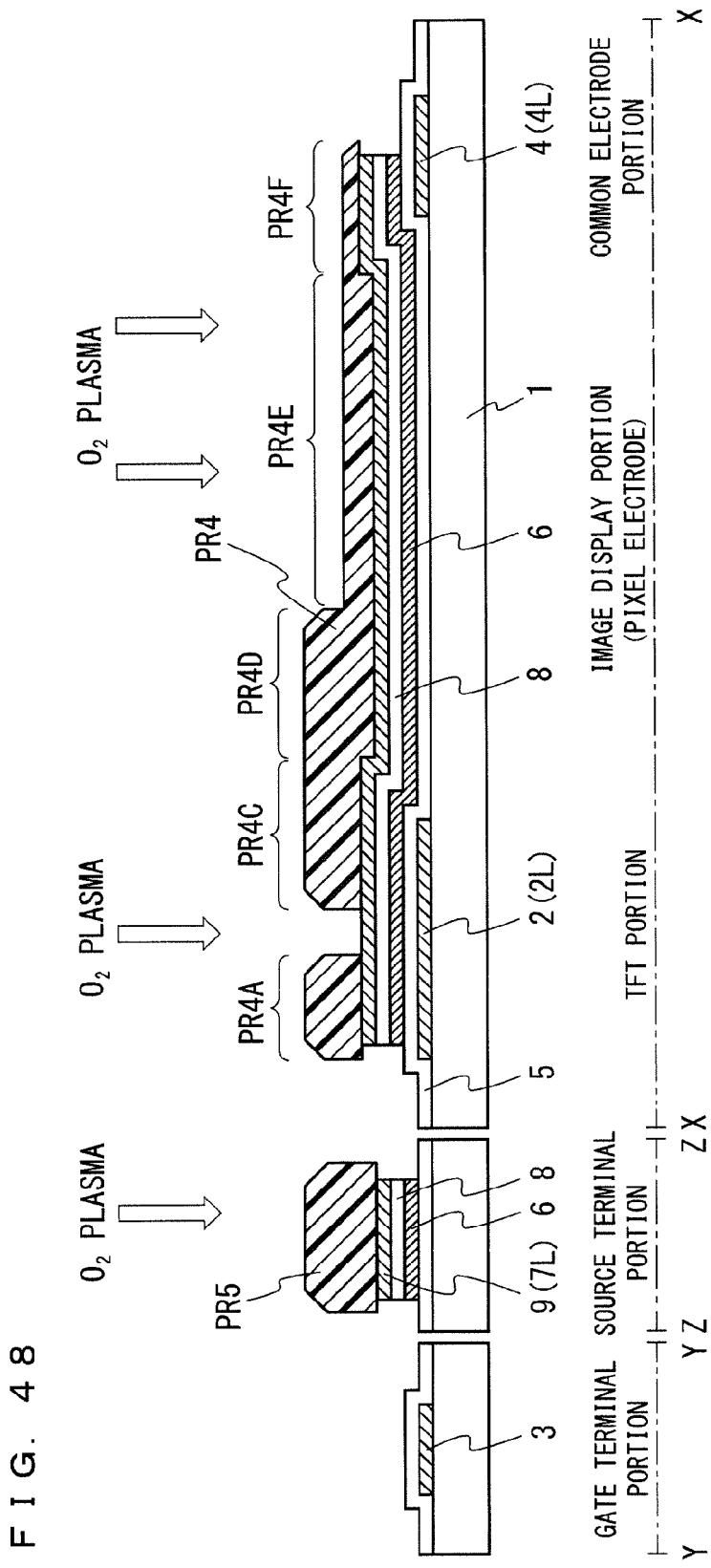

Next, the resist patterns PR4 and PR5 are subjected to first ashing with $O_2$ gas plasma used on the whole transparent insulating substrate 1 to completely remove the second portion PR4B having the thinnest film thickness and to reduce the film thicknesses of the other portions of the resist pattern PR4 and the film thickness of the resist pattern PR5, as shown in FIG. 48.

Subsequently, the second conductive film SL2 and the n-type Si film 8 are patterned with the remaining resist pattern PR4 (PR4A, PR4C, PR4D, PR4E, PR4F) and resist pattern PR5 serving as an etching mask, the resist patterns PR4 and PR5 being thinned by the ashing.

In this preferred embodiment, after the second conductive film (Al—3 mol % Ni film) SL2 is etched with the chemical solution of PAN system, the n-type Si film 8 is etched by the dry etching technique using the sulfur hexafluoride ($SF_6$) gas and the $O_2$ gas.

Figure 49:
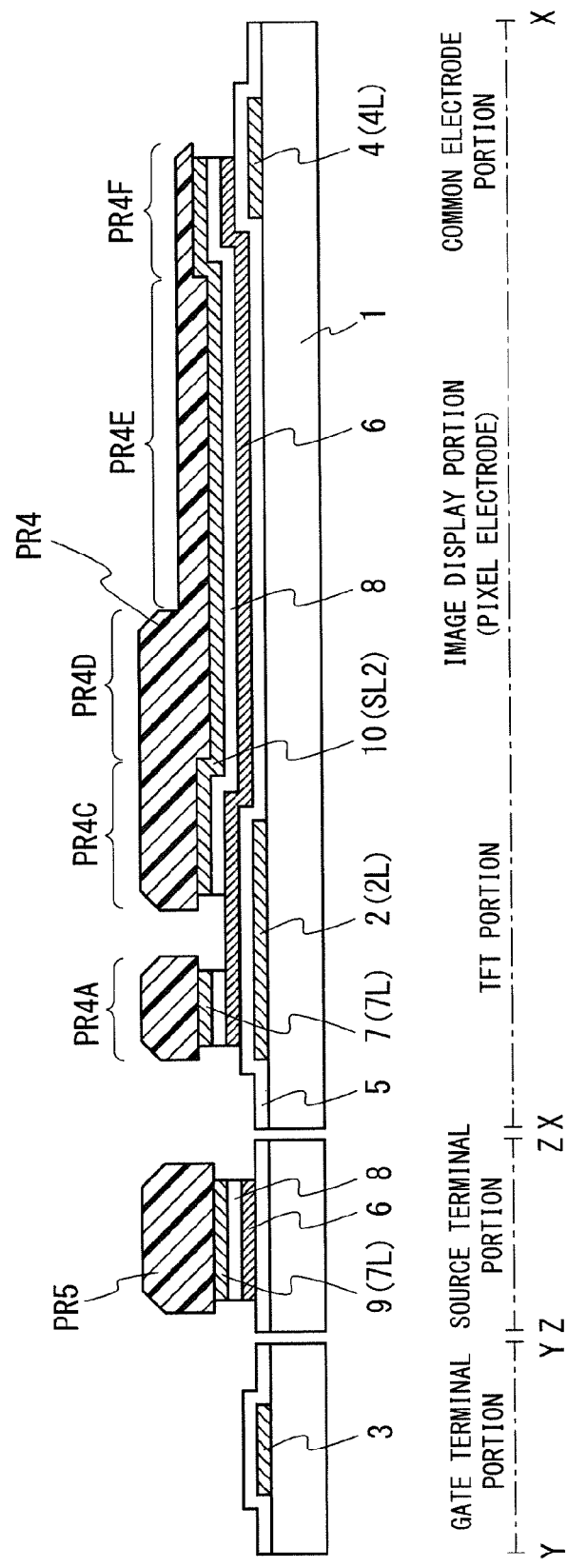

Herein, when the second conductive film (Al—3 mol % Ni film) SL2 is etched with the chemical solution of PAN system, the n-type Si film 8 having the excellent corrosion resistance to the chemical solution covers the transparent oxide film 6 and functions as the protective film of the transparent oxide film 6. Consequently, only the second conductive film can be selectively etched without etching the transparent oxide film 6, leaving the transparent oxide film 6 in the channel region 11. Thus, as shown in FIG. 49, the patterns of the source electrode 7, the source wiring 7L, the source terminal 9, and the drain electrode 10 are formed.

Figure 50:
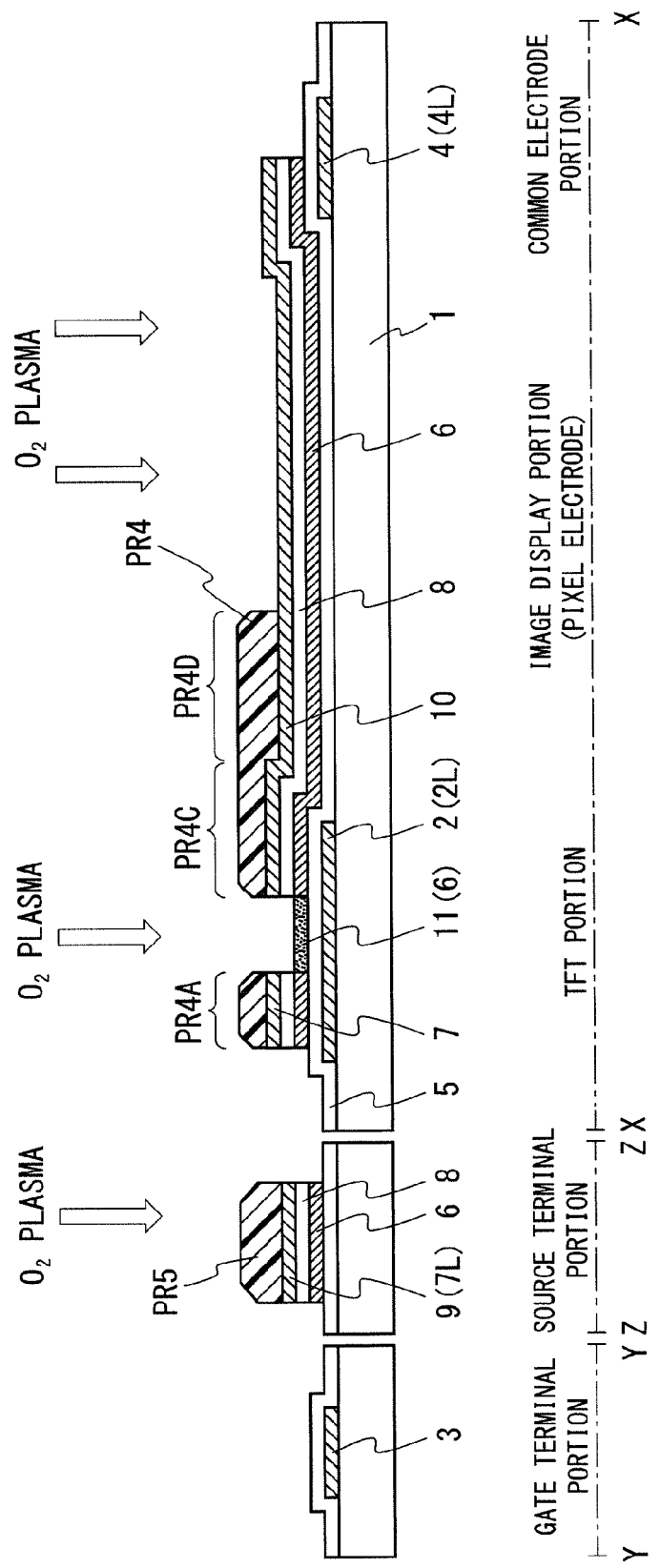

Next, the resist patterns PR4 and PR5 are subjected to second ashing with the $O_2$ gas plasma used on the whole transparent insulating substrate 1 to completely remove the fifth portion PR4E and the sixth portion PR4F having the thin film thicknesses and to further reduce the film thicknesses of the other portions of the resist pattern PR4 and the film thickness of the resist pattern PR5, as shown in FIG. 50.

At this time, in the transparent oxide film 6 corresponding to the lower layer in the region between the source electrode 7 and the drain electrode 10, an oxidation reaction by the ashing with the $O_2$ gas plasma proceeds and the resistance is thus increased to form the channel region 11 of the TFT element A as shown in FIG. 50, and the resistance increased by the oxidation can also cause improvement in the resistance to the etching chemical solution. Then, after the ashing with the $O_2$ gas plasma, a plasma treatment may be further performed with nitrous oxide ($N_2O$) gas. The $N_2O$ gas plasma can more efficiently cause the increase in the resistance of the transparent oxide film 6 corresponding to the lower layer in the region between the source electrode 7 and the drain electrode 10.

Subsequently, the second conductive film SL2 and the n-type Si film 8 are patterned again with the remaining resist pattern PR5, first portion PR4A, third portion PR4C, and fourth portion PR4D serving as an etching mask, the resist pattern PR5, the first portion PR4A, the third portion PR4C, and the fourth portion PR4D being thinned by the second ashing. At this time, the transparent oxide film 6 in the channel region 11 has the high resistance increased by the oxidation while having the improved resistance to the etching chemical solution, so that the second conductive film SL2 can be selectively etched with the chemical solution of PAN system, and the n-type Si film 8 can be selectively etched by the dry etching technique using the sulfur hexafluoride (SF( ) gas and the $O_2$ gas.

Figure 51:
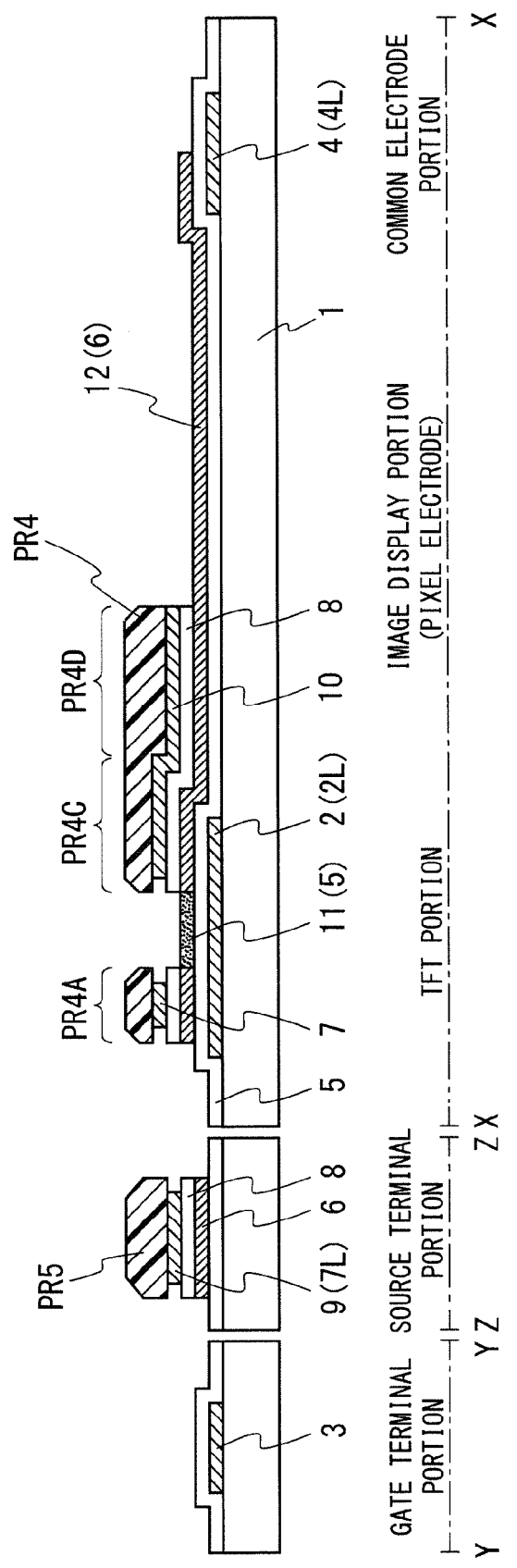

Thus, as shown in FIG. 51, the source electrode 7, the source wiring 7L, the source terminal 9, and the drain electrode 10 are patterned.

Subsequently, the resist pattern PR5 and the first portion PR4A, the third portion PR4C, and the fourth portion PR4D are stripped and removed with the resist stripping solution of amine system, and thus the cross-sectional configuration shown in FIG. 42 is obtained.

In addition, the channel region 11 of the TFT element A and the pixel electrode 12 made of the transparent oxide film 6 are formed in the same layer, but upon the second ashing described with reference to FIG. 50, the pixel electrode 12 has the upper portion covered with the second conductive film SL2 and the n-type Si film 8, so that the pixel electrode 12 is not oxidized and functions as a transparent pixel electrode 12 while maintaining the conductivity in the early stage.

As described above, the TFT substrate 600 (active matrix substrate of TN mode) in the sixth preferred embodiment shown in FIGS. 11 and 42 can be formed with great productivity in the three photolithography processes, which is one less photolithography process than the manufacturing method in the first preferred embodiment, so that the productivity can be more improved.

The n-type Si film 8 is disposed on the transparent oxide film 6, so that sufficient conductivity in particular can be obtained while the specific resistance value of the pixel electrode 12 made of the transparent oxide film 6 is reduced. Furthermore, when the source electrode 7, the drain electrode 10, or the like is patterned, the n-type Si film 8 functions as the protective film of the transparent oxide film 6 from the etching chemical solution, so that a process margin to corrosion by the chemical solution can be secured. This reduces limitations on a material of the second conductive film SL2 and an etching chemical solution that are used for the source electrode 7 and the drain electrode 10, allowing for application of a wide variety of materials and chemical solutions.

When a liquid crystal display panel is assembled, an alignment film or spacers are formed on the surface of the finished TFT substrate 600. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the TN mode.

The TFT-LCD finished in this manner includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

The transparent oxide film 6 is also disposed below the source wiring 7L that substantially has a three-layer laminated structure with the transparent oxide film 6 and the n-type Si film 8, so that the source wiring 7L is a so-called redundant wiring capable of greatly reducing a break in the source wiring 7L.

Seventh Preferred Embodiment

Configuration of Pixel of TFT Substrate

Figure 52:
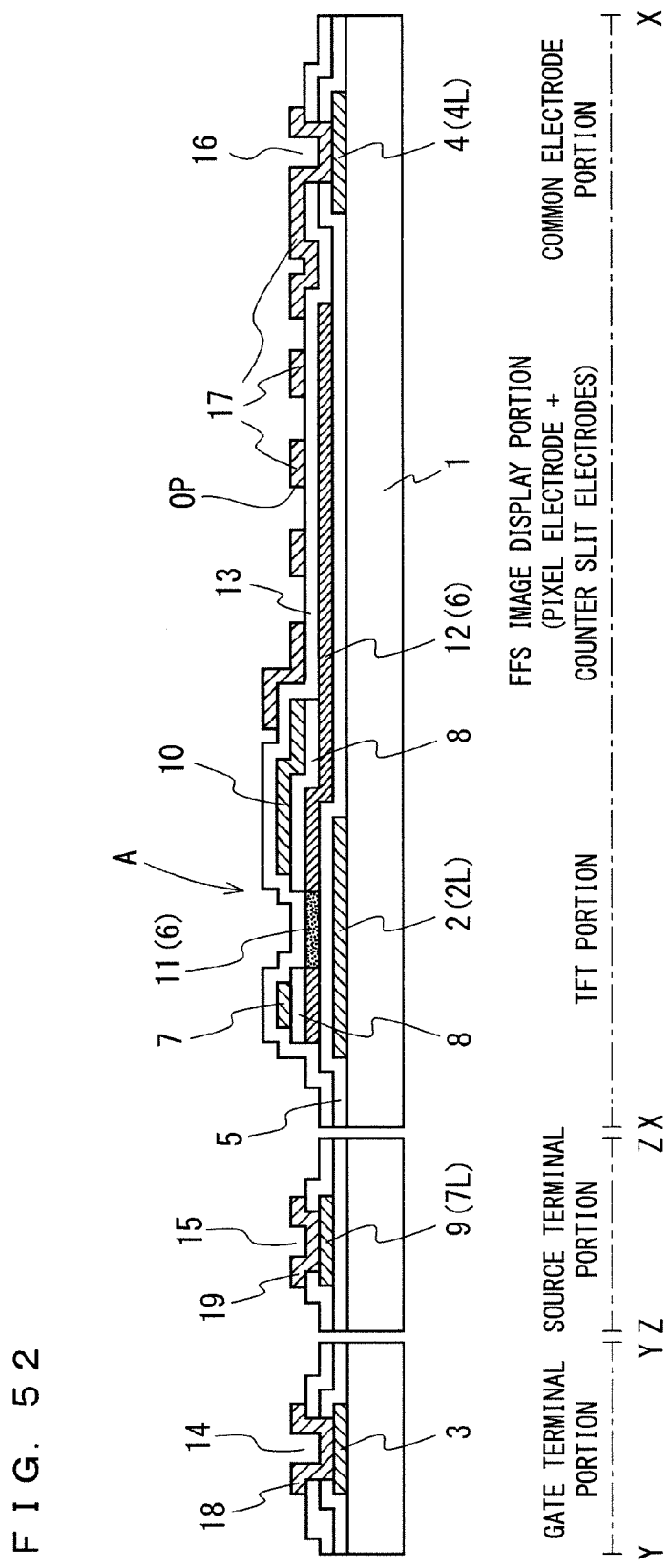
FIG. 52 is a cross-sectional view showing the configuration of the TFT substrate in the seventh preferred embodiment according to the present invention.

First, with reference to FIGS. 22 and 52, a configuration of a TFT substrate 700 in a seventh preferred embodiment is described. A plane configuration of a pixel of the TFT substrate 700 according to the seventh preferred embodiment is substantially the same as that of the TFT substrate 300 according to the third preferred embodiment, so that FIG. 22 is commonly used as the diagram showing the plane configuration of the TFT substrate 700, and redundant descriptions are omitted. FIG. 52 is a cross-sectional view showing a cross-sectional configuration taken along the X-X line in FIG. 22, a cross-sectional configuration taken along the Y-Y line in FIG. 22, and a cross-sectional configuration taken along the Z-Z line in FIG. 22. In addition, it is described hereinafter that the TFT substrate 700 is used in a transmissive liquid crystal display of an FFS mode.

As shown in FIG. 52, the TFT substrate 700 according to the seventh preferred embodiment has a configuration that an n-type Si film 8 in which an n-type impurity is added to Si is disposed on the transparent oxide film 6 of the TFT substrate 300 according to the third preferred embodiment, and the source electrode 7 and the drain electrode 10 of the TFT element A of the TFT substrate 300 are formed on the n-type Si film 8 such that the source electrode 7 and the drain electrode 10 are electrically connected to the transparent oxide film 6 through the n-type Si film 8.

As shown in FIG. 52, the TFT substrate 700 includes a gate electrode 2 of a TFT element A, a gate wiring 2L, a gate terminal 3, a common electrode 4, and a common wiring 4L formed on a transparent insulating substrate 1 made of, for example, a glass, and a gate insulating film 5 (first insulating film) is formed to cover them. The gate insulating film 5 is omitted in FIG. 22.

The transparent oxide film 6 forming a pixel electrode 12 and a source terminal 9 are formed on the gate insulating film 5. Then, on the transparent oxide film 6 of a TFT portion, the n-type Si film 8 containing the n-type impurity is formed in a region being a lower portion of the source electrode 7 and the drain electrode 10, and the source electrode 7 and the drain electrode 10 are formed on the n-type Si film 8. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

In an FFS image display portion, counter slit electrodes 17 are formed on the pixel electrode 12. In this preferred embodiment, the pixel electrode 12 is a flat-shaped conductive electrode formed of the transparent oxide film and is formed independently in each pixel.

Furthermore, the common electrode 4 and the common wiring 4L are formed in the FFS image display portion, and the common electrode 4 and the common wiring 4L are formed to be a film of the same layer as the gate electrode 2 and the gate terminal 3.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, a source wiring 7L, the n-type Si film 8, the source terminal 9, the drain electrode 10, the channel region 11 of the TFT element A, and the pixel electrode 12. The protective insulating film 13 is omitted in FIG. 22.

A gate-terminal-portion contact hole 14, a source-terminal-portion contact hole 15, and a common-electrode-portion contact hole 16 are formed in the protective insulating film 13.

The gate-terminal-portion contact hole 14 is formed to penetrate the protective insulating film 13 and the gate insulating film 5 and reach the gate terminal 3. The source-terminal-portion contact hole 15 is formed to penetrate the protective insulating film 13 and reach the source terminal 9. The common-electrode-portion contact hole 16 is formed to penetrate the protective insulating film 13 and the gate insulating film 5 and reach the common electrode 4.

A gate terminal pad 18 electrically connected to the gate terminal 3 through the gate-terminal-portion contact hole 14, a source terminal pad 19 electrically connected to the source terminal 9 through the source-terminal-portion contact hole 15, and the counter slit electrodes 17 opposite to the pixel electrode 12 are formed on the protective insulating film 13.

The counter slit electrodes 17 have a plurality of openings OP formed in a grid pattern or a slit pattern. The counter slit electrodes 17 are electrically connected to the common electrode 4 being the lower layer through the common-electrode-portion contact hole 16. Thus, the counter slit electrodes 17 are supplied with a fixed potential signal, and an active matrix substrate of the FFS mode capable of laterally driving liquid crystals by a lateral electric field depending on a combination of the pixel electrode 12 and the counter slit electrodes 17 can be obtained. The counter slit electrodes 17, the gate terminal pad 18, and the source terminal pad 19 are made of a light-transmissive (transparent) conductive oxide film.

<Manufacturing Method>

Hereinafter, a method for manufacturing the TFT substrate 700 in the seventh preferred embodiment is described with reference to FIGS. 53 to 56. The plan view and the cross-sectional view in the final step correspond to FIGS. 22 and 52, respectively. In FIGS. 53 to 56, the same components as those shown in FIGS. 22 and 52 are denoted by the same references.

First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. Herein, the Al—3 mol % Ni film having a thickness of 200 nm is formed to form the first conductive film. A method for manufacturing the Al—3 mol % Ni film is described as in the first preferred embodiment.

Figure 53:
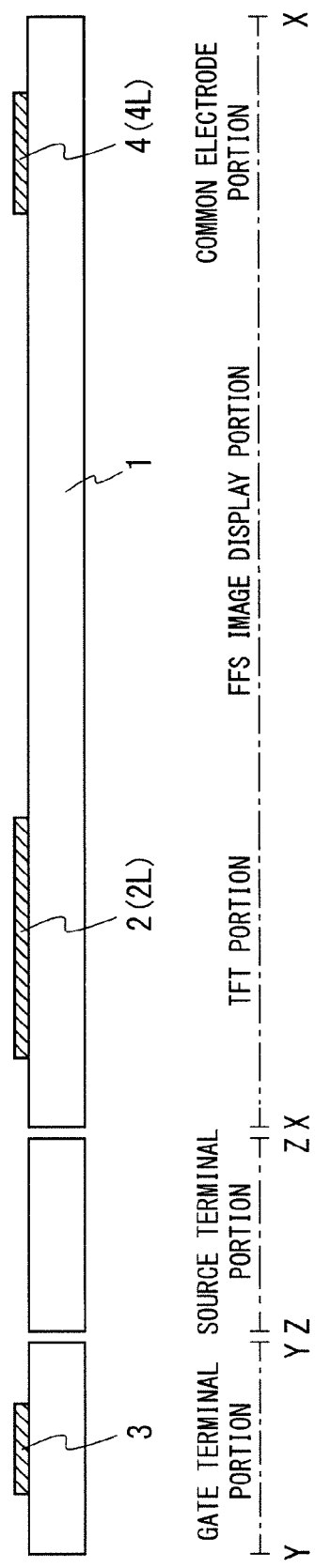
FIGS. 53 to 56 are cross-sectional views showing a method for manufacturing the TFT substrate in the seventh preferred embodiment according to the present invention.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 53.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 Dm or less (minimum specific resistance value is approximately $1 \times 10^{-6}$ Ωm in terms of characteristics of the materials for the film of the InGaZnO system). A method for causing the deficiency state of oxygen is as described above.

Next, the n-type Si film 8 to which the n-type impurity is added is formed on the transparent oxide film 6. In this preferred embodiment, the n-type Si film 8 to which phosphorus (P) is added as the n-type impurity is formed to have a thickness of 30 nm by the CVD technique using silane ($SiH_4$) gas and phosphine ($PH_3$) gas. A method for forming the n-type Si film 8 and the thickness thereof is described as in the fifth preferred embodiment. The configuration of the film thickness can reduce a contact resistance at an interface between the channel region 11 of the TFT element A and the source electrode 7 and the drain electrode 10, and thus stable TFT characteristics can be achieved.

The n-type Si film 8 is formed on the transparent oxide film 6 by the CVD technique, so that when the film is formed, hydrogen (H) included in CVD gas reduces the transparent oxide film 6 being the lower layer, accelerating a deficiency of oxygen ions. This can cause the transparent oxide film 6 to be a stable conductive film having a lower specific resistance value. The n-type Si film 8 has excellent corrosion resistance to a chemical solution (acid, alkali), and thus the n-type Si film 8 also has an effect of functioning as a protective film of the transparent oxide film 6 being the lower layer.

Subsequently, a photoresist applied and formed on the n-type Si film 8 is patterned in a second photolithography process to form a resist pattern, and the n-type Si film 8 and the transparent oxide film 6 are patterned with the resist pattern serving as an etching mask. In this preferred embodiment, the n-type Si film 8 is etched by a dry etching technique using sulfur hexafluoride ($SF_6$) gas and $O_2$ gas, and subsequently, the transparent oxide film 6 is etched with a chemical solution of oxalic acid system.

Figure 54:
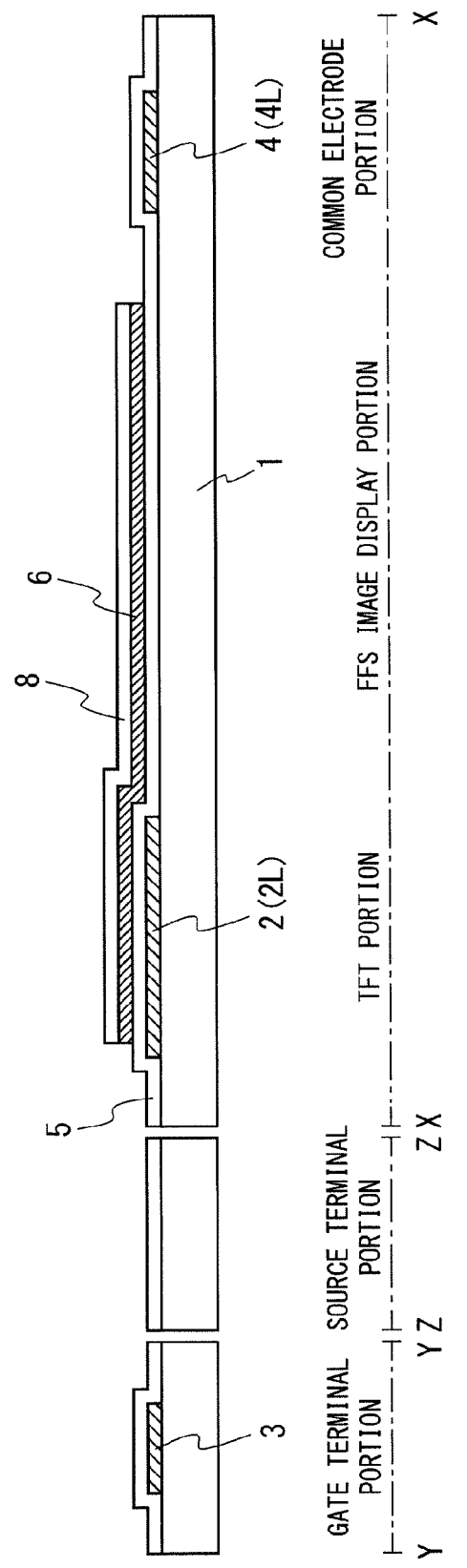

Then, the resist pattern is stripped and removed with a resist stripping solution of amine system, to thereby form the transparent oxide film 6 and the n-type Si film 8 laminated on the gate insulating film 5 of the TFT portion and the FFS image display portion, as shown in FIG. 54.

Next, a second conductive film as a material for the source electrode 7, the source wiring 7L, the source terminal 9, and the drain electrode 10 is formed on the transparent insulating substrate 1 on which the transparent oxide film 6 and the n-type Si film 8 are formed. In this preferred embodiment, the alloy film of aluminum (Al) system being a metal, and more specifically, the alloy film (Al—3 mol % Ni film) in which Ni of 3 mol % is added to Al is used as the second conductive film. A method for forming the Al—3 mol % Ni film is described as in the first preferred embodiment.

Figure 55:
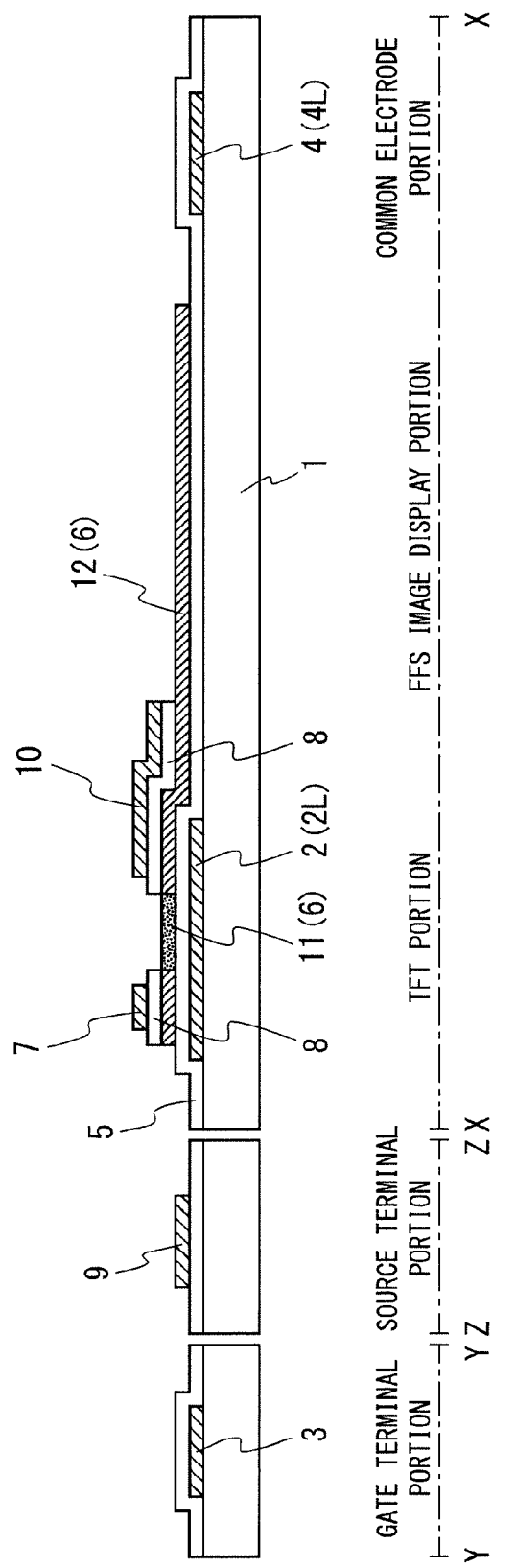

Subsequently, a photoresist applied and formed on the second conductive film is patterned in a third photolithography process to form a resist pattern, and the second conductive film is patterned with the resist pattern serving as an etching mask, to thereby form the source electrode 7, the source wiring 7L, the source terminal 9, and the drain electrode 10, as shown in FIG. 55.

In this preferred embodiment, the first conductive film (Al—3 mol % Ni film) is etched with the chemical solution of PAN system, and subsequently, the resist pattern is stripped and removed with the resist stripping solution of amine system.

At this time, the n-type Si film 8 having the excellent corrosion resistance to the chemical solution covers the transparent oxide film 6 and functions as the protective film of the transparent oxide film 6, whereby only the second conductive film can be selectively etched without etching the transparent oxide film 6.

Further, this step includes the step of oxidizing the transparent oxide film 6 being the lower layer of the n-type Si film 8 after the n-type Si film 8 being the lower portion in the region between the source electrode 7 and the drain electrode 10 is removed by etching and reducing the deficiency of oxygen to increase an electrical resistance, to thereby form a semiconductor that serves as the channel region 11 of the TFT element A.

Specifically, the resistance is increased such that the semiconductor region has the specific resistance value of more than $0.1 \, \Omega m$ and less than $1 \times 10^6 \, \Omega m$. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 below the source electrode 7 and the drain electrode 10 also maintains conductivity as a conductive region without the oxidation.

A technology of halftone exposure of a photoresist described in the fifth preferred embodiment with reference to FIGS. 37 to 41 is applicable as it is in principle to the steps described above, and the descriptions are omitted.

Next, a second insulating film as a material for the protective insulating film 13 is formed on the entire surface of the transparent insulating substrate 1 that finished the steps up to FIG. 55. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Figure 56:
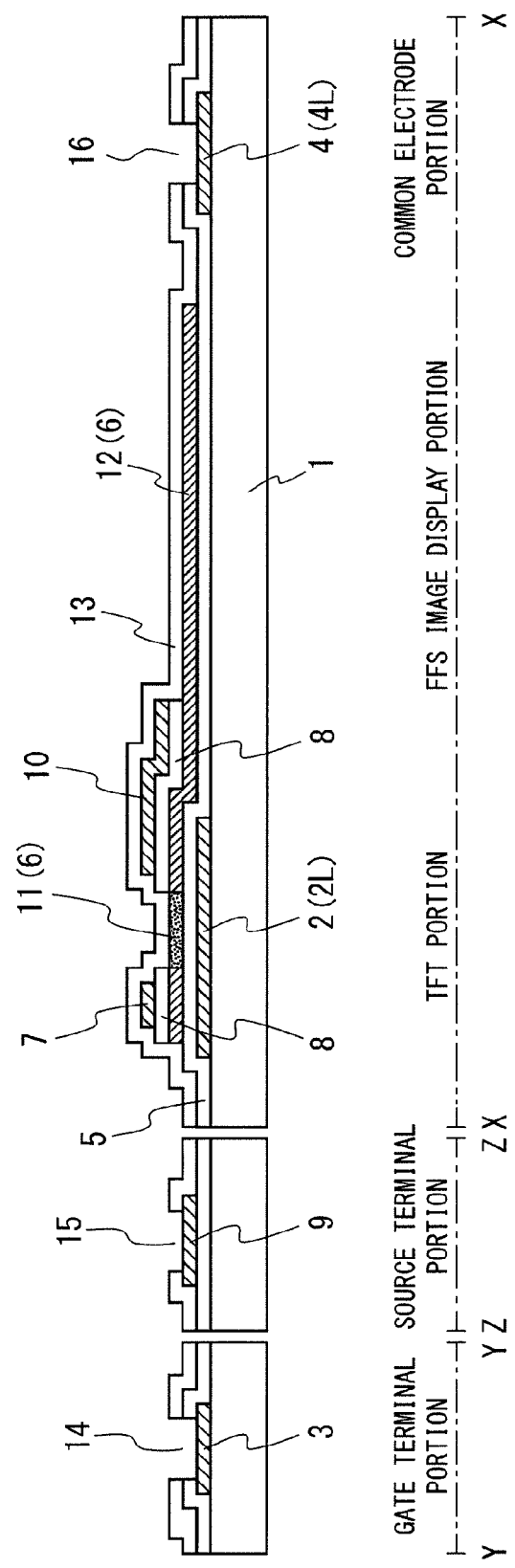

Subsequently, a photoresist applied and formed on the second insulating film is patterned in a fourth photolithography process to form a resist pattern, and the gate-terminal-portion contact hole 14, the source-terminal-portion contact hole 15, and the common-electrode-portion contact hole 16 are formed with the resist mask serving as an etching mask. The gate-terminal-portion contact hole 14 and the common-electrode-portion contact hole 16 penetrate the protective insulating film 13 and the gate insulating film 5 and reach the gate terminal 3 and the common electrode 4, respectively. The source-terminal-portion contact hole 15 penetrates the protective insulating film 13 and reaches the source terminal 9. Thus, the cross-sectional structure shown in FIG. 56 is obtained.

In this preferred embodiment, the protective insulating film 13 and the gate insulating film 5 are etched by the dry etching technique using the sulfur hexafluoride ($SF_6$) gas and the $O_2$ gas, and subsequently, the resist pattern is stripped and removed with the resist stripping solution of amine system.

Next, a third conductive film as a material for the counter slit electrodes 17, the gate terminal pad 18, and the source terminal pad 19 is formed on the entire surface of the transparent insulating substrate 1. In this preferred embodiment, as the third conductive film, an indium zinc oxide (InZnO) film being a conductive oxide film having light-transmissive properties is formed to have a thickness of 100 nm. A conductive oxide film having the light-transmissive properties, such as an indium tin oxide (ITO) film and a zinc oxide (ZnO) film, may be used, except for the InZnO film. A method for forming the InZnO film is described as in the third preferred embodiment, and its properties are also the same.

Subsequently, a photoresist applied and formed on a third conductive film (conductive oxide film) is patterned in a fifth photolithography process to form a resist pattern, and the conductive oxide film is patterned with the resist pattern serving as an etching mask. In this preferred embodiment, the conductive oxide film (InZnO film) is etched with the chemical solution of oxalic acid system.

Then, the resist pattern is stripped and removed with the resist stripping solution of amine system, and the counter slit electrodes 17 having openings OP in the slit pattern, the gate terminal pad 18, and the source terminal pad 19 are formed. The counter slit electrodes 17 are electrically connected to the common electrode 4 through the common-electrode-portion contact hole 16. The gate terminal pad 18 is electrically connected to the gate terminal 3 through the gate-terminal-portion contact hole 14. The source terminal pad 19 is electrically connected to the source terminal 9 through the source-terminal-portion contact hole 15. Thus, the cross-sectional configuration shown in FIG. 52 is obtained.

As described above, the TFT substrate 700 (active matrix substrate of FFS mode) in the seventh preferred embodiment shown in FIGS. 22 and 52 can be formed with great productivity in the five photolithography processes.

The n-type Si film 8 is disposed on the transparent oxide film 6, so that sufficient conductivity in particular can be obtained while the specific resistance value of the pixel electrode 12 made of the transparent oxide film 6 is reduced. Furthermore, when the source electrode 7, the drain electrode 10, or the like is patterned, the n-type Si film 8 functions as the protective film of the transparent oxide film 6 from the etching chemical solution, so that a process margin to corrosion by the chemical solution can be secured. This reduces limitations on a material of the second conductive film SL2 and an etching chemical solution that are used for the source electrode 7 and the drain electrode 10, allowing for application of a wide variety of materials and chemical solutions.

When a liquid crystal display panel is assembled, an alignment film or spacers are formed on the surface of the finished TFT substrate 700. The alignment film is a film for aligning liquid crystals and is made of polyimide or the like. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the FFS mode.

The TFT-LCD finished in this manner has a wide viewing angle because of the FFS mode laterally driving liquid crystals by fringe field switching and includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

Eighth Preferred Embodiment

Configuration of Pixel of TFT Substrate

Figure 57:
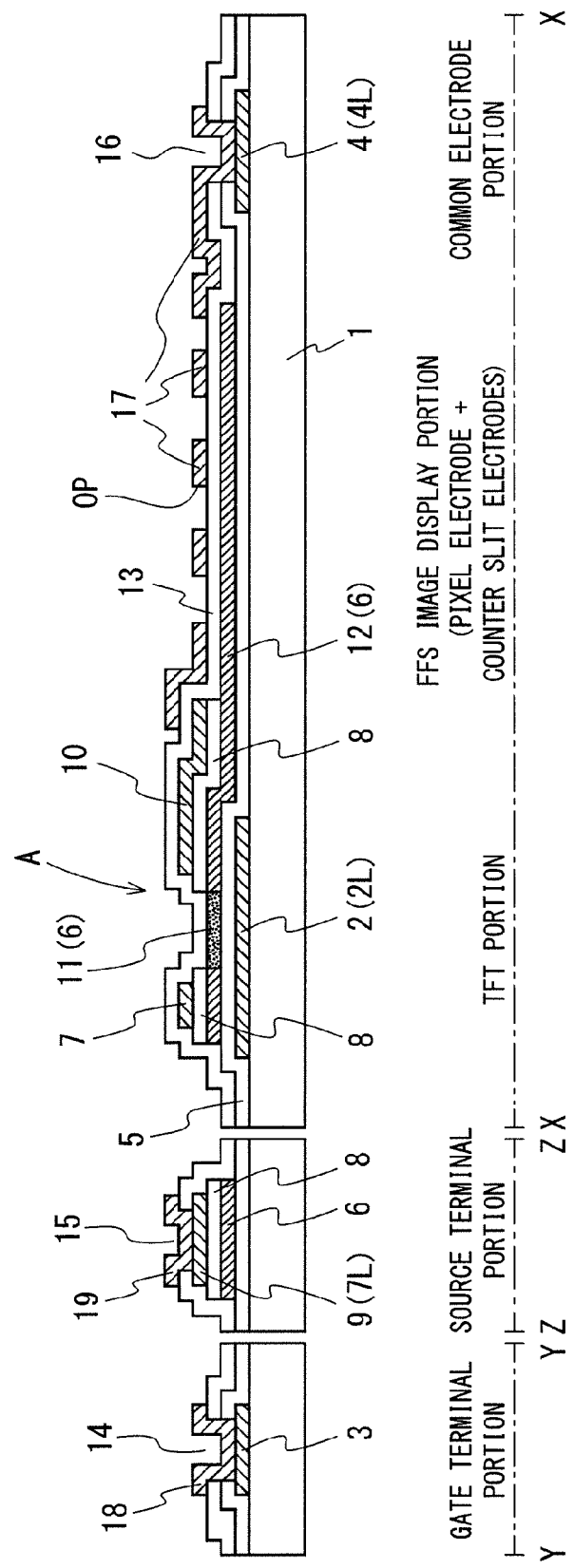
FIG. 57 is a cross-sectional view showing the configuration of the TFT substrate in the eighth preferred embodiment according to the present invention.

First, with reference to FIGS. 28 and 57, a configuration of a TFT substrate 800 in an eighth preferred embodiment is described. A plane configuration of a pixel of the TFT substrate 800 according to the eighth preferred embodiment is substantially the same as that of the TFT substrate 400 according to the fourth preferred embodiment, so that FIG. 28 is commonly used as the diagram showing the plane configuration of the TFT substrate 800, and redundant descriptions are omitted. FIG. 57 is a cross-sectional view showing a cross-sectional configuration taken along the X-X line in FIG. 28, a cross-sectional configuration taken along the Y-Y line in FIG. 28, and a cross-sectional configuration taken along the Z-Z line in FIG. 28. In addition, it is described hereinafter that the TFT substrate 800 is used in a transmissive liquid crystal display of an FFS mode.

As shown in FIG. 57, the TFT substrate 800 according to the eighth preferred embodiment has a configuration that an n-type Si film 8 in which an n-type impurity is added to Si is disposed on the transparent oxide film 6 of the TFT substrate 400 according to the fourth preferred embodiment, and the source electrode 7 and the drain electrode 10 of the TFT element A of the TFT substrate 400 are formed on the n-type Si film 8 such that the source electrode 7 and the drain electrode 10 are electrically connected to the transparent oxide film 6 through the n-type Si film 8.

As shown in FIG. 57, the TFT substrate 800 includes a gate electrode 2 of a TFT element A, a gate wiring 2L, a gate terminal 3, a common electrode 4, and a common wiring 4L formed on a transparent insulating substrate 1 made of, for example, a glass, and a gate insulating film 5 (first insulating film) is formed to cover them. The gate insulating film 5 is omitted in FIG. 28.

As shown in FIG. 57, the TFT substrate 800 includes the gate electrode 2 of the TFT element A, the gate wiring 2L, the gate terminal 3, the common electrode 4, and the common wiring 4L formed on the transparent insulating substrate 1 made of, for example, a glass, and the gate insulating film 5 (first insulating film) is formed to cover them. The gate insulating film 5 is omitted in FIG. 28.

The transparent oxide film 6 forming a pixel electrode 12 and the source terminal 9 are formed on the gate insulating film 5. Then, on the transparent oxide film 6 of a TFT portion, the n-type Si film 8 containing the n-type impurity is formed in a region being a lower portion of the source electrode 7 and the drain electrode 10, and the source electrode 7 and the drain electrode 10 are formed on the n-type Si film 8. As seen in the plan view, at least part of the source electrode 7 and the drain electrode 10 overlap the pattern of the gate electrode 2. Then, in the region of the transparent oxide film 6 overlapping the gate electrode 2, a portion corresponding to a lower portion in the region between the source electrode 7 and the drain electrode 10 is a channel region 11 (active region) during an operation of the TFT element A.

The transparent oxide film 6 is also formed in a position corresponding to a portion below the source wiring 7L and the source terminal 9 on the gate insulating film 5, and the n-type Si film 8 is formed on the transparent oxide film 6. Thus, the source wiring 7L and the source terminal 9 substantially have a three-layer laminated structure.

In an FFS image display portion, counter slit electrodes 17 are formed on the pixel electrode 12. In this preferred embodiment, the pixel electrode 12 is a flat-shaped conductive electrode formed of the transparent oxide film and is formed independently in each pixel.

Furthermore, the common electrode 4 and the common wiring 4L are formed in the FFS image display portion, and the common electrode 4 and the common wiring 4L are formed to be a film of the same layer as the gate electrode 2 and the gate terminal 3.

Then, a protective insulating film 13 (second insulating film) is formed on an entire surface of the transparent insulating substrate 1 to cover the gate electrode 2, the gate wiring 2L, the gate terminal 3, the common electrode 4, the source electrode 7, a source wiring 7L, the n-type Si film 8, the source terminal 9, the drain electrode 10, the channel region 11 of the TFT element A, and the pixel electrode 12. The protective insulating film 13 is omitted in FIG. 28.

A gate-terminal-portion contact hole 14, a source-terminal-portion contact hole 15, and a common-electrode-portion contact hole 16 are formed in the protective insulating film 13.

The gate-terminal-portion contact hole 14 is formed to penetrate the protective insulating film 13 and the gate insulating film 5 and reach the gate terminal 3. The source-terminal-portion contact hole 15 is formed to penetrate the protective insulating film 13 and reach the source terminal 9. The common-electrode-portion contact hole 16 is formed to penetrate the protective insulating film 13 and the gate insulating film 5 and reach the common electrode 4.

A gate terminal pad 18 electrically connected to the gate terminal 3 through the gate-terminal-portion contact hole 14, a source terminal pad 19 electrically connected to the source terminal 9 through the source-terminal-portion contact hole 15, and the counter slit electrodes 17 opposite to the pixel electrode 12 are formed on the protective insulating film 13.

The counter slit electrodes 17 have a plurality of openings OP formed in a grid pattern or a slit pattern. The counter slit electrodes 17 are electrically connected to the common electrode 4 being the lower layer through the common-electrode-portion contact hole 16. Thus, the counter slit electrodes 17 are supplied with a fixed potential signal, and an active matrix substrate of the FFS mode capable of laterally driving liquid crystals by a lateral electric field depending on a combination of the pixel electrode 12 and the counter slit electrodes 17 can be obtained. The counter slit electrodes 17, the gate terminal pad 18, and the source terminal pad 19 are made of a light-transmissive (transparent) conductive oxide film.

<Manufacturing Method>

Figure 58:
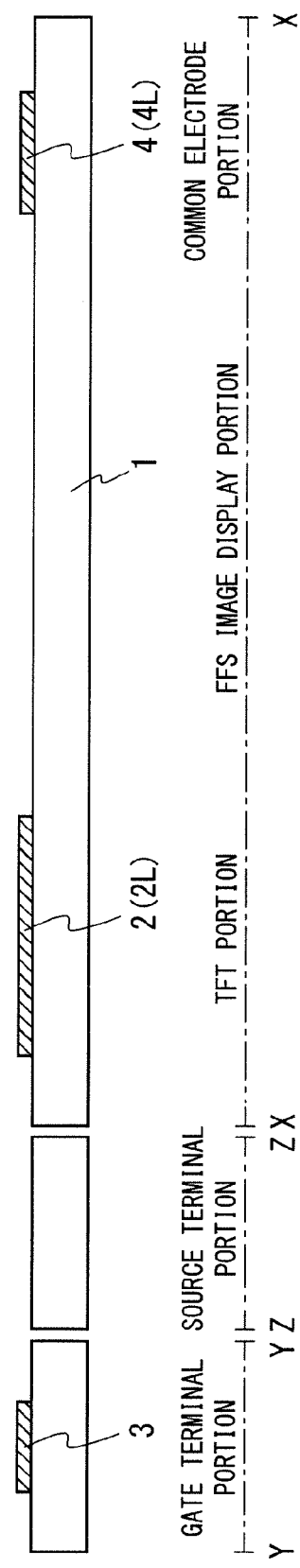
FIGS. 58 to 60 are cross-sectional views showing a method for manufacturing the TFT substrate in the eighth preferred embodiment according to the present invention.
Figure 59:
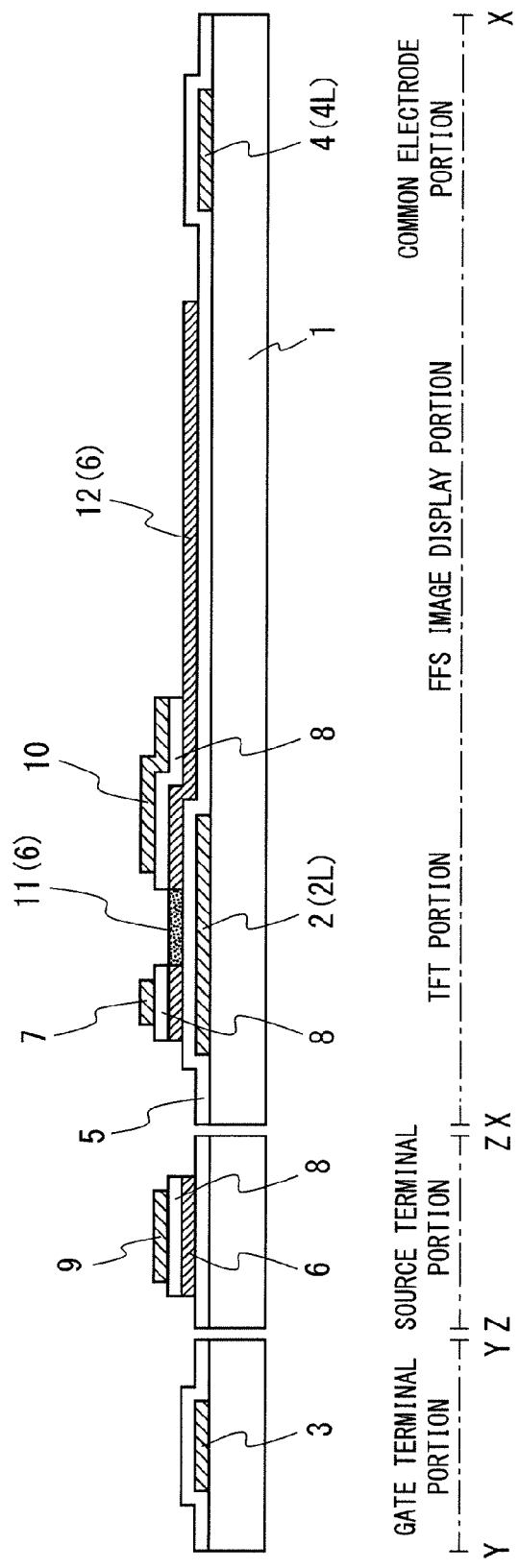
Figure 60:
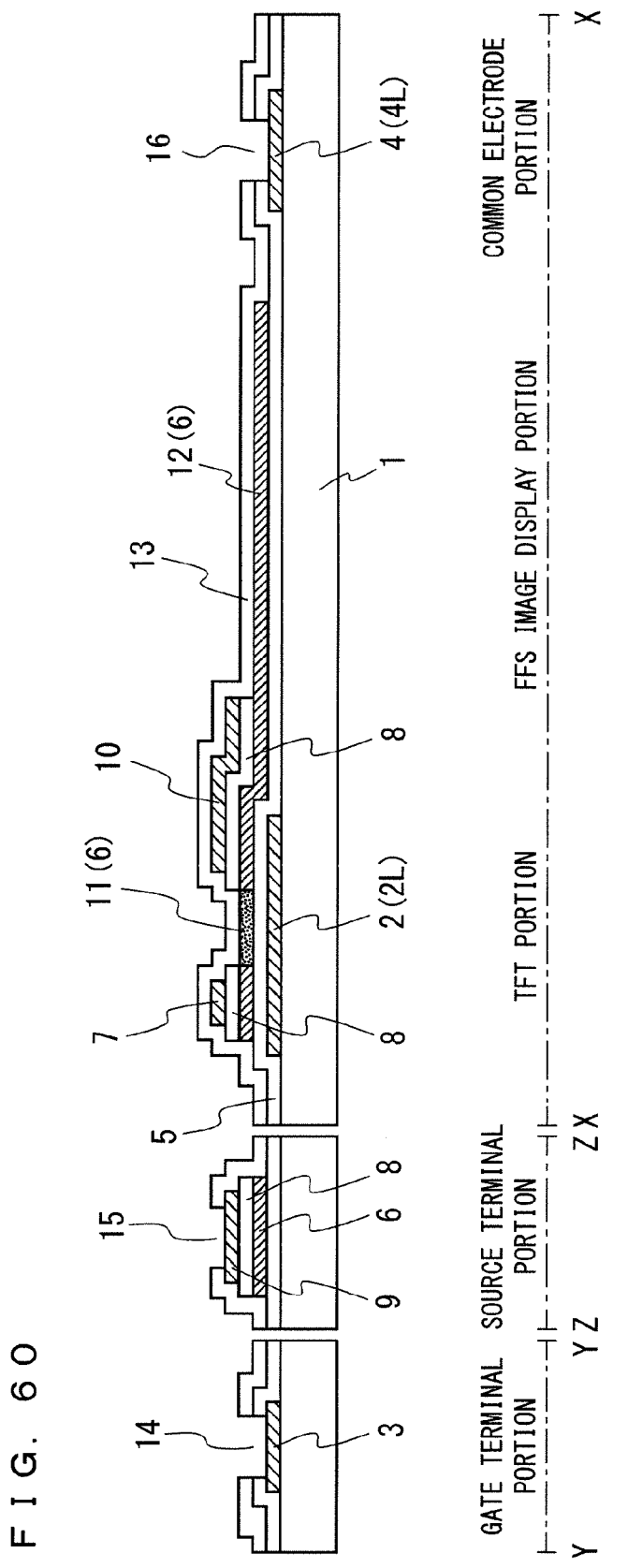

Hereinafter, a method for manufacturing the TFT substrate 800 in the eighth preferred embodiment is described with reference to FIGS. 58 to 60. The plan view and the cross-sectional view in the final step correspond to FIGS. 28 and 57, respectively. In FIGS. 58 to 60, the same components as those shown in FIGS. 28 and 57 are denoted by the same references.

First, a surface of the transparent insulating substrate 1 is cleaned with a cleaning fluid or pure water. Herein, a glass substrate having a thickness of 0.6 mm is used as the transparent insulating substrate 1. A first conductive film as a material for the gate electrode 2, the gate wiring 2L, the gate terminal 3, the common electrode 4, and the common wiring 4L is formed on the transparent insulating substrate 1 that has been cleaned. In this preferred embodiment, an alloy film of aluminum (Al) system being a metal, and more specifically, an alloy film (Al—3 mol % Ni film) in which Ni of 3 mol % is added to Al is used as the first conductive film. Herein, the Al—3 mol % Ni film having a thickness of 200 nm is formed to form the first conductive film. A method for manufacturing the Al—3 mol % Ni film is described as in the first preferred embodiment.

Subsequently, a photoresist applied and formed on the first conductive film is patterned in a first photolithography process to form a resist pattern, and the first conductive film is patterned with the resist pattern serving as an etching mask, to thereby form the gate electrode 2, the gate wiring 2L, the gate terminal 3, the common electrode 4, and the common wiring 4L on the transparent insulating substrate 1, as shown in FIG. 58.

In this preferred embodiment, the first conductive film (Al—3 mol % Ni film) is etched with a chemical solution of PAN system, and subsequently, the resist pattern is stripped and removed with a resist stripping solution of amine system.

Next, the first insulating film as the material for the gate insulating film 5 is formed on the entire surface of the transparent insulating substrate 1. In this preferred embodiment, a silicon oxide (SiO) film having a thickness of 300 nm is formed by a CVD technique. The first insulating film is the SiO film having a single layer herein, but it may be a laminated film in which an insulating film is further disposed on the SiO film. In this case, the insulating film being the upper layer may also be the SiO film, or an insulating film made of the other material, such as silicon nitride (SiN), may be disposed.

Next, the transparent oxide film 6 is formed on an entire surface of the gate insulating film 5. In this preferred embodiment, as the transparent oxide film 6, the transparent oxide film 6 of InGaZnO system (InGaZnO film) in which gallium oxide ($Ga_2O_3$) and zinc oxide (ZnO) are added to indium oxide ($In_2O_3$) is formed to have a thickness of 50 nm.

The InGaZnO film is formed in a deficiency state of oxygen to be a conductive film having a specific resistance value of 0.1 $\Omega$m or less (minimum specific resistance value is approximately $1 \times 10^{-6}$ $\Omega$m in terms of characteristics of the materials for the film of the InGaZnO system). A method for causing the deficiency state of oxygen is as described above.

Next, the n-type Si film 8 to which the n-type impurity is added is formed on the transparent oxide film 6. In this preferred embodiment, the n-type Si film 8 to which phosphorus (P) is added as the n-type impurity is formed to have a thickness of 30 nm by the CVD technique using silane ($SiH_4$) gas and phosphine ($PH_3$) gas. A method for forming the n-type Si film 8 and the thickness thereof is described as in the fifth preferred embodiment. The configuration of the film thickness can reduce a contact resistance at an interface between the channel region 11 of the TFT element A and the source electrode 7 and the drain electrode 10, and thus stable TFT characteristics can be achieved.

The n-type Si film 8 is formed on the transparent oxide film 6 by the CVD technique, so that when the film is formed, hydrogen (H) included in CVD gas reduces the transparent oxide film 6 being the lower layer, accelerating a deficiency of oxygen ions. This can cause the transparent oxide film 6 to be a stable conductive film having a lower specific resistance value. The n-type Si film 8 has excellent corrosion resistance to a chemical solution (acid, alkali), and thus the n-type Si film 8 also has an effect of functioning as a protective film of the transparent oxide film 6 being the lower layer.

Next, a second conductive film as a material for the source electrode 7, the source wiring 7L, the source terminal 9, and the drain electrode 10 is formed on the transparent insulating substrate 1 on which the n-type Si film 8 is formed. In this preferred embodiment, the alloy film of aluminum (Al) system being a metal, and more specifically, the alloy film (Al—3 mol % Ni film) in which Ni of 3 mol % is added to Al is used as the second conductive film.

Subsequently, a photoresist applied and formed on the second conductive film is patterned in the second photolithography process to form a resist pattern, and the second conductive film, the n-type Si film 8, and the transparent oxide film 6 are patterned with the resist pattern serving as an etching mask, to thereby form the source electrode 7, the source wiring 7L, the source terminal 9, and the drain electrode 10, as shown in FIG. 59. In this preferred embodiment, the n-type Si film 8 and the transparent oxide film 6 are patterned such that the laminated film of the n-type Si film 8 and the transparent oxide film 6 is also left below the source wiring 7L and the source terminal 9, so that the source wiring 7L and the source terminal 9 substantially have the three-layer laminated structure.

Further, this step includes the step of oxidizing the transparent oxide film 6 being the lower layer of the n-type Si film 8 after the n-type Si film 8 being the lower portion in the region between the source electrode 7 and the drain electrode 10 is removed by etching and reducing the deficiency of oxygen to increase an electrical resistance, to thereby form a semiconductor that serves as the channel region 11 of the TFT element A. Specifically, the resistance is increased such that the semiconductor region has the specific resistance value of more than 0.1 $\Omega$m and less than $1\times10^6$ $\Omega$m. Furthermore, the resistance is increased by the oxidation, so that resistance to the etching chemical solution can also be improved. At this time, the pixel electrode 12, which is the image display region, of the transparent oxide film 6 maintains conductivity as a conductive region without the oxidation. The transparent oxide film 6 below the source electrode 7 and the drain electrode 10 also maintains conductivity as a conductive region without the oxidation.

A technology of halftone exposure of a photoresist described in the sixth preferred embodiment with reference to FIGS. 45 to 51 is applicable as it is in principle to the steps described above, and the descriptions are omitted.

Next, a second insulating film as a material for the protective insulating film 13 is formed on the entire surface of the transparent insulating substrate 1 that finished the steps up to FIG. 59. In this preferred embodiment, the silicon oxide (SiO) film having the thickness of 300 nm is formed by the CVD technique to form the second insulating film. The second insulating film forming the protective insulating film 13 may also have a laminated structure similarly to the first insulating film.

Subsequently, a photoresist applied and formed on the second insulating film is patterned in a third photolithography process to form a resist pattern, and the gate-terminal-portion contact hole 14, the source-terminal-portion contact hole 15, and the common-electrode-portion contact hole 16 are formed with the resist mask serving as an etching mask. The gate-terminal-portion contact hole 14 and the contact-electrode-portion contact hole 16 penetrate the protective insulating film 13 and the gate insulating film 5 and reach the gate terminal 3 and the common electrode 4, respectively. The source-terminal-portion contact hole 15 penetrates the protective insulating film 13 and reaches the source terminal 9. Thus, the cross-sectional structure shown in FIG. 60 is obtained.

In this preferred embodiment, the protective insulating film 13 and the gate insulating film 5 are etched by the dry etching technique using the sulfur hexafluoride ($SF_6$) gas and the $O_2$ gas, and subsequently, the resist pattern is stripped and removed with the resist stripping solution of amine system.

Next, a third conductive film as a material for the counter slit electrodes 17, the gate terminal pad 18, and the source terminal pad 19 is formed on the entire surface of the transparent insulating substrate 1. In this preferred embodiment, as the third conductive film, an indium zinc oxide (InZnO) film being a conductive oxide film having light-transmissive properties is formed to have a thickness of 100 nm. A conductive oxide film having the light-transmissive properties, such as an indium tin oxide (ITO) film and a zinc oxide (ZnO) film, may be used, except for the InZnO film. A method for forming the InZnO film is described as in the third preferred embodiment, and its properties are also the same.

Subsequently, a photoresist applied and formed on a third conductive film (conductive oxide film) is patterned in a fourth photolithography process to form a resist pattern, and the conductive oxide film is patterned with the resist pattern serving as an etching mask. In this preferred embodiment, the conductive oxide film (InZnO film) is etched with the chemical solution of oxalic acid system.

Then, the resist pattern is stripped and removed with the resist stripping solution of amine system, and the counter slit electrodes 17 having openings OP in the slit pattern, the gate terminal pad 18, and the source terminal pad 19 are formed. The counter slit electrodes 17 are electrically connected to the common electrode 4 through the common-electrode-portion contact hole 16. The gate terminal pad 18 is electrically connected to the gate terminal 3 through the gate-terminal-portion contact hole 14. The source terminal pad 19 is electrically connected to the source terminal 9 through the source-terminal-portion contact hole 15. Thus, the cross-sectional configuration shown in FIG. 57 is obtained.

As described above, the TFT substrate 800 (active matrix substrate of FFS mode) in the eighth preferred embodiment shown in FIGS. 28 and 57 can be formed with great productivity in the four photolithography processes.

The n-type Si film 8 is disposed on the transparent oxide film 6, so that sufficient conductivity in particular can be obtained while the specific resistance value of the pixel electrode 12 made of the transparent oxide film 6 is reduced. Furthermore, when the source electrode 7, the drain electrode 10, or the like is patterned, the n-type Si film 8 functions as the protective film of the transparent oxide film 6 from the etching chemical solution, so that a process margin to corrosion by the chemical solution can be secured. This reduces limitations on a material of the second conductive film SL2 and an etching chemical solution that are used for the source electrode 7 and the drain electrode 10, allowing for application of a wide variety of materials and chemical solutions.

When a liquid crystal display panel is assembled, an alignment film or spacers are formed on the surface of the finished TFT substrate 800. The alignment film is a film for aligning liquid crystals and is made of polyimide or the like. A counter substrate that is manufactured separately and includes a color filter, a counter electrode, and the alignment film is bonded to the TFT substrate. At this time, the spacers create a gap between the TFT substrate and the counter substrate, and the liquid crystals are injected into the gap and sealed, to thereby form the liquid crystal display panel. Finally, a polarizing plate, a phase difference plate, and a backlight unit are disposed outside of the liquid crystal display panel, to thereby complete a TFT-LCD of the FFS mode.

The TFT-LCD finished in this manner has a wide viewing angle because of the FFS mode laterally driving liquid crystals by fringe field switching and includes the channel region 11 being an oxide, allowing for a higher mobility of the TFT and a faster operational speed, and thus high display quality can be achieved in upsizing and high definition of the liquid crystal display panel. Furthermore, the TFT can be reduced in size, and thus an aperture ratio of the image display portion can be increased. This enables display in high luminance while an outgoing beam from the backlight unit is reduced, which can also contribute to reduced power consumption of the display panel.

Further, in the TFT portion, the source electrode 7 and the drain electrode 10 are electrically connected to the channel region 11 through the conductive transparent oxide film 6 integrated with the channel region 11, so that contact characteristics at a connection interface are sufficient, and characteristics and reliability of the TFT can be improved.

The transparent oxide film 6 is also disposed below the source wiring 7L that substantially has the three-layer laminated structure with the transparent oxide film 6 and the n-type Si film 8, so that the source wiring 7L is a so-called redundant wiring capable of greatly reducing a break in the source wiring 7L.

Modification

In the first to eighth preferred embodiments described above, the first conductive film as the material for the gate electrode 2, the gate wiring 2L, the gate terminal 3, the common electrode 4, and the common wiring 4L is made of the alloy film of aluminum (Al) system, which is not restrictive. For example, Cr, Ti, Mo, Ta, Cu, and an alloy thereof that are well-known can be widely used as typical metal films.

The second conductive film as the material for the source electrode 7, the source wiring 7L, the source terminal 9, and the drain electrode 10 is made of the alloy film of aluminum (Al) system, which is not restrictive. For the first to fourth preferred embodiments having the configuration in which the n-type Si film 8 is not disposed on the transparent oxide film 6, only the second conductive film needs to be selectively etched without etching the transparent oxide film 6 having a poor resistance to a typical acid system chemical solution at the time of etching to pattern the second conductive film, so that an applicable second conductive film and its etching process are limited. Nevertheless, a combination of, for example, an alloy film of copper (Cu) system and an etching process with a chemical solution including ammonium persulfate may be used, except for the combination of the alloy film of aluminum (Al) system and the etching process with the chemical solution of TMAH.

Meanwhile, for the fifth to eighth preferred embodiments having the configuration in which the n-type Si film 8 is disposed on the transparent oxide film 6, the n-type Si film 8 functions as the protective film of the transparent oxide film 6, so that the material of the second conductive film for the source electrode 7, the source wiring 7L, the source terminal 9, and the drain electrode 10 and the etching process are not limited to the alloy film of aluminum (Al) system and the etching with the chemical solution of TMAH. For example, Cr, Ti, Mo, Ta, Cu, and an alloy thereof that are well-known can be widely used as typical metal films. A typical acid system chemical solution can be widely used as an etching chemical solution.

The example that the transparent oxide film 6 is formed of the InGaZnO is shown, but this is not restrictive. The other transparent oxide film of, for example, InGaO system, InSnO system, InSnZnO system, InGaZnSnO system, InAlZnO system, InHf (hafnium) ZnO system, InZr (zirconium) ZnO system, InMg (magnesium) ZnO system, InY (yttrium) ZnO system, or ZnSnO system may be used. When the transparent oxide films of these are used, similar effects to those when the transparent oxide film of the InGaZnO system is used can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate including a plurality of pixels arranged in matrix, wherein
    each of said pixels includes:
        a gate electrode and a common electrode selectively disposed on a substrate;
        a gate insulating film that covers said gate electrode and said common electrode;
        a transparent oxide film selectively disposed on said gate insulating film;
        a source electrode and a drain electrode that are spaced from each other on said transparent oxide film and overlap said gate electrode; and
        a light transmissive pixel electrode electrically connected to said drain electrode,
    said transparent oxide film including a conductive region and a semiconductor region,
    said conductive region being disposed in a lower portion of said source electrode and said drain electrode and disposed in a portion that continues from the lower portion of said drain electrode, extends to part of an upper portion of said common electrode, and forms said pixel electrode, thereby forming said pixel electrode,
    said semiconductor region being disposed in a portion that corresponds to a lower layer in a region between said source electrode and said drain electrode and forming a channel region of a thin film transistor,
    said source electrode and said drain electrode being electrically connected to said conductive region of said transparent oxide film.

2. The thin film transistor substrate according to claim 1, wherein said conductive region of said transparent oxide film is also disposed in a lower portion of a source wiring extending from said source electrode.

3. A thin film transistor substrate including a plurality of pixels arranged in matrix, wherein
    each of said pixels includes:
        a gate electrode and a common electrode selectively disposed on a substrate;
        a gate insulating film that covers said gate electrode and said common electrode;
        a transparent oxide film selectively disposed on said gate insulating film;
        a source electrode and a drain electrode that are spaced from each other on said transparent oxide film and overlap said gate electrode;
        a light transmissive pixel electrode electrically connected to said drain electrode;
        a protective insulating film that covers said source electrode, said drain electrode, and said pixel electrode; and
        a counter electrode disposed on said protective insulating film opposite to said pixel electrode,
    said counter electrode being electrically connected to said common electrode through a contact hole that penetrates said protective insulating film and said gate insulating film,
    said transparent oxide film including a conductive region and a semiconductor region,
    said conductive region being disposed in a lower portion of said source electrode and said drain electrode and disposed in a portion that continues from the lower portion of said drain electrode and forms said pixel electrode, thereby forming said pixel electrode, said semiconductor region being disposed in a portion that corresponds to a lower layer in a region between said source electrode and said drain electrode and forming a channel region of a thin film transistor, said source electrode and said drain electrode being electrically connected to said conductive region of said transparent oxide film.

4. The thin film transistor substrate according to claim 3, wherein said conductive region of said transparent oxide film is also disposed in a lower portion of a source wiring extending from said source electrode.

5. A thin film transistor substrate including a plurality of pixels arranged in matrix, wherein
each of said pixels includes:
- a gate electrode and a common electrode selectively disposed on a substrate;
- a gate insulating film that covers said gate electrode and said common electrode;
- a transparent oxide film selectively disposed on said gate insulating film;
- an n-type Si film that is selectively disposed on said transparent oxide film and contains an n-type impurity;
- a source electrode and a drain electrode that are spaced from each other over said transparent oxide film through said n-type Si film and overlap said gate electrode; and
- a light transmissive pixel electrode electrically connected to said drain electrode, said transparent oxide film including a conductive region and a semiconductor region, said conductive region being disposed below said source electrode and said drain electrode and disposed in a portion that continues from the lower portion of said drain electrode, extends to part of an upper portion of said common electrode, and forms said pixel electrode, thereby forming said pixel electrode, said semiconductor region being disposed in a portion that corresponds to a lower layer in a region between said source electrode and said drain electrode and forming a channel region of a thin film transistor, said source electrode and said drain electrode being electrically connected to said conductive region of said transparent oxide film through said n-type Si film.

6. The thin film transistor substrate according to claim 5, wherein
said conductive region of said transparent oxide film is also disposed below a source wiring extending from said source electrode, and
said n-type Si film is also disposed on said conductive region of said transparent oxide film below said source wiring.

7. A thin film transistor substrate including a plurality of pixels arranged in matrix, wherein
each of said pixels includes:
- a gate electrode and a common electrode selectively disposed on a substrate;
- a gate insulating film that covers said gate electrode and said common electrode;
- a transparent oxide film selectively disposed on said gate insulating film;
- an n-type Si film that is selectively disposed on said transparent oxide film and contains an n-type impurity;
- a source electrode and a drain electrode that are spaced from each other over said transparent oxide film through said n-type Si film and overlap said gate electrode;
- a light transmissive pixel electrode electrically connected to said drain electrode;
- a protective insulating film that covers said source electrode, said drain electrode, and said pixel electrode; and
- a counter electrode disposed on said protective insulating film opposite to said pixel electrode, said counter electrode being electrically connected to said common electrode through a contact hole that penetrates said protective insulating film and said gate insulating film, said transparent oxide film including a conductive region and a semiconductor region, said conductive region being disposed below said source electrode and said drain electrode and disposed in a portion that continues from the lower portion of said drain electrode and forms said pixel electrode, thereby forming said pixel electrode, said semiconductor region being disposed in a portion that corresponds to a lower layer in a region between said source electrode and said drain electrode and forming a channel region of a thin film transistor, said source electrode and said drain electrode being electrically connected to said conductive region of said transparent oxide film through said n-type Si film.

8. The thin film transistor substrate according to claim 7, wherein
said conductive region of said transparent oxide film is also disposed below a source wiring extending from said source electrode, and
said n-type Si film is also disposed on said conductive region of said transparent oxide film below said source wiring.

* * * * *